(12) United States Patent
Hekmatshoartabari et al.

(10) Patent No.: US 12,154,899 B2
(45) Date of Patent: Nov. 26, 2024

(54) DARLINGTON PAIR BIPOLAR JUNCTION TRANSISTOR SENSOR

(71) Applicant: International Business Machines Corporation, Armonk, NY (US)

(72) Inventors: Bahman Hekmatshoartabari, White Plains, NY (US); Alexander Reznicek, Troy, NY (US); Tak H Ning, Florham Park, NJ (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 17/504,175

(22) Filed: Oct. 18, 2021

(65) Prior Publication Data

US 2023/0123050 A1    Apr. 20, 2023

(51) Int. Cl.
*H01L 27/082* (2006.01)
*H01L 29/66* (2006.01)

(52) U.S. Cl.
CPC .... *H01L 27/0825* (2013.01); *H01L 29/66234* (2013.01)

(58) Field of Classification Search
CPC .............. G01N 27/414; G01N 27/4145; H01L 27/0688; H01L 27/0821; H01L 27/0825;
(Continued)

(56) References Cited

U.S. PATENT DOCUMENTS 4,755,694 A   7/1988 Bodig et al.
4,977,476 A   12/1990 Marshall et al.
(Continued)

FOREIGN PATENT DOCUMENTS

CN    102175859 B    11/2013
KR    1020100118792 A    11/2010
(Continued)

OTHER PUBLICATIONS

International Search Report (ISR) and Written Opinion of the International Searching Authority (WO) dated Feb. 8, 2023.
(Continued)

*Primary Examiner* — Meiya Li
(74) *Attorney, Agent, or Firm* — Maeve M. Carpenter

(57) ABSTRACT

A Darlington pair sensor is disclosed. The Darlington pair sensor has an amplifying/horizontal bipolar junction transistor (BJT) and a sensing/vertical BJT and can be used as a biosensor.

The amplifying bipolar junction transistor (BJT) is horizontally disposed on a substrate. The amplifying BJT has a horizontal emitter, a horizontal base, a horizontal collector, and a common extrinsic base/collector. The common extrinsic base/collector is an extrinsic base for the amplifying BJT.

The sensing BJT has a vertical orientation with respect to the amplifying BJT. The sensing BJT has a vertical emitter, a vertical base, an extrinsic vertical base, and the common extrinsic base/collector (in common with the amplifying BJT). The common extrinsic base/collector acts as the sensing BJT collector. The extrinsic vertical base is separated into a left extrinsic vertical base and a right extrinsic vertical base giving the sensing BJT has two separated (dual) bases, a sensing base and a control base.

The Darlington pair sensor has high in-situ signal amplification with low noise and uses substrate space effectively.

17 Claims, 45 Drawing Sheets

(58) Field of Classification Search
CPC ............. H01L 29/0808; H01L 29/0821; H01L 29/1004; H01L 29/41708; H01L 29/66234; H01L 29/7302; H01L 29/732; H01L 29/735; H03F 2200/96; H03F 3/3437

See application file for complete search history.

(56) References Cited

U.S. PATENT DOCUMENTS

| | | | |
|---|---|---|---|
| 5,017,494 | A | 5/1991 | Karube et al. |
| 8,512,254 | B2 | 8/2013 | Donofrio |
| 10,411,109 | B2 | 9/2019 | Reznicek et al. |
| 10,539,527 | B2 | 1/2020 | Baghbani-Parizi et al. |
| 10,892,346 | B2 | 1/2021 | Reznicek et al. |
| 10,900,952 | B2 | 1/2021 | Reznicek et al. |
| 2004/0251517 | A1* | 12/2004 | Nakashima ......... H01L 29/7317 257/E29.256 |
| 2006/0252143 | A1 | 11/2006 | Lo |
| 2009/0149776 | A1 | 6/2009 | Adams |
| 2010/0163748 | A1 | 7/2010 | Dhadwal |
| 2011/0012129 | A1* | 1/2011 | Zhang ................. H01L 21/8213 257/E29.174 |
| 2019/0207011 | A1 | 7/2019 | Reznicek et al. |
| 2020/0363393 | A1 | 11/2020 | Reznicek et al. |
| 2021/0059542 | A1 | 3/2021 | Gopalakrishnan |

FOREIGN PATENT DOCUMENTS

| | | |
|---|---|---|
| WO | 2009/048799 | 4/2009 |
| WO | 2016/205310 | 12/2016 |
| WO | 2023066637 A1 | 4/2023 |

OTHER PUBLICATIONS

Sufi Zafar, et al., "A comparison between bipolar transistor and nanowire field effect transistor biosensors", Appl. Phys. Lett. 106, 063701 (2015); https://doi.org/10.1062/1.4907611, Submitted: Oct. 25, 2014, Accepted: Jan. 25, 2015: Published Online: Feb. 12, 2015.

Sufi Zafar and Tak Ning, "Bipolar Junction Transistor Based Sensors for Chemical and Biological Sensing", IBM TJ Watson Research Center, Yorktown Heights, NY, 10598, USA, 978-1-5090-2969-3/16, C 2016, IEEE.

Luiz, Alvaro, "Darlington Transistors", Electronics Tutorials, Posted Jun. 13, 2024, 6:40 am, 13 pages, <https://www.electronics-tutorials.ws/transistor/darlington-transistor.html>.

Rajat Vashistha et al, "Futuristic biosensors for cardiac health care: an artificial intelligence approach", 3 Biotech, Aug. 2018: 8(8): 358, Published online Aug. 3, 2018 doi: 10.1007/s13205-018-1368-y.

* cited by examiner

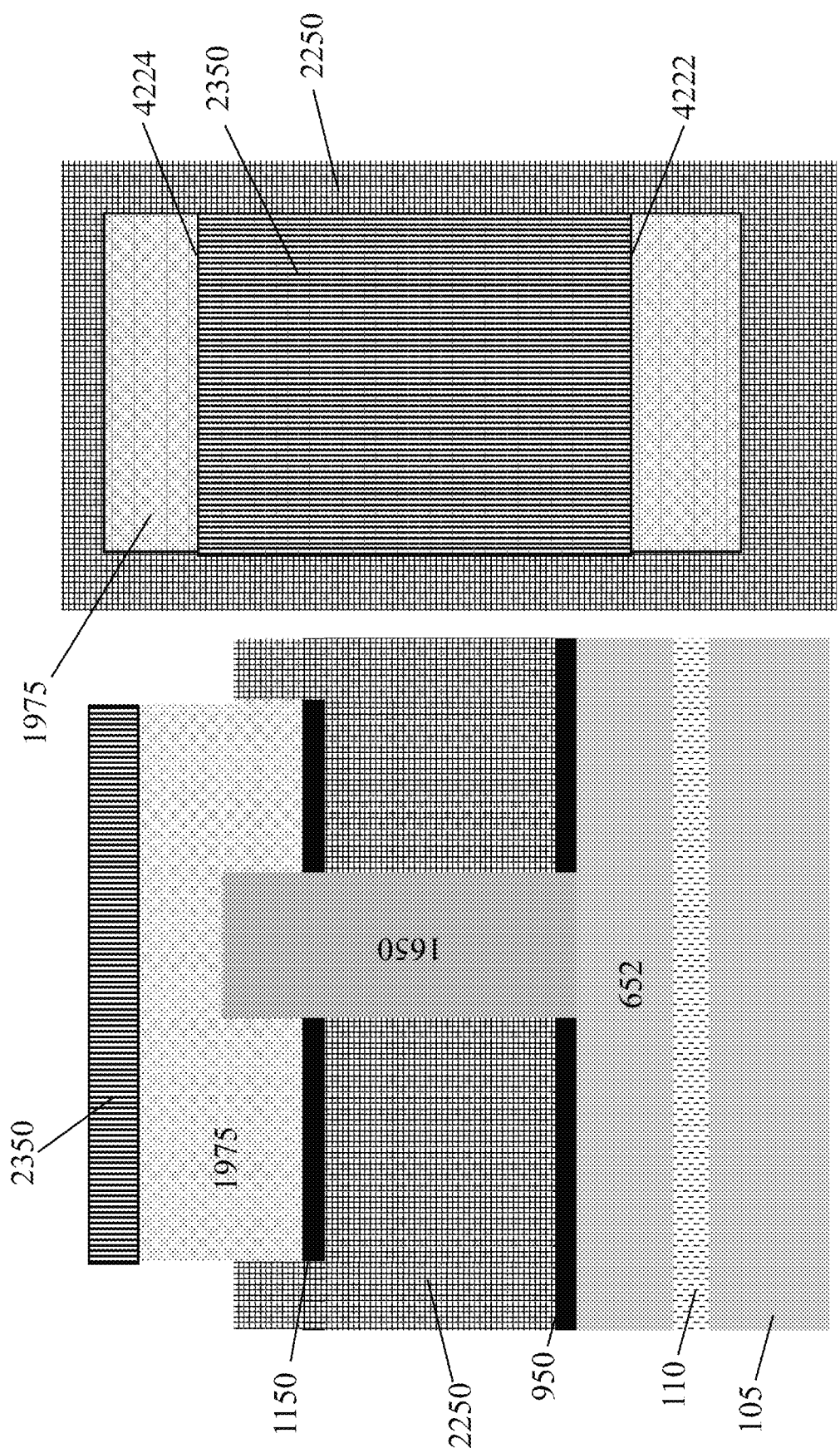

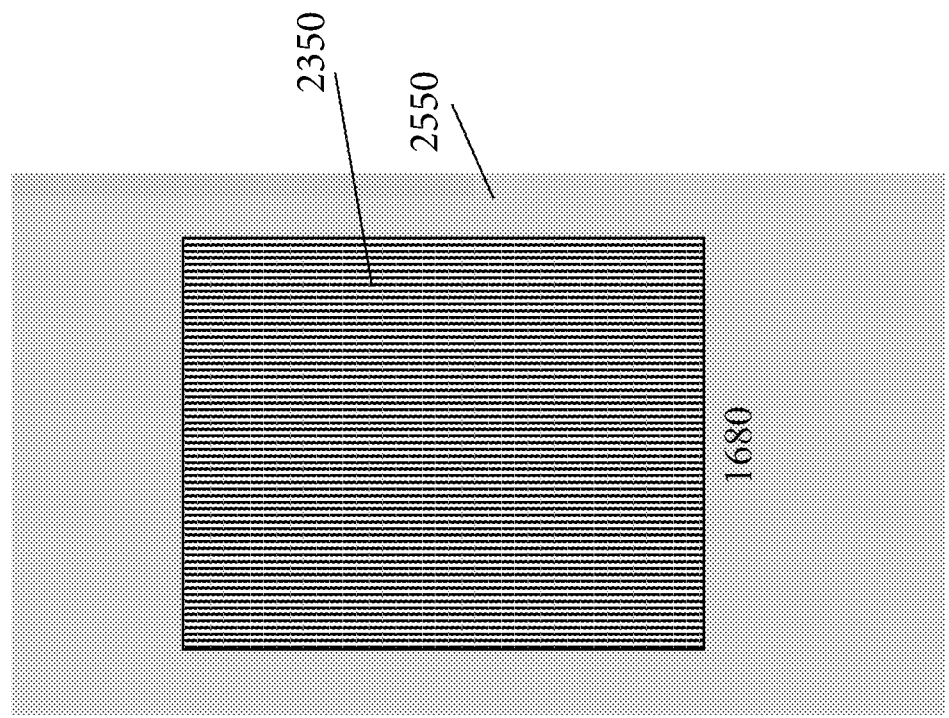
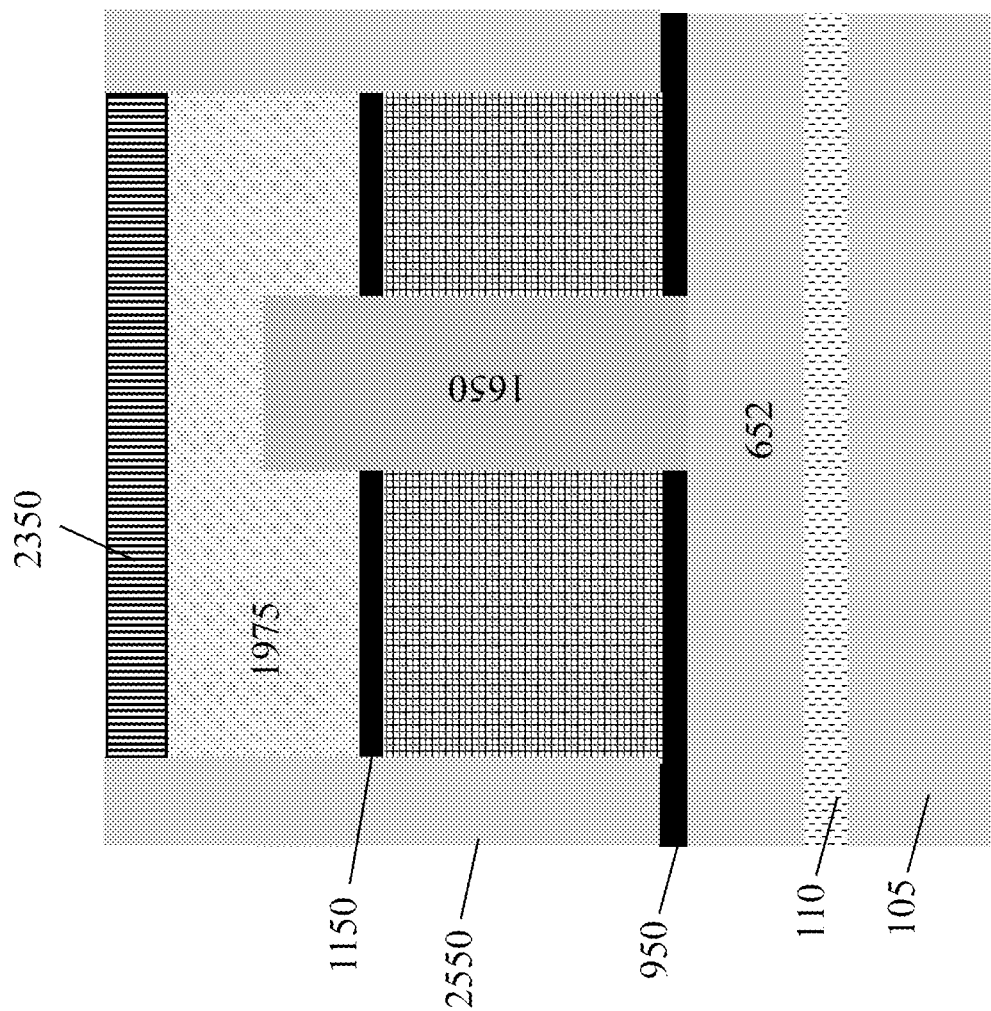
Figure 42A
Figure 42B

DARLINGTON PAIR BIPOLAR JUNCTION TRANSISTOR SENSOR

BACKGROUND

The present invention relates to semiconductor circuitry. More specifically, the invention relates to sensors made with and used by semiconductor circuitry.

Some sensors, particularly those sensors used to sense characteristics of biological fluids, i.e., biosensors, typically are made using ion-sensitive transistors. These ion-sensitive transistors, for example Darlington pair transistors, provide sensing (e.g., at a base of one of the transistors in the Darlington pair) and amplification. Amplification is required to integrate the sensor with other circuitry (e.g., read out and control circuitry) because generally biosensor signals are very weak.

Monolithic integration of these sensors/biosensors with circuitry such as readout/control circuitry is crucially important for energy-efficient, high-performance, and mass-deployable systems. In particular, amplification circuitry needs to be monolithically integrated in close proximity of a sensor/biosensor for efficient amplification of weak signals. Further, keeping the sensors close to the amplification circuitry eliminates accumulation and build-up of noise that occurs when the sensors are separated from amplification circuitry over longer distances.

These sensors/biosensors are used in highly integrated sensing/biosensing systems including those systems that have uses for artificial intelligence (AI), healthcare monitoring, point-of-care diagnostics, internet of things (IoT), and wearable devices. Some biosensing applications include mobile (portable and wearable) sensing technologies that can non-invasively monitor health using bio-fluids such as sweat, saliva, and urine. These biosensors have the potential to provide cost effective and enhanced healthcare, particularly in the treatment of chronic diseases. It is desirable that these biosensor technologies provide mobile and on-line monitoring of patients to make delivery of health care more efficient and cost effective.

There is a need to provide sensors, particularly biosensors, that are accurate, sensitive, small, and mobile with reduced noise and high signal amplification that easily can be integrated with semiconductor circuitry and inexpensively mass produced by standard semiconductor processes.

SUMMARY

A Darlington pair sensor is disclosed. The Darlington pair sensor has an amplifying/horizontal bipolar junction transistor (BJT) and a sensing/vertical BJT.

The amplifying bipolar junction transistor (BJT) is horizontally disposed on a substrate. The amplifying BJT has a horizontal emitter, a horizontal base, a horizontal collector, and a common extrinsic base/collector. The common extrinsic base/collector is an extrinsic base for the amplifying BJT. The common extrinsic base/collector is in contact with and vertically above (disposed on) the horizontal base.

The sensing BJT has a vertical orientation with respect to the amplifying BJT. The sensing BJT has a vertical emitter, a vertical base, an extrinsic vertical base, and the common extrinsic base/collector (in common with the amplifying BJT) acting as the sensing BJT collector. The extrinsic vertical base is separated into a left extrinsic vertical base and a right extrinsic vertical base. Therefore, the sensing BJT has two (dual) bases. The left extrinsic vertical base can be a sensing base and the right extrinsic vertical base can be a control base, or visa versa.

The left extrinsic vertical base is in contact with a left side of the vertical base and the right extrinsic vertical base in in contact with a right side of the vertical base. The left extrinsic vertical base and right extrinsic vertical base are physically separated from one another by the vertical base, and electrically coupled with one another via the vertical base.

Alternative configurations and BJT polarities are disclosed along with methods of making the Darlington pair BJT sensor. The Darlington pair BJT sensor can be used as a biosensor.

BRIEF DESCRIPTION OF THE DRAWINGS

Various embodiments of the present invention will be described below in more detail, with reference to the accompanying drawings, now briefly described. The Figures show various apparatus, structures, and related method steps of the present invention.

FIG. 40A, in the separation Figure series, is a cross section view showing interim structures after depositing the base separation hard mask.

FIG. 40B is a top view of the interim structure shown in FIG. 40A.

FIG. 42A is a cross section view showing interim structures after an interlayer dielectric (ILD) fill.

FIG. 42B is a top view of the interim structure shown in FIG. 42A.

DETAILED DESCRIPTION

Figure 1:
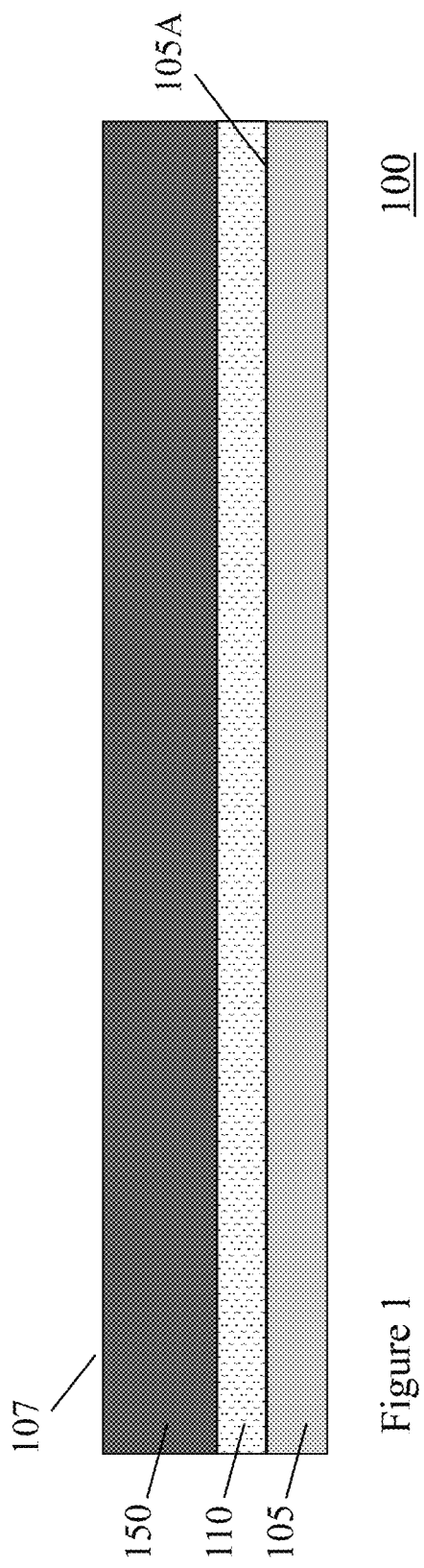
FIG. 1 is a cross section view of an initial structure for a Darlington Pair BJT sensor including a semiconductor substrate layer, a BOX/isolation layer, and a horizontal/lateral BJT base layer.

It is to be understood that embodiments of the present invention are not limited to the illustrative methods, apparatus, structures, systems and devices disclosed herein but instead are more broadly applicable to other alternative and broader methods, apparatus, structures, systems and devices that become evident to those skilled in the art given this disclosure.

In addition, it is to be understood that the various layers, structures, and/or regions shown in the accompanying drawings are not drawn to scale, and that one or more layers, structures, and/or regions of a type commonly used may not be explicitly shown in a given drawing. This does not imply that the layers, structures, and/or regions not explicitly shown are omitted from the actual devices.

In addition, certain elements may be left out of a view for the sake of clarity and/or simplicity when explanations are not necessarily focused on such omitted elements. Moreover, the same or similar reference numbers used throughout the drawings are used to denote the same or similar features, elements, or structures, and thus, a detailed explanation of the same or similar features, elements, or structures may not be repeated for each of the drawings.

The semiconductor devices, structures, and methods disclosed in accordance with embodiments of the present invention can be employed in applications, hardware, and/or electronic systems. Suitable hardware and systems implemented with embodiments of the invention may include, but are not limited to, personal computers, communication networks, electronic commerce systems, portable communications devices (e.g., cell and smart phones), solid-state media storage devices, expert and artificial intelligence systems, functional circuitry, neural networks, etc. Systems and hardware incorporating the semiconductor devices and structures are contemplated embodiments of the invention.

As used herein, "height" refers to a vertical size of an element (e.g., a layer, trench, hole, opening, etc.) in the cross-sectional or elevation views measured from a bottom surface to a top surface of the element, and/or measured with respect to a surface on which the element is located.

Conversely, a "depth" refers to a vertical size of an element (e.g., a layer, trench, hole, opening, etc.) in the cross-sectional or elevation views measured from a top surface to a bottom surface of the element. Terms such as "thick", "thickness", "thin" or derivatives thereof may be used in place of "height" where indicated.

As used herein, "side," and left or right-side to a side surface or element (e.g., a layer, opening, etc.), such as a left or right-side shown in the drawings.

As used herein, "width" or "length" refers to a size of an element (e.g., a layer, trench, hole, opening, etc.) in the drawings measured from a side surface to an opposite surface of the element. Terms such as "thick", "thickness", "thin" or derivatives thereof may be used in place of "width" or "length" where indicated.

As used herein, terms such as "upper", "lower", "above", "right", "left", "vertical", "horizontal", "top", "bottom", and derivatives thereof shall relate to the disclosed structures and methods, as oriented in the drawing figures. For example, as used herein, "vertical" refers to a direction perpendicular to the top surface of the substrate in the elevation views, and "horizontal" refers to a direction parallel to the top surface of the substrate in the elevation views.

As used herein, unless otherwise specified, terms such as "on", "overlying", "atop", "on top", "positioned on" or "positioned atop" mean that a first element is present on a second element, wherein intervening elements may be present between the first element and the second element. As used herein, unless otherwise specified, the term "directly" used in connection with the terms "on", "overlying", "atop", "on top", "positioned on" or "positioned atop," "disposed on," or the terms "in contact" or "direct contact" means that a first element and a second element are connected without any intervening elements, such as, for example, intermediary conducting, insulating or semiconductor layers, present between the first element and the second element.

It is understood that these terms might be affected by the orientation of the device described. For example, while the meaning of these descriptions might change if the device was rotated upside down, the descriptions remain valid because they describe relative relationships between features of the invention.

Disclosed is a Darlington pair of bipolar junction transistors (BJT) configured as a dual-base Darlington Pair BJT sensor. The Darlington pair BJT sensor has a first or vertical or sensing BJT transistor and a second or lateral or amplifying BJT transistor in the pair of BJTs.

The first BJT transistor of the Darlington pair BJT is a vertical/sensing BJT with a vertical emitter, a vertical base, and a vertical collector (which also serves as the horizontal extrinsic base of the second, horizontal/lateral BJT transistor). The vertical/sensing BJT has a dual base, comprised of a right extrinsic vertical base and left extrinsic vertical extrinsic base. The vertical BJT is also referred to as the sensor/sensing transistor or dual base BJT, without loss of generality.

The left extrinsic vertical base and right extrinsic vertical base are physically separated from one another by the vertical base, and electrically coupled with one another via the vertical base. The left extrinsic vertical base is in contact with a left side of the vertical base and the right extrinsic vertical base in in contact with a right side of the vertical base.

The second part/transistor part of the Darlington pair BJT sensor is a horizontal BJT with a horizontal emitter, a horizontal collector, and a horizontal base. The horizontal BJT also has and uses the horizontal extrinsic base that is in contact with and vertically above the horizontal base. The horizontal extrinsic base is in common with and identical to the vertical collector of the vertical BJT, i.e., they are one in the same element. The horizontal BJT is also referred to as the lateral BJT, integrated BJT, or amplifying BJT, without loss of generality.

The vertical/dual base/sensing BJT has an inherent gain, associated with a BJT. The disclosed Darlington pair BJT sensor boosts this gain "in-situ" (without having to transfer the signal acquired by the sensing BJT to an external amplifier circuit). In some embodiments, the effective gain of the Darlington pair BJT is the product of dual-base sensing (vertical) BJT gain and the horizontal/lateral/integrated BJT gain. Since the horizontal extrinsic base of the lateral BJT is the same element as the vertical collector of the vertical BJT, there is essentially no connection distance between the collector of the vertical/sensing BJT and the base of the lateral BJT, i.e., any noise introduced over this "in-situ connection" is dramatically reduced.

Since the vertical/dual base/sensing BJT is aligned in a perpendicular direction to the lateral BJT, i.e., the sensor BJT sits in a vertical alignment/direction above the horizontal/lateral BJT, essentially no additional surface of the substrate is needed for the Darlington pair BJT sensor beyond that used by the lateral BJT. Accordingly, the Darlington pair BJT sensor enables dense and area-efficient integration with semiconductor circuitry, using standard semiconductor processing methods.

The invention enables the Darlington pair BJT sensor to be made with a complementary Darlington pair configuration, also known as a Sziklai configuration, where the sensing and lateral BJTs are of different polarities. For example, the complementary Darlington pair BJT sensor as described herein may be comprised of a lateral BJT having an n-p-n polarity and a sensing BJT having a p-n-p polarity (FIGS. 1-42A, and 44), or may be comprised of a lateral BJT having a p-n-p polarity and a sensing BJT having a n-p-n polarity.

FIG. 1 is a cross section view of an initial structure 100 for a Darlington pair BJT sensor including a semiconductor substrate layer 105, a BOX/isolation layer 110, and a horizontal/lateral BJT base layer 150 (part of which becomes the horizontal base, as described in FIG. 4 and the implanted horizontal base 450/550, as described in FIG. 5, below).

In some embodiments, the substrate/bulk 105 is made of one or more semiconductor materials. Non-limiting examples of suitable substrate/bulk 105 materials include Si (silicon), strained Si, Ge (germanium), SiGe (silicon germanium), Si alloys, Ge alloys, III-V semiconductor materials (e.g., GaAs (gallium arsenide), InAs (indium arsenide), InP (indium phosphide), Indium Gallium Arsenide (InGaAs), or aluminum arsenide (AlAs)), II-VI materials (e.g., CdSe (cadmium selenide), CdS (cadmium sulfide), CdTe (cadmium telluride), ZnSe (zinc selenide), ZnS (zinc sulfide), or ZnTe (zinc telluride)), or any combination thereof.

In an exemplary embodiment, the substrate 105 is silicon.

In some silicon-on-insulator (SOI) embodiments, a BOX layer 110 is a buried oxide layer (e.g., SiO2) buried in the substrate (wafer) 105 typically at the depth ranging from less than 100 nanometers (nm) to several micrometers from the wafer surface 105A, depending on application. The thickness of BOX layer 110 is typically in the range from about 20 nanometers (nm) to about 150 nm.

BOX layers 110, and alternatively isolation layers 110, prevent electric current leakage between adjacent semiconductor components built upon these layers. BOX layers 110 and substrates 105 are well known.

Example alternative isolation layers 110 include known punch through stopper (PTS) doping layers that are also used to prevent current leakage from active layers built upon the PTS layer.

In one embodiment, an available silicon-germanium on insulator (SGOI) wafer comprised of a SiGe layer 150, carrier substrate 105 and BOX layer 110 is used. The doping of the SiGe layer may be adjusted by known techniques such as ion-implantation and annealing. In some embodiments, epitaxy with in-situ doping may be used to increase the thickness of the SiGe layer 150 to a desired thickness.

In an embodiment with an NPN lateral BJT, the semiconductor layer 150 is a silicon-germanium (SiGe) layer with a p-type doping that forms a p-type SiGe-on-Insulator substrate (SGOI) 150.

Alternatively, an available bulk silicon wafer 105 with a PTS layer 110 and SiGe layer 150 can be used.

These techniques and materials are known.

To form an alternative PNP lateral BJT embodiment, an n-type doping material, e.g., phosphorus (P), arsenic (As) and antimony (Sb), would be used for doping the semiconductor (e.g., SiGe) layer 150.

Figure 2:
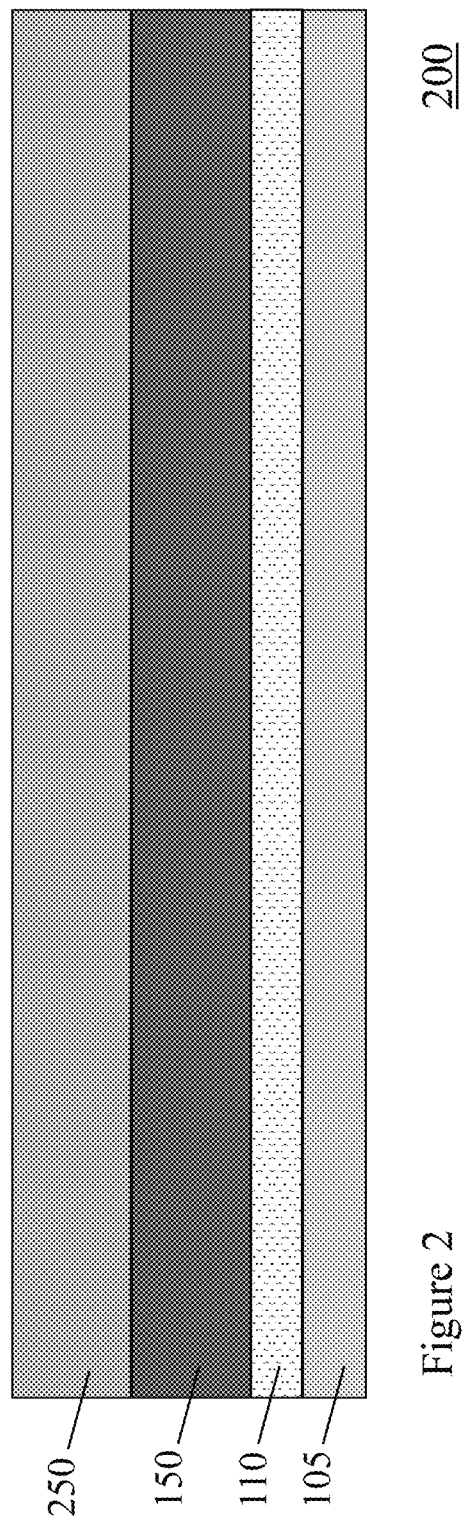
FIG. 2 is a cross section view of an initial structure adding a preliminary extrinsic base/collector layer.

FIG. 2 is a cross section view of an initial structure 200 with a preliminary extrinsic base/collector layer 250 deposited on structure 100. As described below, part of the preliminary extrinsic base/collector layer 250 becomes the common extrinsic base/collector 350 which becomes both an extrinsic base of the amplifying/horizontal BJT of the Darlington pair BJT and the collector of the vertical/sensing BJT of the Darlington pair BJT.

In some embodiments, the preliminary extrinsic base/collector layer 250 is epitaxially grown on the semiconductor layer 150. The thickness of the preliminary extrinsic base/collector layer 250 is between 10 nanometers (nm) and 50 nm, but thinner or thicker layers may be used as well.

The terms "epitaxially growing and/or depositing" and "epitaxially grown and/or deposited" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, each semiconductor layer of the epitaxial semiconductor material stack has the same crystalline characteristics as the deposition surface on which it is formed.

Examples of various epitaxial growth process apparatuses that can be employed in the present application include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition typically ranges from 550° C. to 900° C. Although higher temperature typically results in faster deposition, the faster deposition may result in crystal defects and film cracking. In some embodiments, the gas source for the epitaxial growth may include a silicon containing gas source and/or an admixture of a germanium containing gas source. Examples of silicon gas sources include silane, disilane, trisilane, tetrasilane, hexachlorodisilane, tetrachlorosilane, dichlorosilane, trichlorosilane, and combinations thereof. Examples of germanium gas sources include germane, digermane, or combinations thereof. In some embodiments, an epitaxial SiGe alloy can be formed from a source gas that includes a compound containing silicon and germanium. Carrier gases like hydrogen, nitrogen, or helium can be used. For the epitaxial growth of a layer an appropriate dopant type is added to the precursor gas or gas mixture. In some embodiments of channel material layers, no dopant is typically present in, or added into, the precursor gas or gas mixture.

In some embodiments, layers are grown by an integrated epitaxy process. In an integrated epitaxy process the structure is epitaxially grown continuously while the type and/or the concentration of dopants changes at different times and time periods to create the different layers with different dopants and dopant concentrations. Some temperature adjustments may be made for one or more of the layers during the epitaxial growth as well.

For embodiments where the lateral BJT is an NPN BJT, the extrinsic-base layer 250 is p-doped. For embodiments where the lateral BJT is an PNP BJT, the extrinsic-base layer 250 is n-doped.

Dopants may include, for example, in the epitaxial layer 250 a p-type dopant selected from a group of boron (B), gallium (Ga), indium (In), and thallium (Tl) and in an alternative extrinsic base layer 250 an n-type dopant selected from a group of phosphorus (P), arsenic (As) and antimony (Sb), at various concentrations. For example, in a non-limiting example, a dopant concentration range may be $1 \times 10^{18}$ cm$^{-3}$ to $3 \times 10^{21}$ cm$^{-3}$, or preferably between $2 \times 10^{21}$ cm$^{-3}$ to $1 \times 10^{21}$ cm$^{-3}$.

Figure 3:
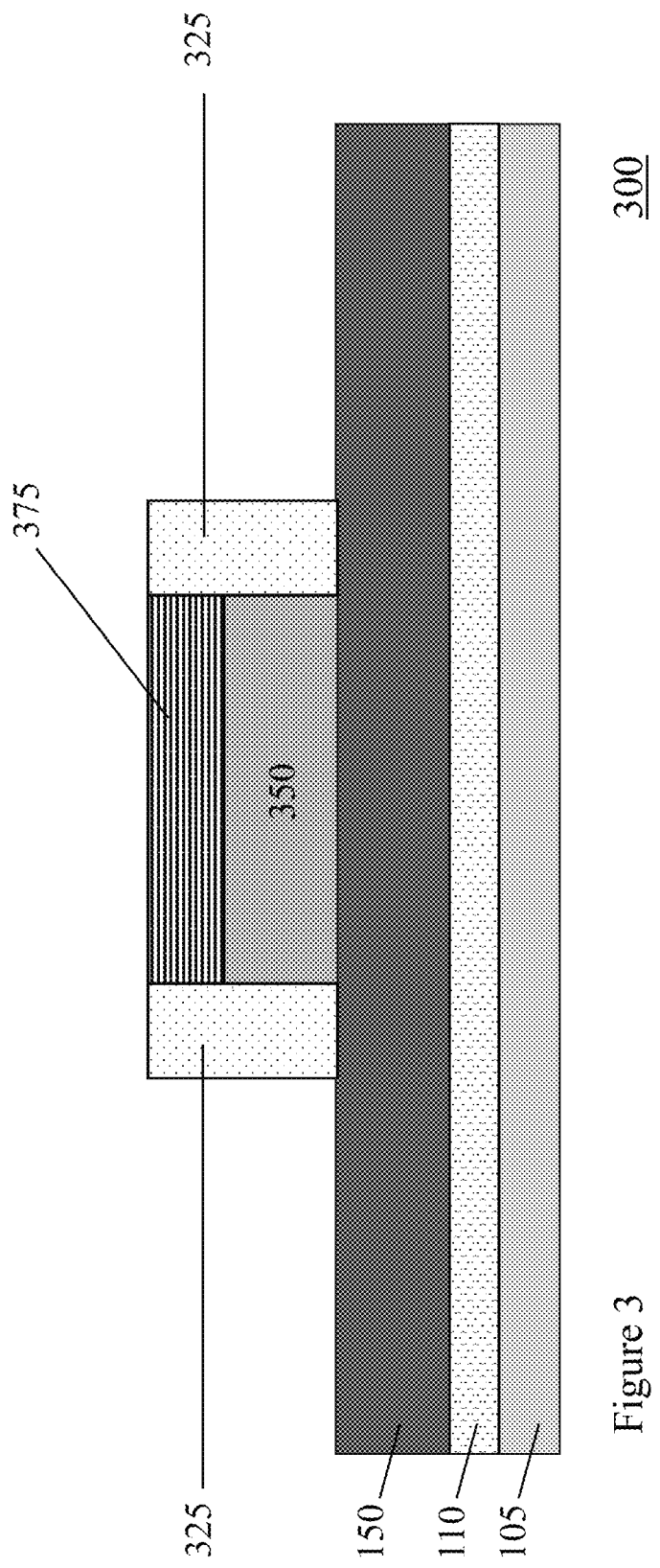
FIG. 3 is a cross section view showing interim structures used to create a common extrinsic base/collector.

FIG. 3 is a cross section view showing interim structures 300 used to create a common extrinsic base/collector 350.

A hard mask 375 is deposited in a pattern on the extrinsic-base layer 250 where the common extrinsic base/collector(s) 350 is/are to be formed.

The hard mask 375 is a protective, dielectric material, e.g., a lithographic protective material. In some embodiments, the hard mask 375 materials include but are not limited to any one of the following materials: silicon nitride (SiN), siliconborocarbonitride (SiBCN), silicon oxycarbonitride (SiOCN), and silicon oxynitride (SiON).

In some embodiments, the hard mask 375 is made of silicon nitride (SiN) or silicon oxide (SiO2) and is deposited by standard techniques like physical vapor deposition (PVD).

An etching step, selective to the material in horizontal/lateral BJT base layer 150, removes all material in the extrinsic-base layer 250 unprotected (not under) the hard mask 375. The remaining material (protected by the hard mask 375) becomes the common extrinsic base/collector 350.

A spacer 325 material is then conformally deposited, e.g., by known processes like atomic layer deposition (ALD) around the common extrinsic base/collector 350. A known vertical etch, e.g., a reactive ion etch (RIE), removes the spacer material from the horizontal surfaces leaving the spacers 325 on the sides of the common extrinsic base/collector 350.

In some embodiments, the vertical etch is selective to the material making up the hard mask 375 and the horizontal/lateral BJT base layer 150.

In some embodiments the resulting width/thickness of the spacers 325 is between 3 nm and 10 nm. In alternative embodiments, the spacer 325 thickness is about 5 nm to 7 nm.

In some embodiments, the spacers 325 are made of materials including: dielectric oxides (e.g., silicon oxide), dielectric nitrides (e.g., silicon nitride (SiN), SiBCN, SiCN, and SiBN), dielectric oxynitrides, (e.g., SiOCN), SiCO, and SiC, or any combination thereof.

Note that selective etching is an etching process with chemistries and conditions that remove one material and/or layer but not another (not etched material). Alternatively, the non-etched material will be etched by the etching process chemistry but at a much lower etching rate than the removed material. Here the measure of selectivity can be a ratio between the etching rate between two given materials. For example, an etching chemistry "selective to" a material means that the etchant will not remove that material or will remove it a slower rate. Therefore, using an etching chemistry selective to materials making the hard mask 375 and spacers 325 will remove material in the extrinsic-base layer 250 without removing (or minimally removing) materials making the hard mask 375 and spacers 325.

Figure 4:
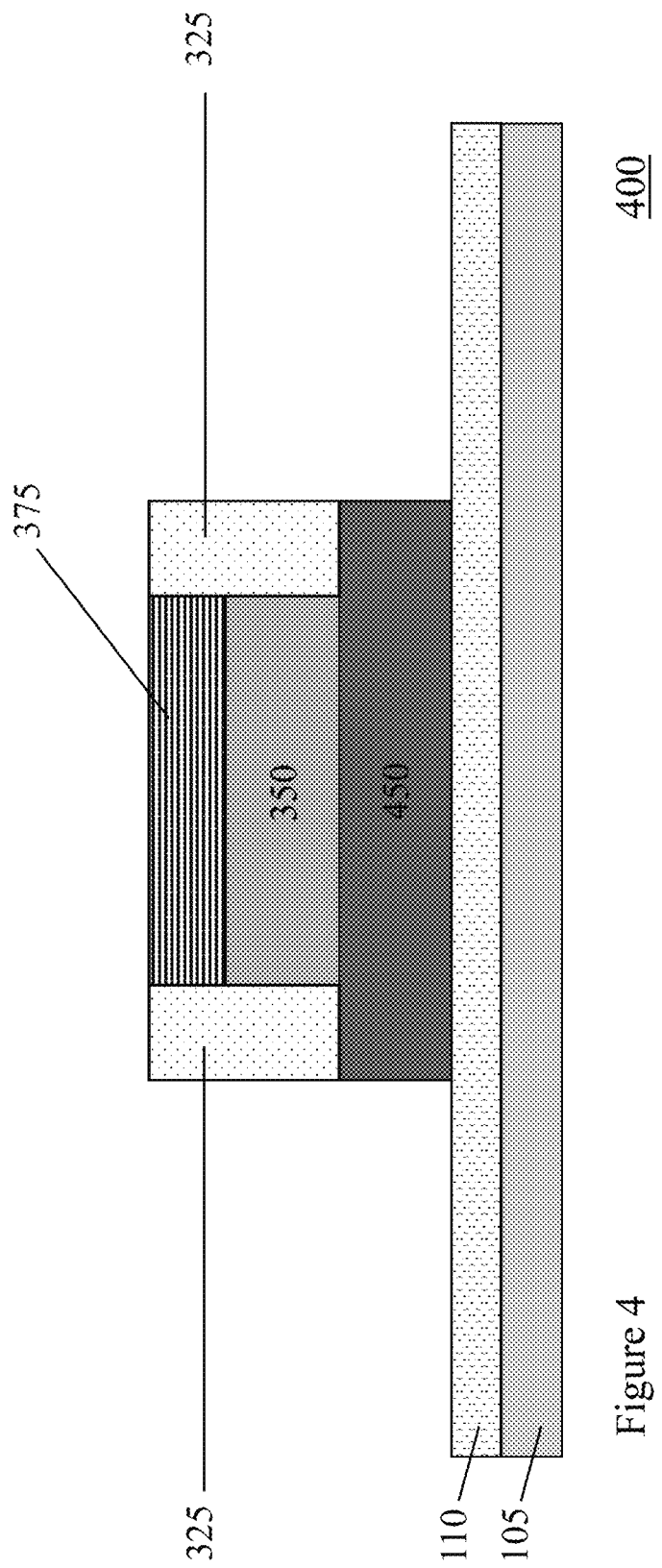
FIG. 4 is a cross section view showing interim structures after a mask etch step creates the horizontal base.

FIG. 4 is a cross section view showing interim structures 400 after a masked base etch step creates the horizontal base 450. As described above with respect to FIG. 3, a directional etch is perform that is selective to the materials making the BOX/isolation layer 110, hard mask 375, and spacers 325.

The material remaining 450 in the semiconductor layer 150, i.e., the material protected by (under the vertical projection of) the hard mask 375 and spacers 325 becomes the horizontal base 450.

Figure 5:
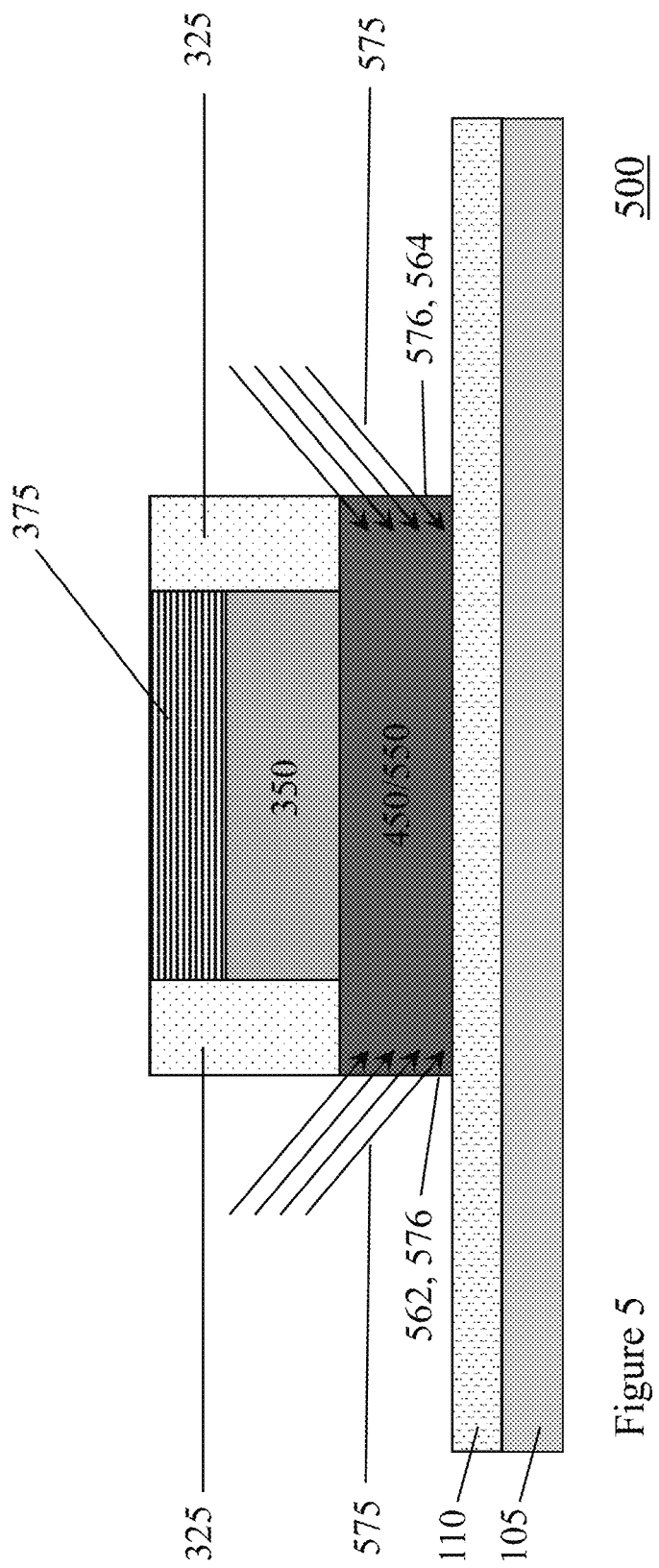
FIG. 5 is a cross section view showing interim structures after an ion implantation of the sides of the horizontal (intrinsic) base.

FIG. 5 is a cross section view showing interim structures 500 after an ion implantation 575 of the sides 576 of the implanted horizontal base 450/550.

In some embodiments, when the horizontal/lateral BJT is a PNP, i.e., the horizontal/lateral intrinsic base 550 is N-type doped, an ion implantation 575 embodiment is a hot BF2 implantation. In some embodiments, when the horizontal/lateral BJT is a NPN, i.e., the horizontal/lateral intrinsic base 550 is P-type doped, an ion implantation 575 embodiment is a hot As or P implantation.

In some lateral NPN BJT embodiments, the ion implantation 575 is an angle implantation of a first dopant on the emitter side 562/576 of the horizontal/lateral base 550 (or lateral intrinsic base 550) and an angle implantation of a second dopant on the collector side 576/564 of the lateral intrinsic base 550. The second dopant polarity and/or species may be the same as, or different from the first dopant.

The implantation can be either hot or cold, however, hot implantation is preferred. Typically, the implantation is an angled ion implantation. These ion-implantations are known. This ion-implantation step is optional, and may be omitted in some embodiments.

Figure 6:
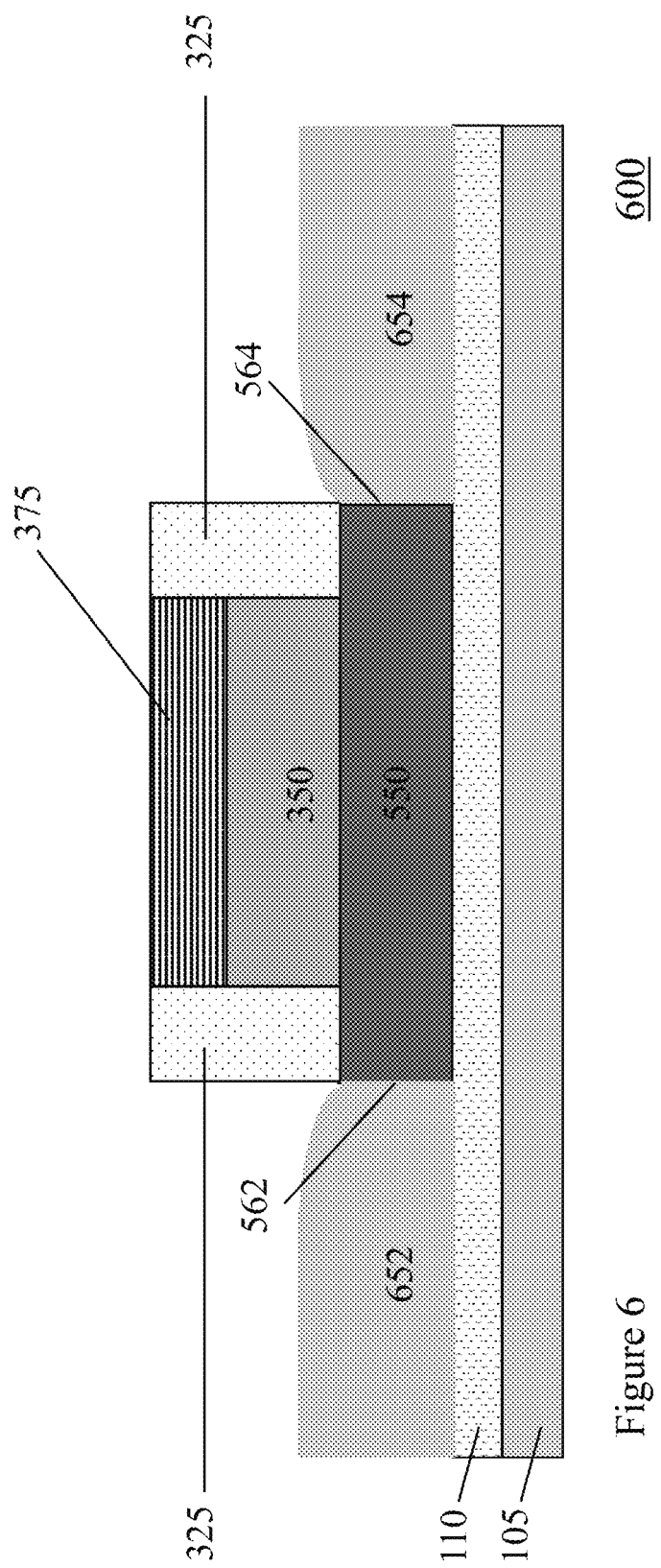
FIG. 6 is a cross section view showing interim structures after a horizontal emitter and a horizontal collector for a horizontal/lateral BJT are formed by an epitaxial growth step, the horizontal emitter and collector being on either side of the horizontal (intrinsic) base that in combination with the common extrinsic base/collector form a horizontal/lateral Bipolar Junction Transistor (BJT) part of a Darlington pair BJT sensor.

FIG. 6 is a cross section view showing interim structures 600 after a lateral emitter 652 and a lateral collector 654 for the horizontal/lateral BJT 652/550/654/350 are formed by an epitaxial growth step, as explained above. The lateral emitter 652 is on the emitter side 562 of the lateral intrinsic base 550 and the lateral collector 654 is on the collector side 564 of the lateral intrinsic base 550. The lateral/horizontal emitter 652 and the lateral/horizontal collector 654 are physically, chemically, and electrically connected to their respective sides 562/564 of the lateral intrinsic base 550 to form the horizontal Bipolar Junction Transistor (BJT) 652/550/654/350 of the Darlington pair BJT sensor.

Figure 7:
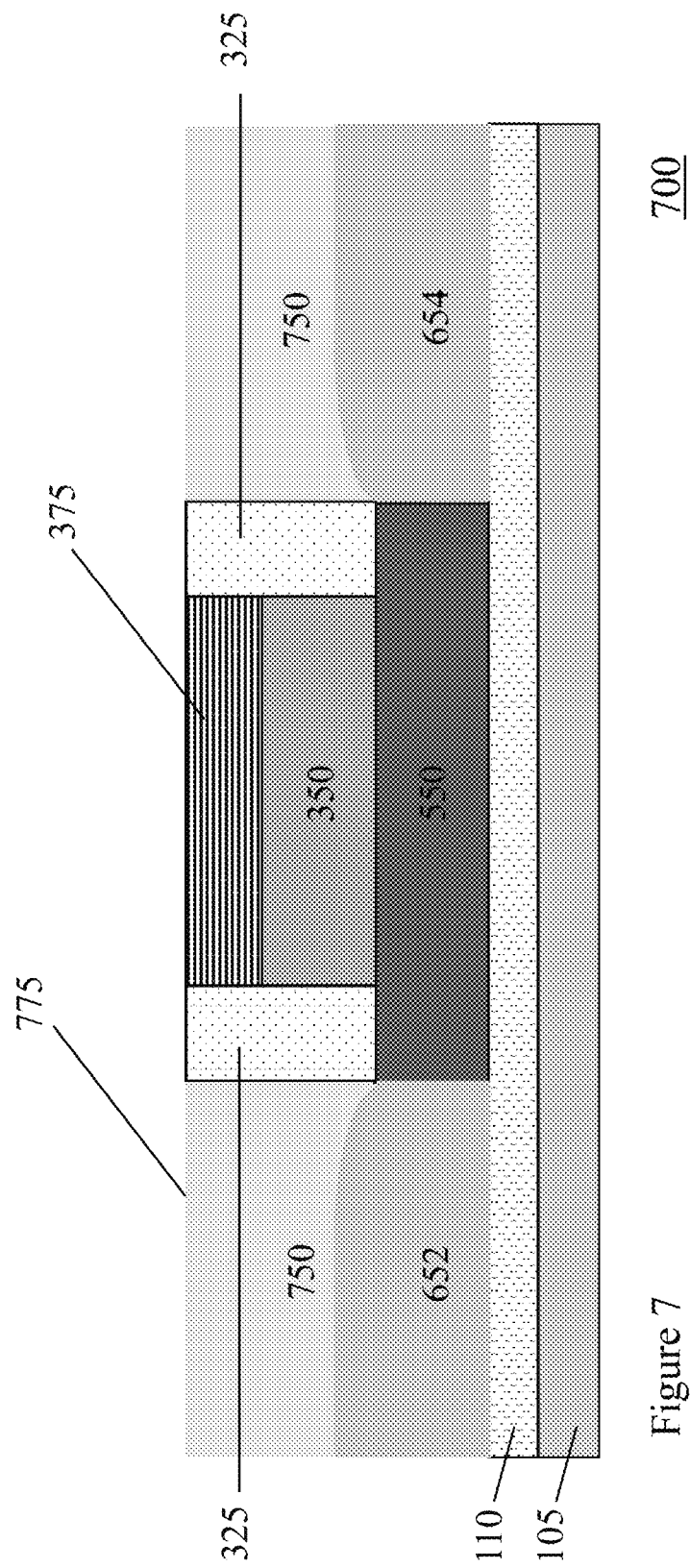
FIG. 7 is a cross section view showing interim structures after filling the interim structure with an interlayer dielectric (ILD) and applying a chemical-mechanical polishing (CMP).

FIG. 7 is a cross section view showing interim structures 700 after filling the interim structure with an interlayer dielectric (ILD) 750 and applying a chemical-mechanical polishing (CMP) of the top surface 775.

The ILD 750 may be formed from, for example, a low-k dielectric material (with k<4.0), including but not limited to, silicon oxide, spin-on-glass, a flowable oxide, a high-density plasma oxide, borophosphosilicate glass (BPSG), or any combination thereof. The ILD 750 is deposited by a deposition process, including, but not limited to chemical vapor deposition (CVD), physical vapor deposition (PVD), plasma enhanced CVD, atomic layer deposition (ALD), evaporation, chemical solution deposition, or like processes.

The CMP is a known process for leveling the top surface 775 of the structure 700.

Figure 8:
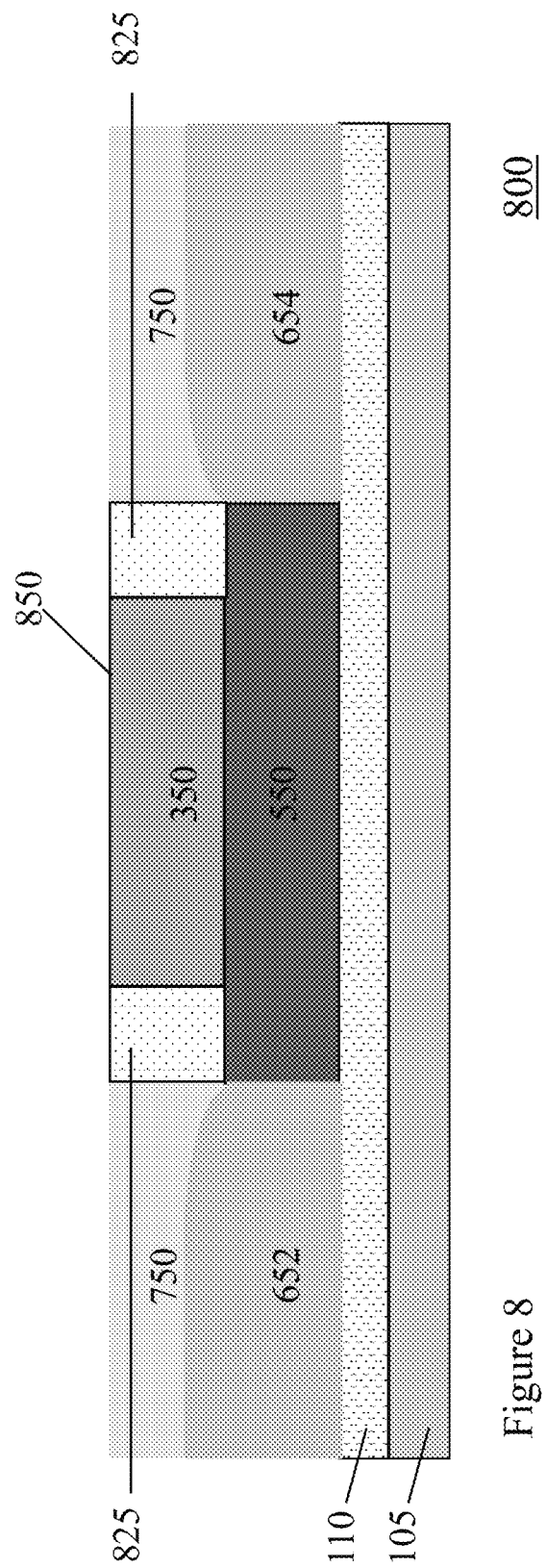
FIG. 8 is a cross section view showing interim structures after a CMP removes a hard mask and exposes the common extrinsic base/collector.

FIG. 8 is a cross section view showing interim structures 800 after a hard mask removal CMP removes the hard mask 375 and exposes the common extrinsic base/collector 350. In some embodiments, the hard mask removal CMP stops at the top surface 850 of the common extrinsic base/collector 350 when removed portions of the common extrinsic base/collector 350 materials are detected during the hard mask removal CMP. The hard mask removal CMP creates a flat surface of the structure 800 with the top surface 850 of the common extrinsic base/collector 350 exposed. Spacers 825 are what remains of spacers 325 after the CMP.

Figure 9:
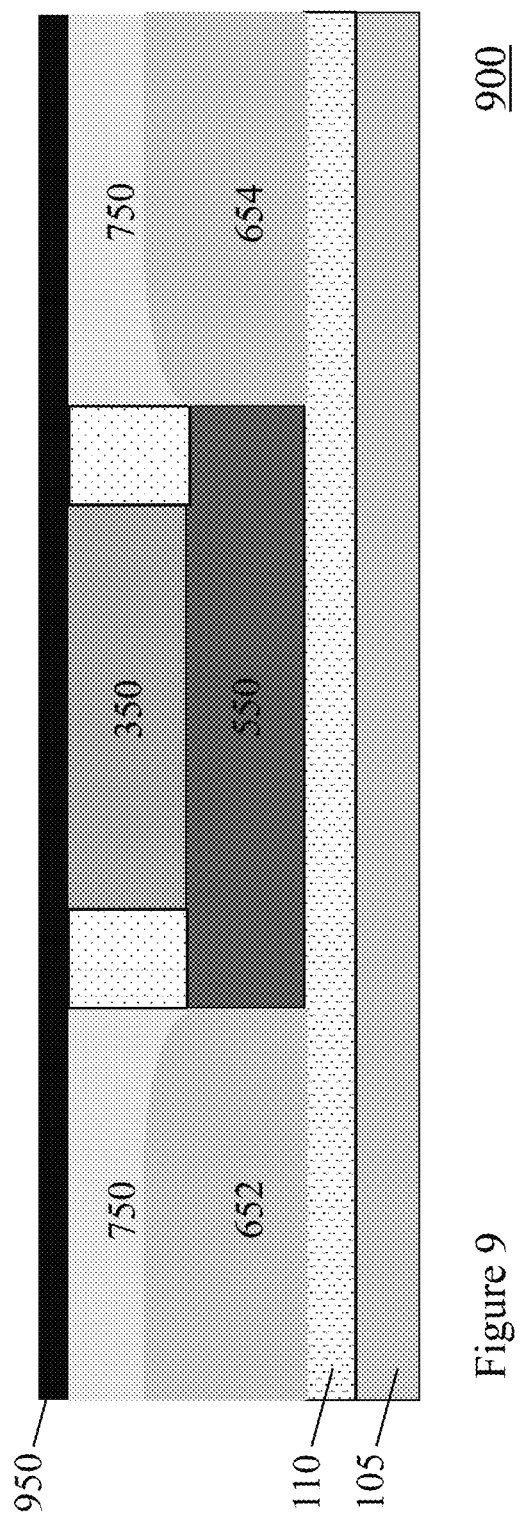
FIG. 9 is a cross section view showing interim structures after formation of a bottom spacer on the horizontal (or lateral/amplifying) BJT.

FIG. 9 is a cross section view showing interim structures 900 after formation of a bottom spacer 950 on the horizontal (or lateral) BJT 652/550/654/350.

The bottom spacer 950 can be made from a low-k dielectric formed according to known processes. The term "low-k dielectric" generally refers to an insulating material having a dielectric constant less than silicon dioxide, e.g., less than 3.9. Exemplary low-k dielectric materials include, but are not limited to, dielectric oxides (e.g., silicon oxide), dielectric nitrides (e.g., SiN, SiBCN), dielectric oxynitrides (e.g., SiOCN, SiCO), or any combination thereof or the like. Other non-limiting examples of materials for the bottom spacer 950 include dielectric oxides (e.g., silicon oxide), dielectric nitrides (e.g., silicon nitride), dielectric oxynitrides, or any combination thereof.

The bottom spacer 950 materials are deposited by a deposition process, for example, CVD or PVD. The bottom spacer 950 can have a thickness of about 3 to about 15 nm, or of about 5 to about 10 nm. Deposition processes allow the thickness of the spacer 950 to be precisely controlled.

In some embodiments, the bottom spacer is a dielectric nitride.

Figure 10:
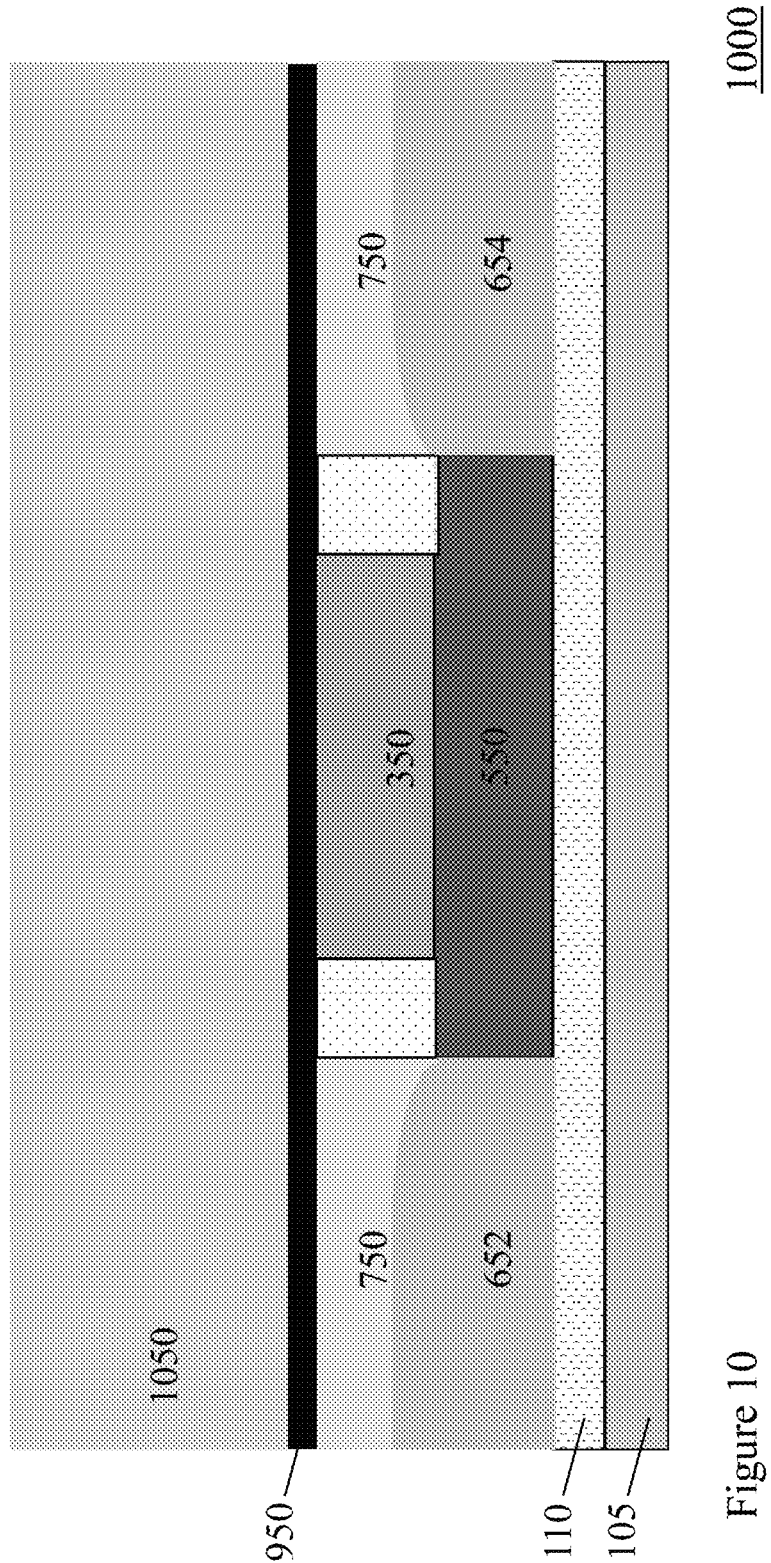
FIG. 10 is a cross section view showing interim structures after formation of a sacrificial placeholder material on the bottom spacer.

FIG. 10 is a cross section view showing interim structures 1000 after formation of a sacrificial placeholder material 1050 on the bottom spacer 950.

The sacrificial placeholder material 1050 is made of, for example, amorphous silicon (a-Si) or polycrystalline silicon (polysilicon). The sacrificial placeholder material 1050 may be deposited by a deposition process, including, but not limited to, PVD, CVD, plasma enhanced chemical vapor deposition (PECVD), inductively coupled plasma chemical vapor deposition (ICP CVD), or any combination thereof. The sacrificial placeholder material has a thickness of about 10 nm to about 100 nm, or from about 20 nm to about 50 nm. Known deposition techniques enable the thickness of the sacrificial placeholder material 1050 to be controlled precisely.

In some embodiments, the sacrificial placeholder material 1050 is amorphous silicon.

Figure 11:
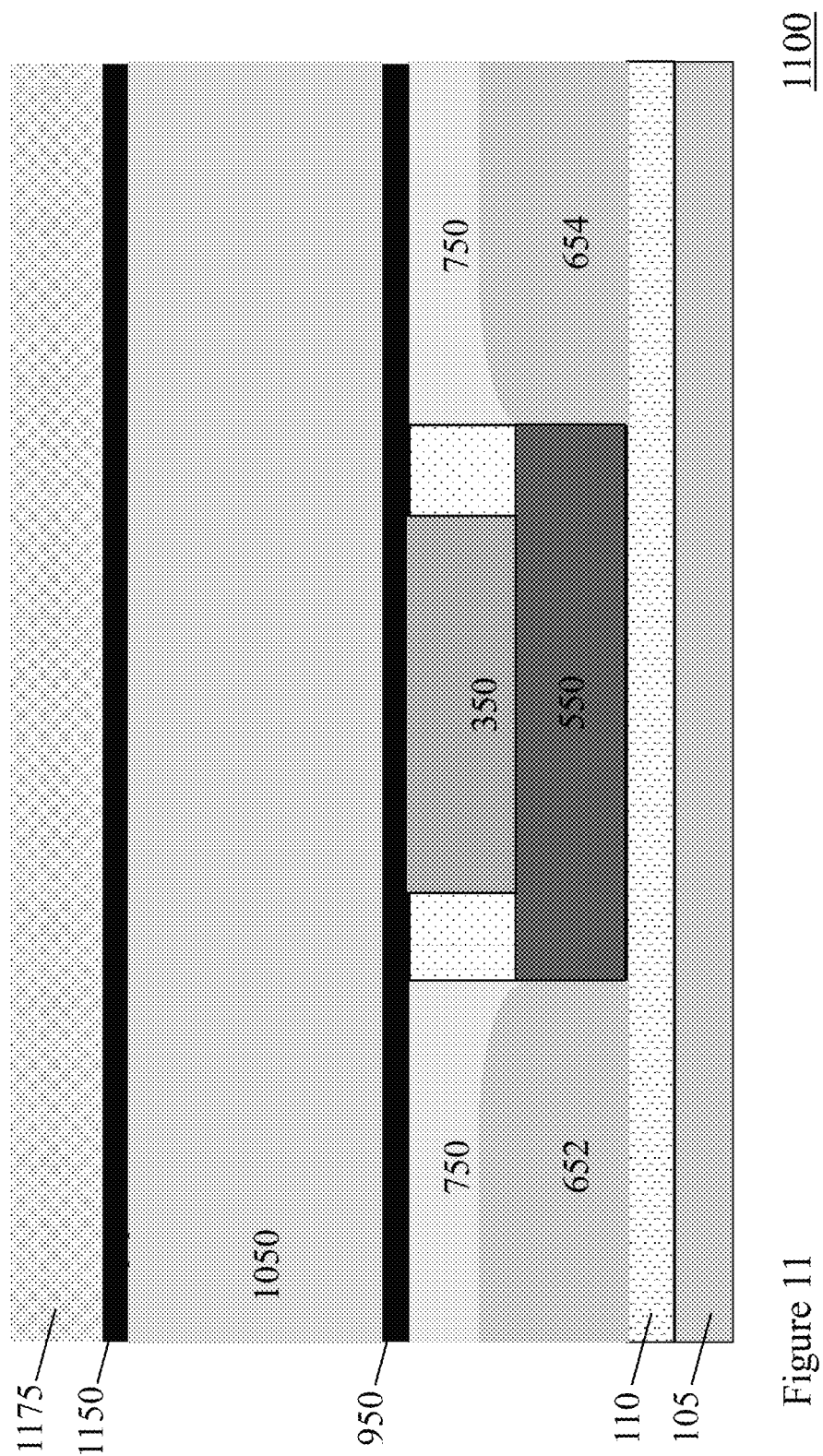
FIG. 11 is a cross section view showing interim structures after formation of top spacer on the sacrificial placeholder material followed by formation of an oxide layer on the top spacer.

FIG. 11 is a cross section view showing interim structures 1100 after formation of top spacer 1150 on the sacrificial placeholder material 1050 followed by formation/deposition of an oxide layer 1175 on the top spacer 1150.

The top spacer 1150 is made from the same or similar materials and using the same or similar deposition techniques as used to create the bottom spacer 950.

The oxide layer 1175 is deposited by known techniques, e.g., CVD or PVD, and is made of materials like silicon-borocarbonitride (SiBCN), silicon oxycarbonitride (SiOCN), and silicon oxide.

In some embodiments, the oxide layer 1175 is made of silicon dioxide and the top spacer 1150 is made of silicon nitride, SiN.

Figure 12:
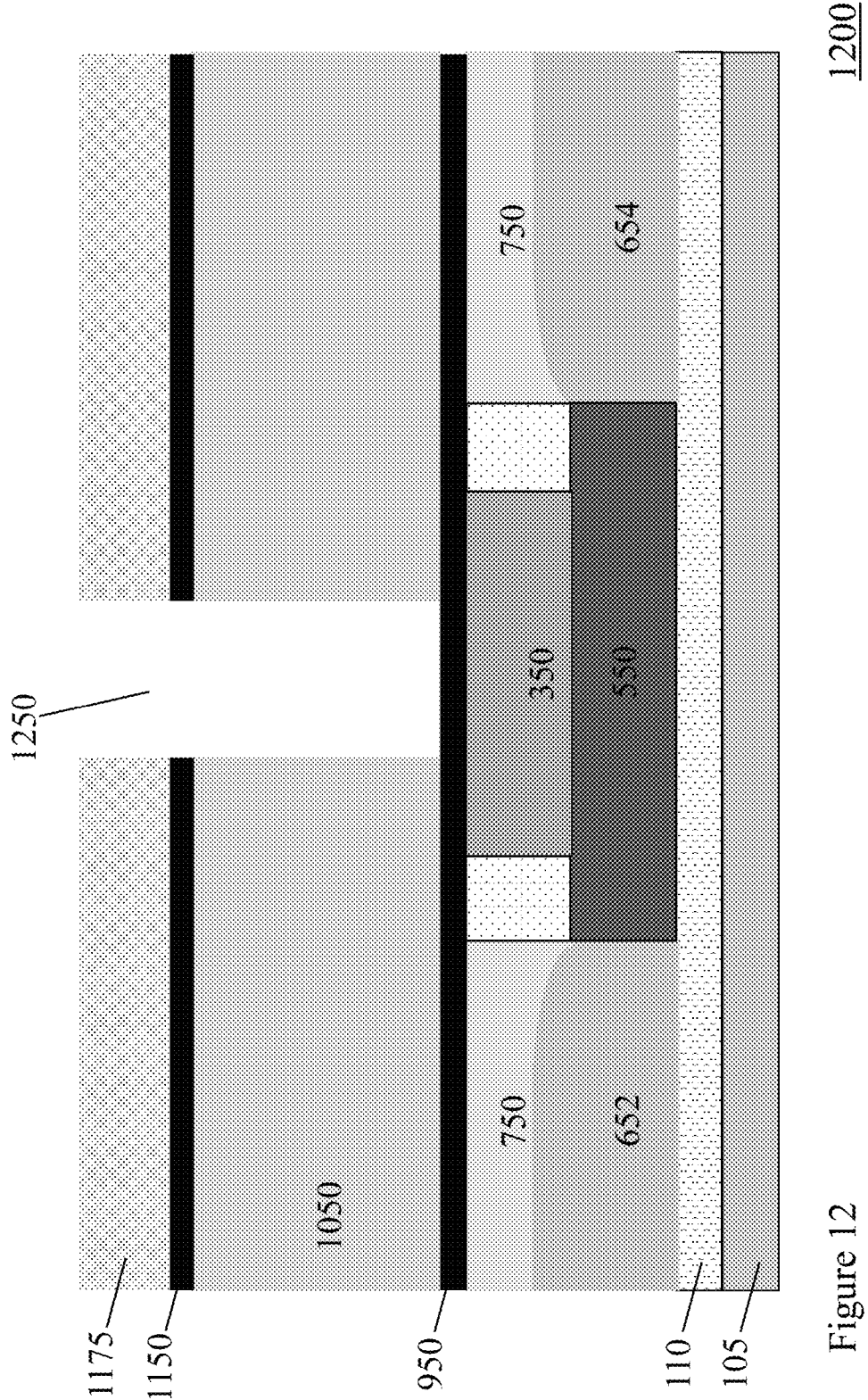
FIG. 12 is a cross section view showing interim structures after formation of a trench by etching through the oxide layer, the top spacer, and the sacrificial placeholder material selective to (stopping at) the bottom spacer.

FIG. 12 is a cross section view showing interim structures 1200 after formation of a trench 1250 by etching through the oxide layer 1175, the top spacer 1150, and the sacrificial placeholder material 1050 selective to (stopping at) the bottom spacer 950.

In some embodiments, the trench etching can be performed in steps. For example, a first RIE can etch through the oxide layer 1175, top spacer 1150, and partially through the sacrificial placeholder material 1050. A second RIE can then be used that is selective to the material in the bottom spacer 950 to remove the remainder of the sacrificial placeholder material 1050.

Figure 13:
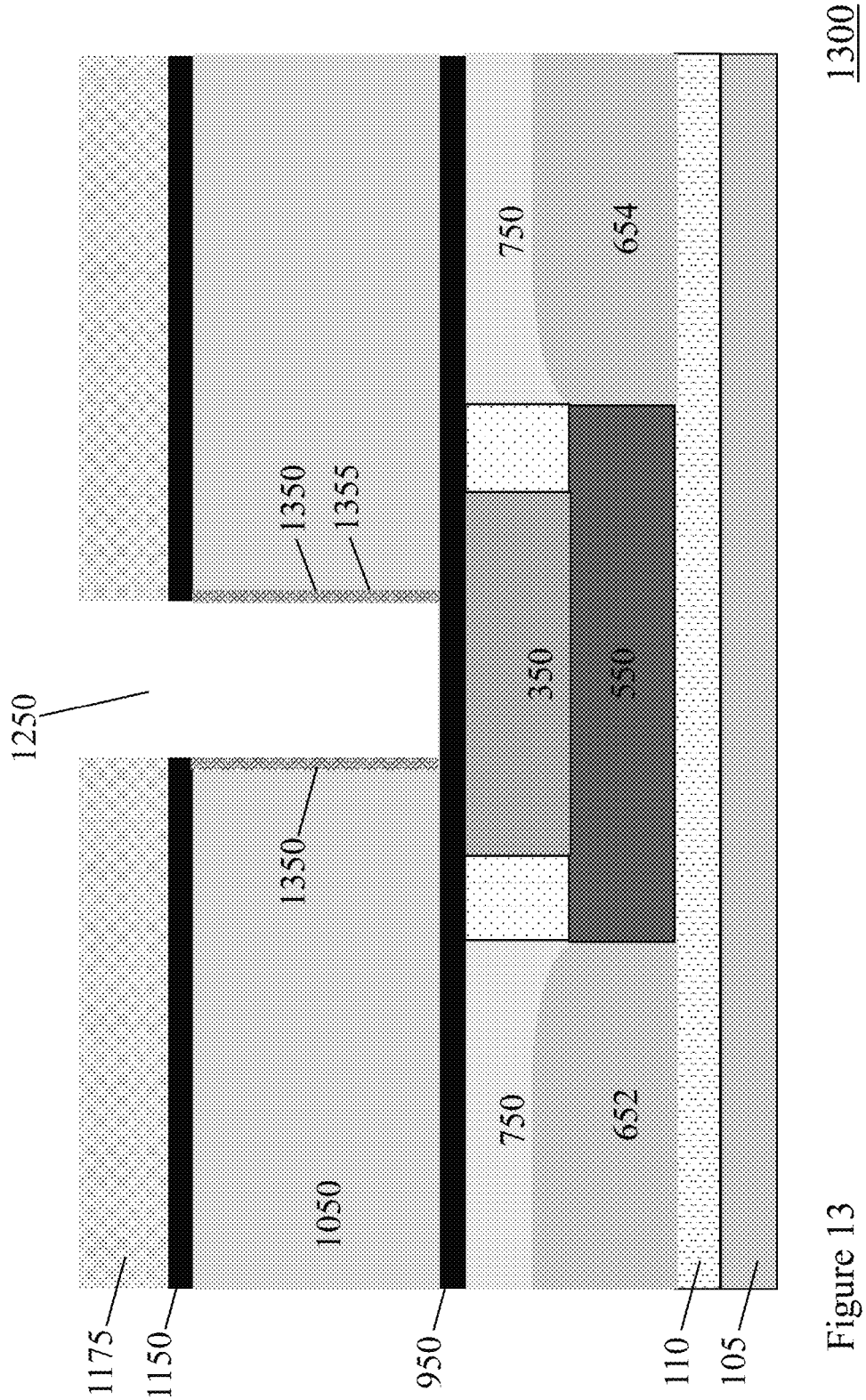
FIG. 13 is a cross section view showing interim structures after formation of a thin, vertical oxide layer on the walls of the trench made by oxidation of the sacrificial placeholder material.

FIG. 13 is a cross section view showing interim structures 1300 after formation of a thin, vertical oxide layer 1350 on the walls 1355 of the trench 1250. The thin, vertical oxide layer 1350 is made by oxidation of the sacrificial placeholder material 1050.

Exposure to a plasma or any other method of oxidation creates the very thin oxide formation 1350 on the side walls 1355 of the sacrificial placeholder material 1050 within the trench 1250. The bottom spacer 950 protects the common extrinsic base/collector 350 from being oxidized by the plasma/oxidation.

Figure 14:
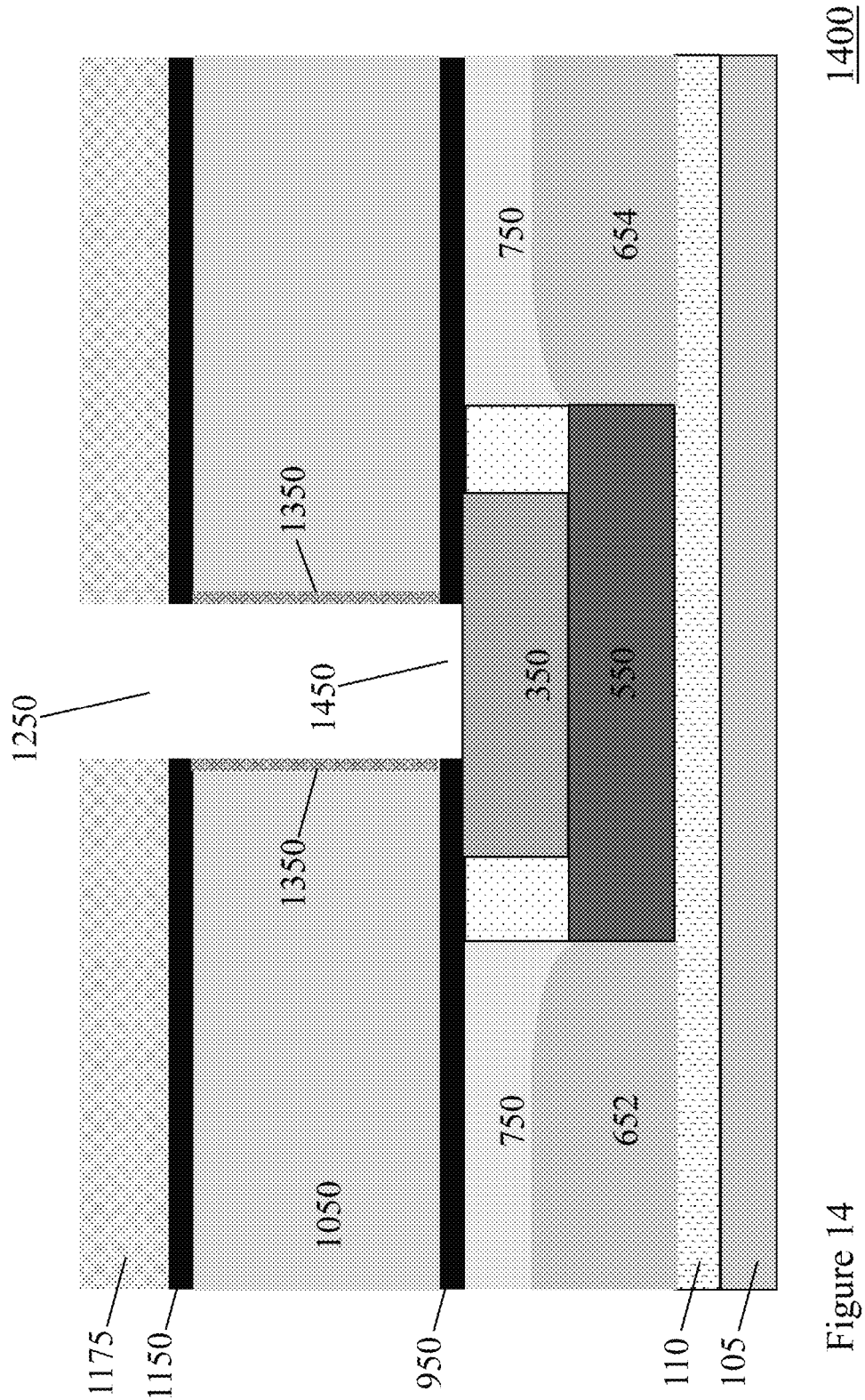
FIG. 14 is a cross section view showing interim structures after a selective etch (selective to the common extrinsic base/collector material) opens the bottom spacer at the base of the trench, exposing the common extrinsic base/collector, and enabling the common extrinsic base/collector to become the collector of a vertical/sensing BJT part of the Darlington Pair BJT sensor.

FIG. 14 is a cross section view showing interim structures 1400 after a selective etch (selective to the common extrinsic base/collector 350 material) opens the bottom spacer 950 at the base 1450 of the trench 1250, exposing the common extrinsic base/collector 350 and enabling the common extrinsic base/collector 350 to also become the collector of the vertical/sensing BJT of the Darlington pair BJT sensor.

In some embodiments, the width of the trench is between 10 nm and 50 nm, but wider or narrower trenches may be used as well.

Figure 15:
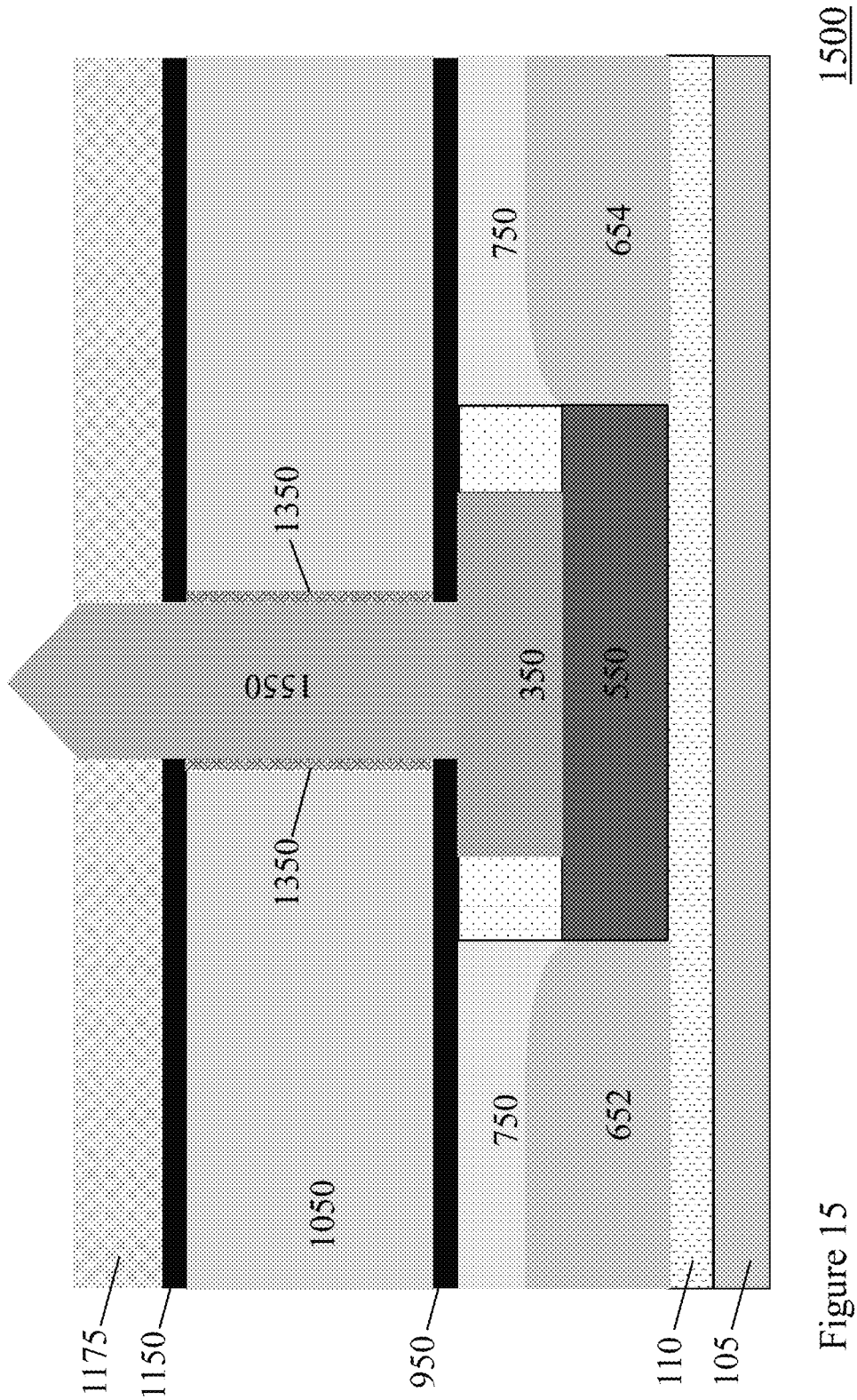
FIG. 15 is a cross section view showing interim structures after formation of a vertical base region in the trench that will become the base of the vertical/sensor BJT.

FIG. 15 is a cross section view showing interim structures 1500 after formation of a vertical base region 1550 in the trench 1250 that will become the vertical base of the vertical BJT.

The epitaxial growth of base material in the vertical base region 1550 is lattice matched to common extrinsic base/collector 350 material. The vertical base region 1550 is a semiconductor material that epitaxially grows within the trench 1250 by known methods described above.

In some embodiments, a strained vertical base is formed by lattice matching the material in the vertical base region 1550 closely but not exactly to the lattice of the common extrinsic base/collector 350 material.

In some embodiments, base material in the vertical base region 1550 is silicon-germanium doped at a concentration of $10^{18}$-$10^{20}$ cm$^{-3}$, with concentrations in the range $10^{19}$-$5\times10^{19}$ cm$^{-3}$ being more typical. If the vertical/sensing BJT has a PNP polarity, the material in the vertical base region 1550 is N-doped. If the vertical/sensing BJT has a NPN polarity, the material in the vertical base region 1550 is P-doped.

Figure 16:
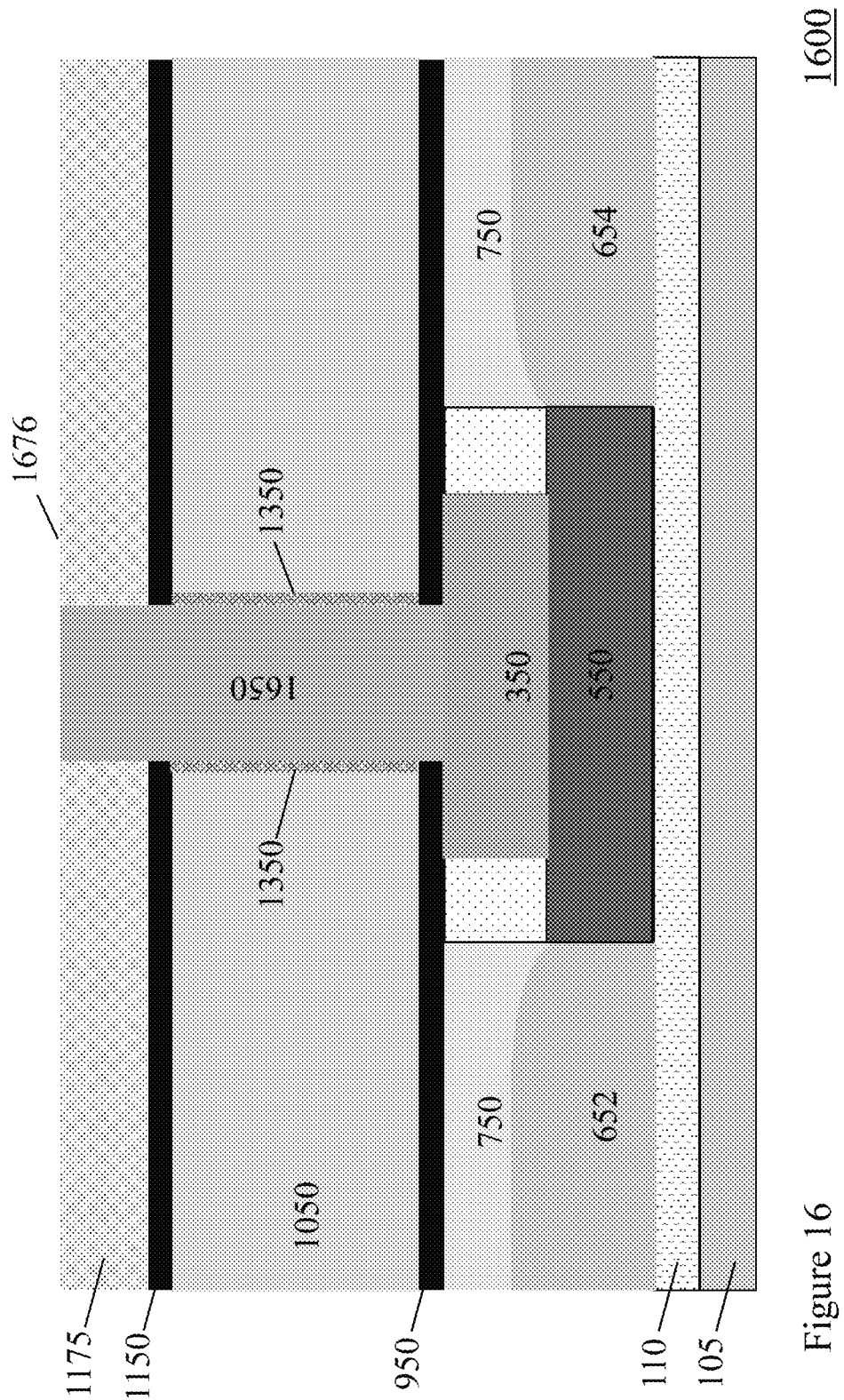
FIG. 16 is a cross section view showing interim structures after a polishing (e.g., CMP) of the vertical base region back to the oxide layer to form a vertical base of the vertical BJT part of the Darlington pair BJT sensor.

FIG. 16 is a cross section view showing interim structures 1600 after a polishing (e.g., CMP) the top of the vertical base region 1550 back to and level with the surface 1676 of the oxide layer 1175. The planarization/CMP removes excess epitaxial growth over the surface 1676 of the oxide layer 1175 and forms a vertical base 1650 of the vertical BJT part of the Darlington pair BJT sensor.

Figure 17:
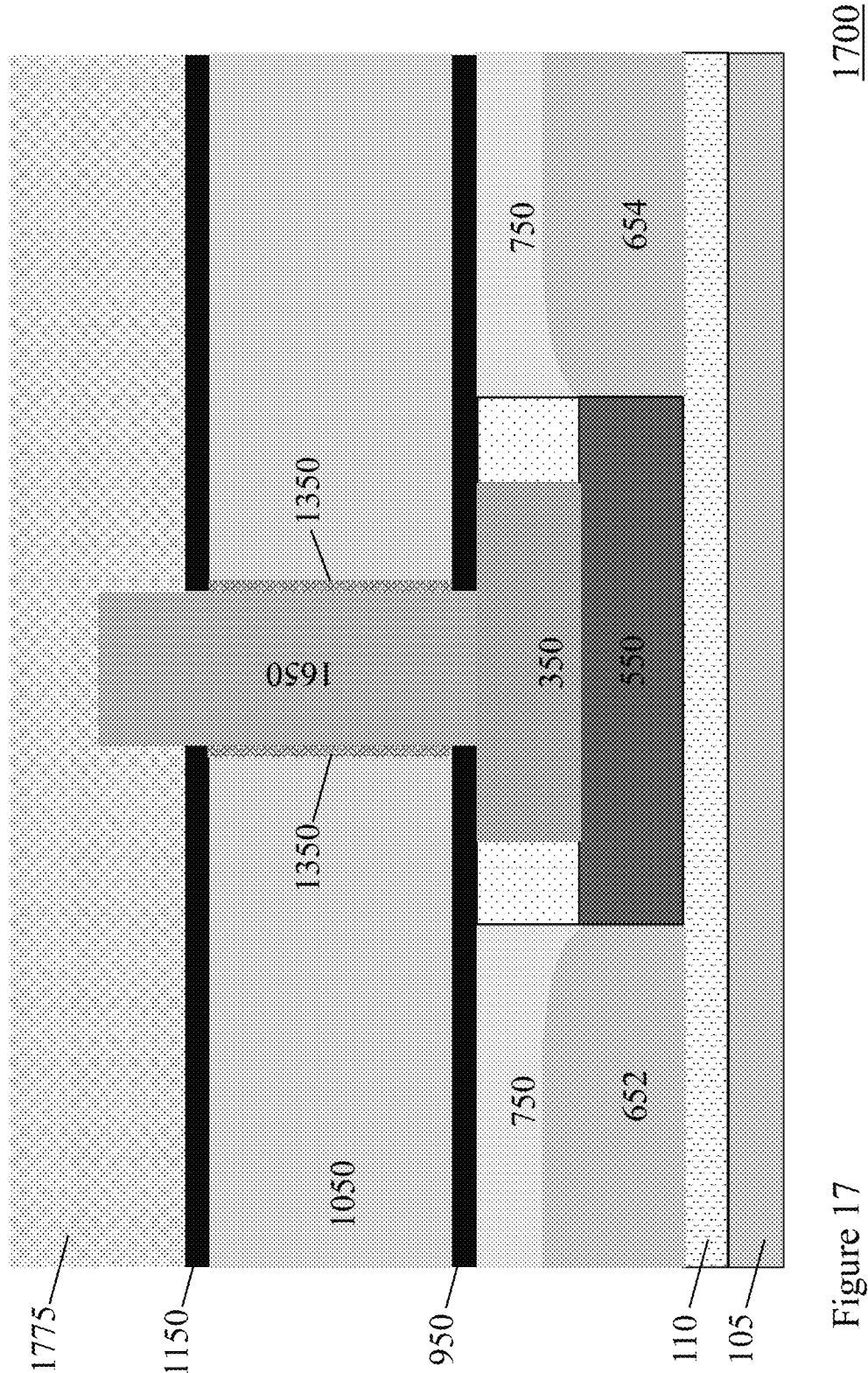
FIG. 17 is a cross section view showing interim structures after deposition of more oxide covers and the vertical base and is planarized, e.g., by a CMP.

FIG. 17 is a cross section view showing interim structures 1700 after deposition of more oxide to cover the surface 1676 of the previous oxide layer 1175 to increase the thickness resulting in a thicker oxide layer 1775. The thicker oxide layer 1775 covers the vertical base 1650 and the surface 1676 of the structure 1600. The thicker oxide layer 1775 is planarized, e.g., by a CMP.

In some embodiments, the oxide deposited is the same material deposited by the same methods as those of the oxide layer 1175.

Figure 18:
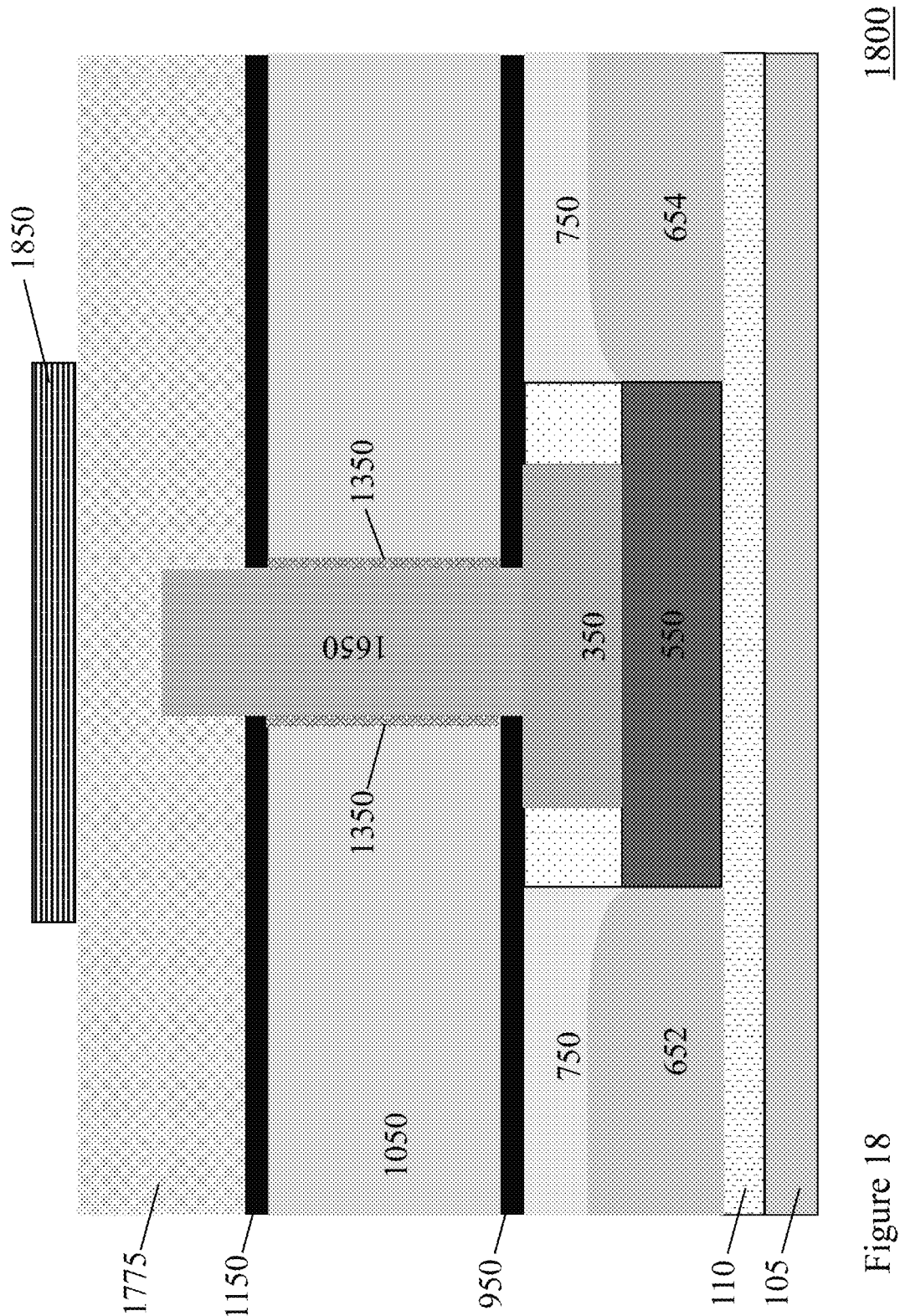
FIG. 18 is a cross section view showing interim structures after deposition of a base region mask on the oxide, where a vertical projection (not shown) of the base region mask overlaps both sides of the horizontal base.

FIG. 18 is a cross section view showing interim structures 1800 after deposition of a base region mask 1850 on the oxide 1775, where a vertical projection of the base region mask overlaps both sides of the horizontal, lateral intrinsic base 550. The base region mask 1850 is made of materials and deposited using methods described above for masks.

In some embodiments, the base region mask 1850 is made from silicon nitride (SiN).

Figure 19:
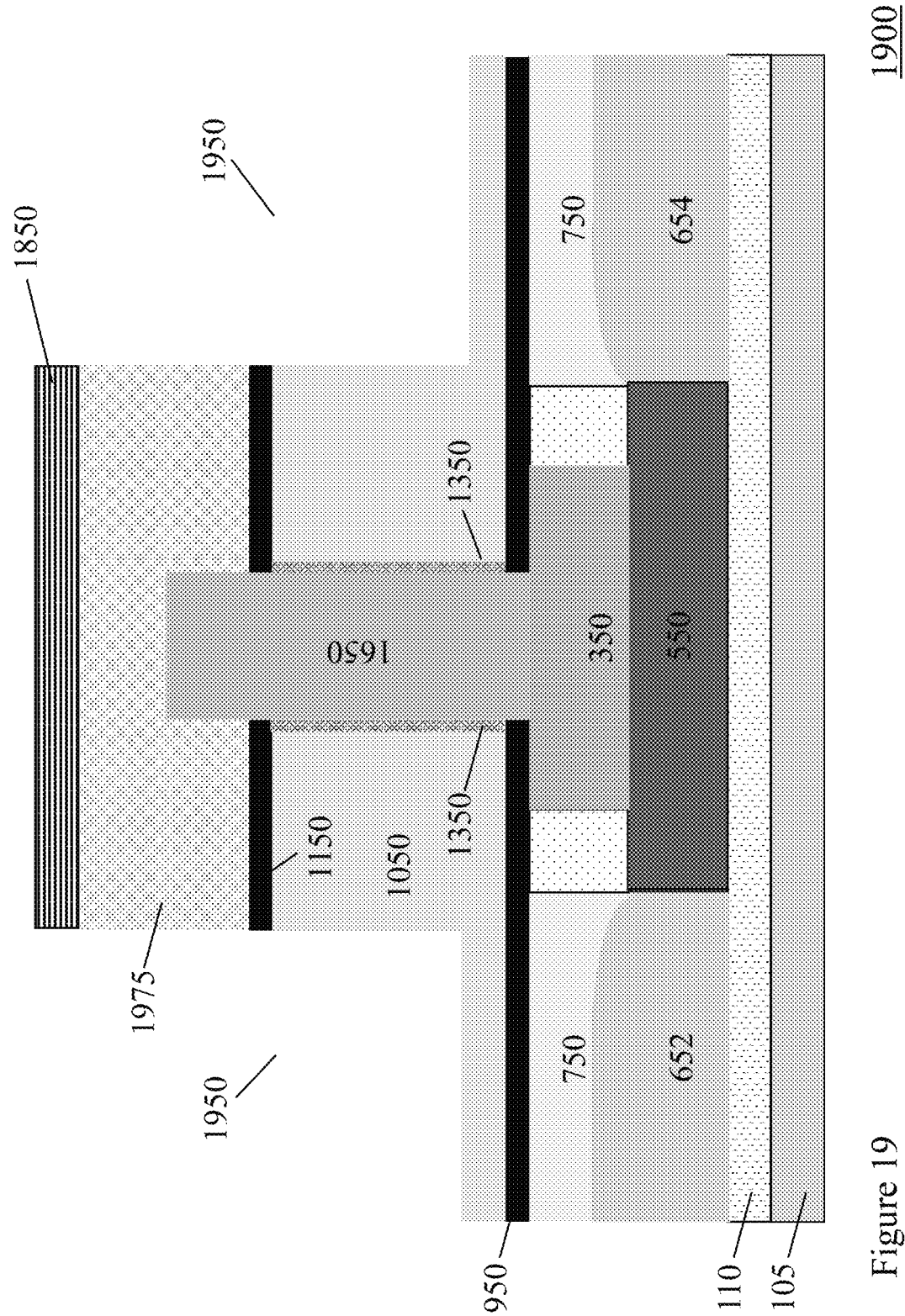
FIG. 19 is a cross section view showing interim structures after an etching step removes the exposed oxide, exposed top spacer, and exposed sacrificial material to just above the bottom spacer.

FIG. 19 is a cross section view showing interim structures 1900 after a vertical etching step (e.g., a RIE) removes the exposed (not covered by the base region mask 1850) parts of the oxide layer 1775, the exposed parts of top spacer 1150, and the exposed parts of the sacrificial placeholder material 1050. In some embodiments, the vertical etch stops in a time (determined experimentally) to leave some of the sacrificial placeholder material 1050 just covering the bottom spacer 950.

The vertical etching leaves void spaces 1950 around the vertical base 1650 and the material in the components 950/1150/1975 encompassing the vertical base 1650. The etched oxide layer 1975 is what remains of the oxide layer 1775 after this vertical etching step.

Figure 20:
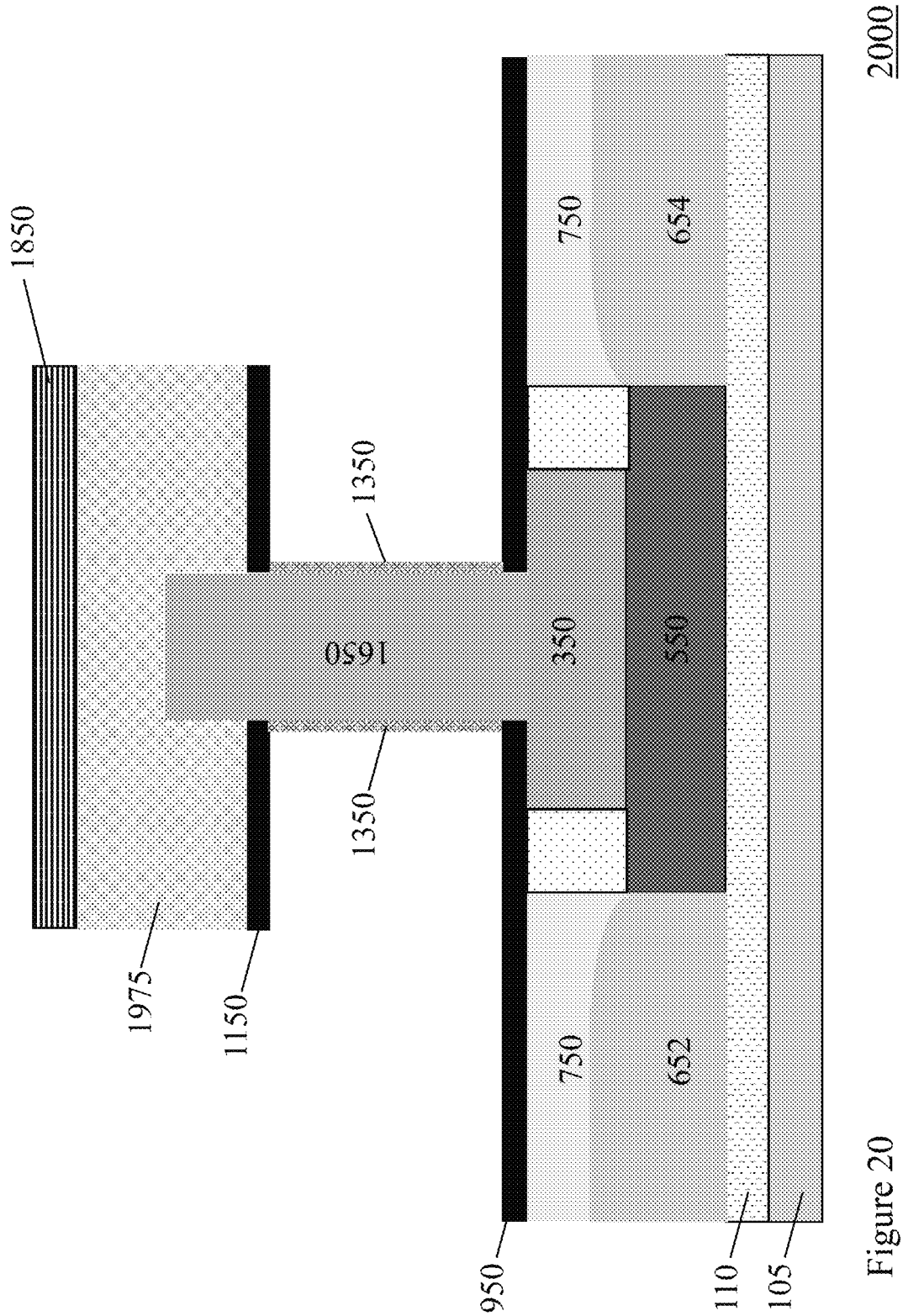
FIG. 20 is a cross section view showing interim structures after remaining sacrificial material is removed.

FIG. 20 is a cross section view showing interim structures 2000 after the remaining sacrificial placeholder material 1050 is removed, exposing the vertical oxide layer 1350 on the sides of the vertical base 1650.

In some embodiments, the sacrificial placeholder material 1050 is amorphous silicon. In some embodiments, this material is removed with a dry etch or exposure to ammonium hydroxide ($NE_4OH$) at higher than room temperature. In some cases, removal is accomplished using a solution of hydrofluoric acid (HF) or a dry chemical oxide etch.

Figure 21:
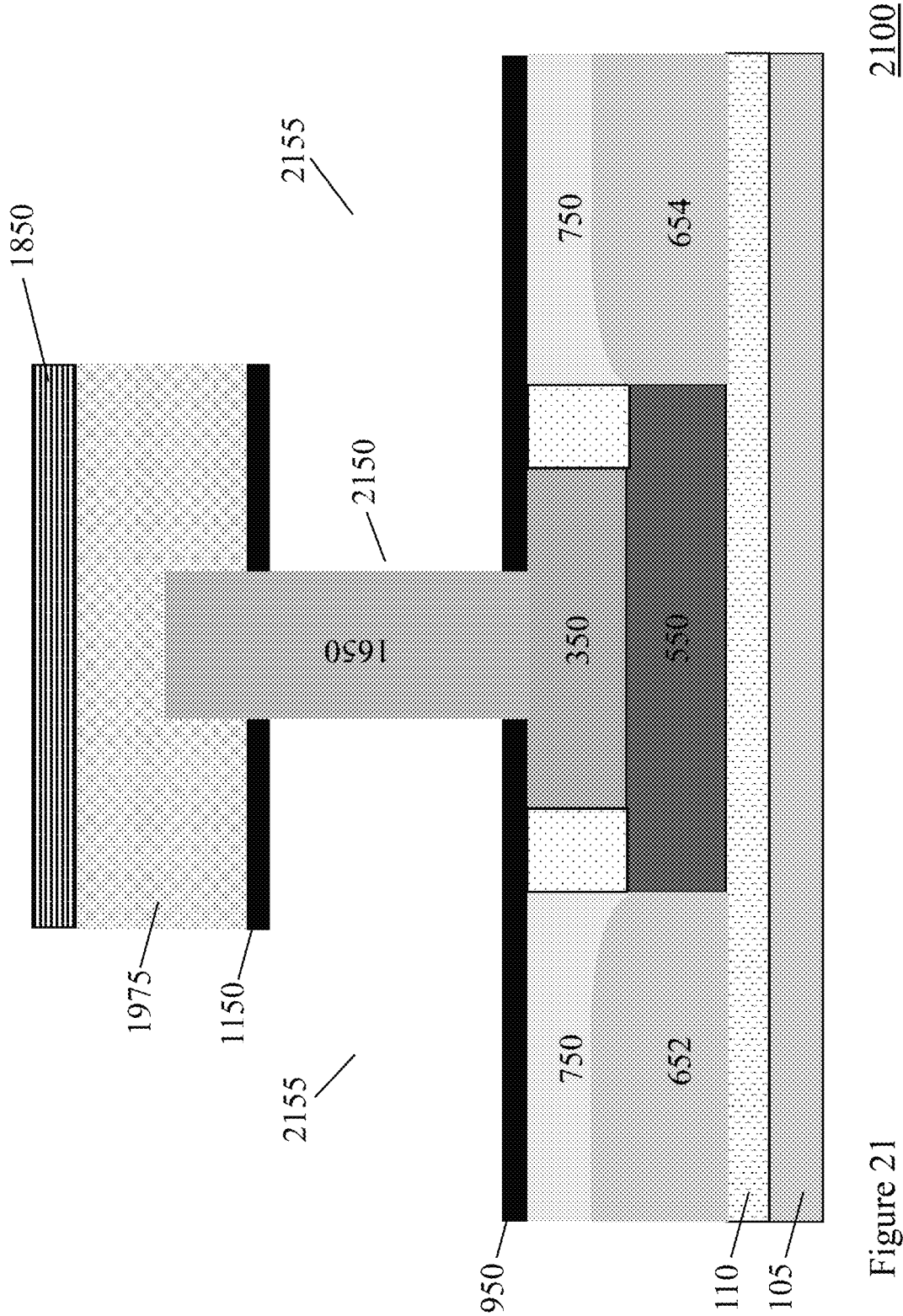
FIG. 21 is a cross section view showing interim structures after removal of the thin, vertical oxide layer on the vertical base.

FIG. 21 is a cross section view showing interim structures 2100 after removal 2150 of the thin, vertical oxide layer 1350 on sides around the vertical base 1650. The removal of the thin, vertical oxide layer 1350 on sides increases the volume of the void spaces 2155 above the bottom spacer 950.

In some embodiments, the vertical oxide layer 1350 is accomplished with exposure to a short HF etch, or by using other known techniques.

Figure 22:
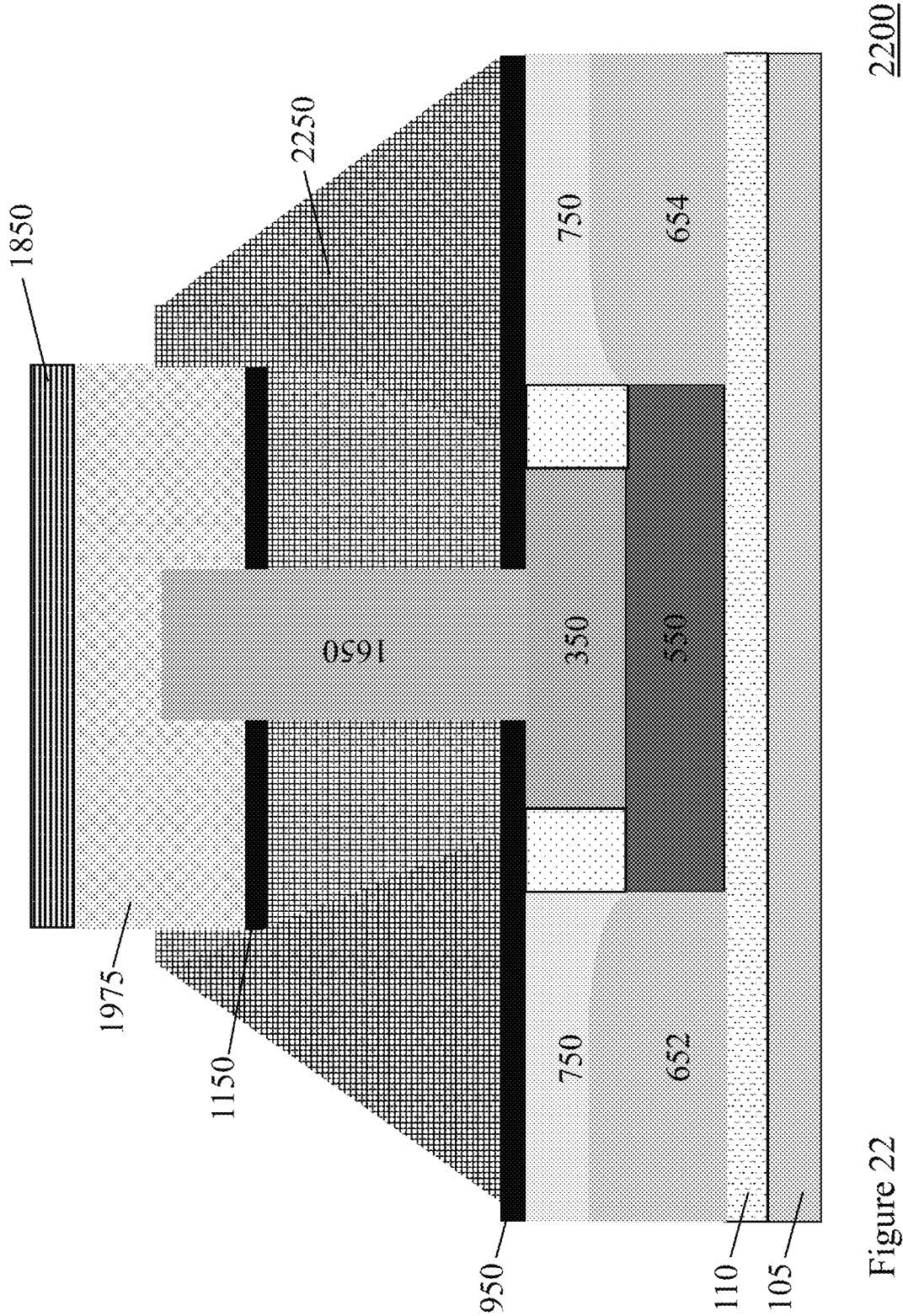
FIG. 22 is a cross section view showing interim structures after growth of a doped extrinsic vertical base material surrounding the vertical base.

FIG. 22 is a cross section view showing interim structures 2200 after growth of a doped extrinsic vertical base material 2250 that surrounds the vertical base 1650.

The extrinsic vertical base material 2250 is a semiconductor material that can epitaxially grow from and surround the vertical base 1650 while filling the void spaces 2155. In some embodiments, the extrinsic vertical base material 2250 can cover the sides of the top spacer 1150 and some or all the sides of the etched oxide layer 1975.

In some embodiments, the extrinsic vertical base material 2250 may be a defective epitaxy. By "defective epitaxy" is mean that the extrinsic vertical base material 2250 may include structural defects such as stacking faults and point defects. It is noted that any of these defects do not propagate into the vertical base 1650 because the vertical base 1650 is used only as a seed layer for epitaxial growth of the extrinsic vertical base material 2250.

Note that defects in the extrinsic vertical base material 2250 are not found to adversely affect the operation or performance of the completed Darlington pair sensor.

Further note that the shape of the extrinsic vertical base material 2250 shown in FIG. 22 is exemplary only.

In some alternative embodiments, the extrinsic vertical base material 2250 can be a large grain polycrystalline silicon (polysilicon). Rather than growing the extrinsic vertical base material 2250 epitaxially, the polysilicon may be deposited by a deposition process including, but not limited to, PVD, CVD, plasma enhanced chemical vapor deposition (PECVD), inductively coupled plasma chemical vapor deposition (ICP CVD), or any combination thereof.

The extrinsic base material 2250 has a same doping polarity as the vertical base 1650, and a higher doping concentration than the vertical base 1650. The doping concentration of the extrinsic base material 2250 may be, for example, in the range of $10^{20}$–$3 \times 10^{21}$ cm$^{-3}$. In some embodiments, the extrinsic base material 2250 has a wider bandgap than the vertical base 1650. As known, this may be advantageous for reducing the base leakage. For example, if the vertical base 1650 is comprised of Ge or SiGe, the extrinsic base 2250 may be comprised of SiGe with higher concentration than that of the vertical base 1650.

Figure 23:
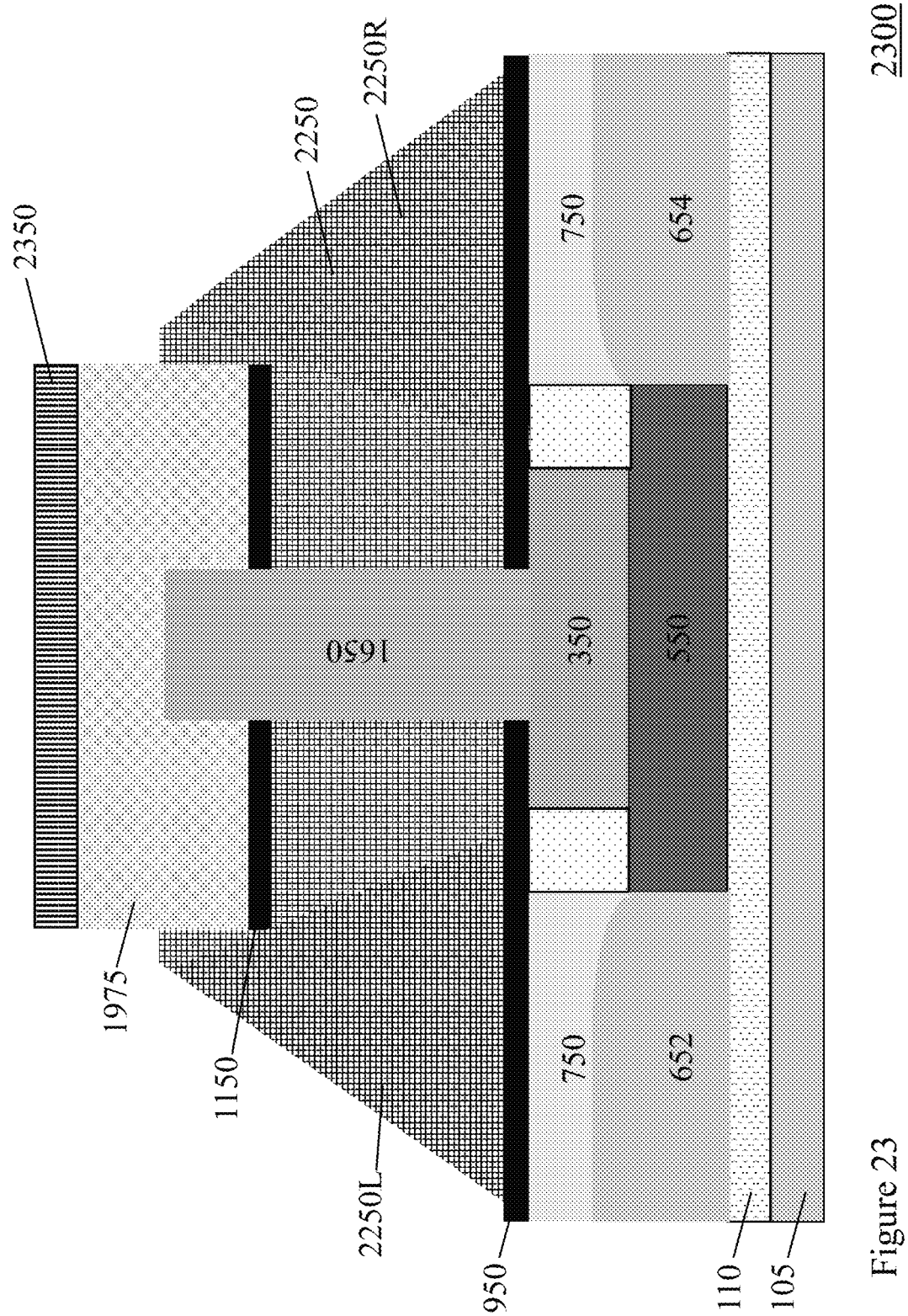
FIG. 23 is a cross section view showing interim structures after removal of the base region mask and deposition of a base separation hard mask, where the base separation hard mask is used to separate a left and a right side of an extrinsic vertical base as described in more detail in the below series of FIGS. 38A, 38B, 39A, 39B, 40A, 40B, 41A, 41B, 42A, and 42B ("separation Figure series").

FIG. 23 is a cross section view showing interim structures 2300 after removal of the base region mask 1850 and deposition of a base separation hard mask 2350. The base separation hard mask 2350 is used to physically separate the left 2250L and a right 2250R sides of the extrinsic vertical base 2250 material, as described in more detail in the below series of FIGS. 38A, 38B, 39A, 39B, 40A, 40B, 41A, 41B, 42A, and 42B ("separation Figure series").

Figure 24:
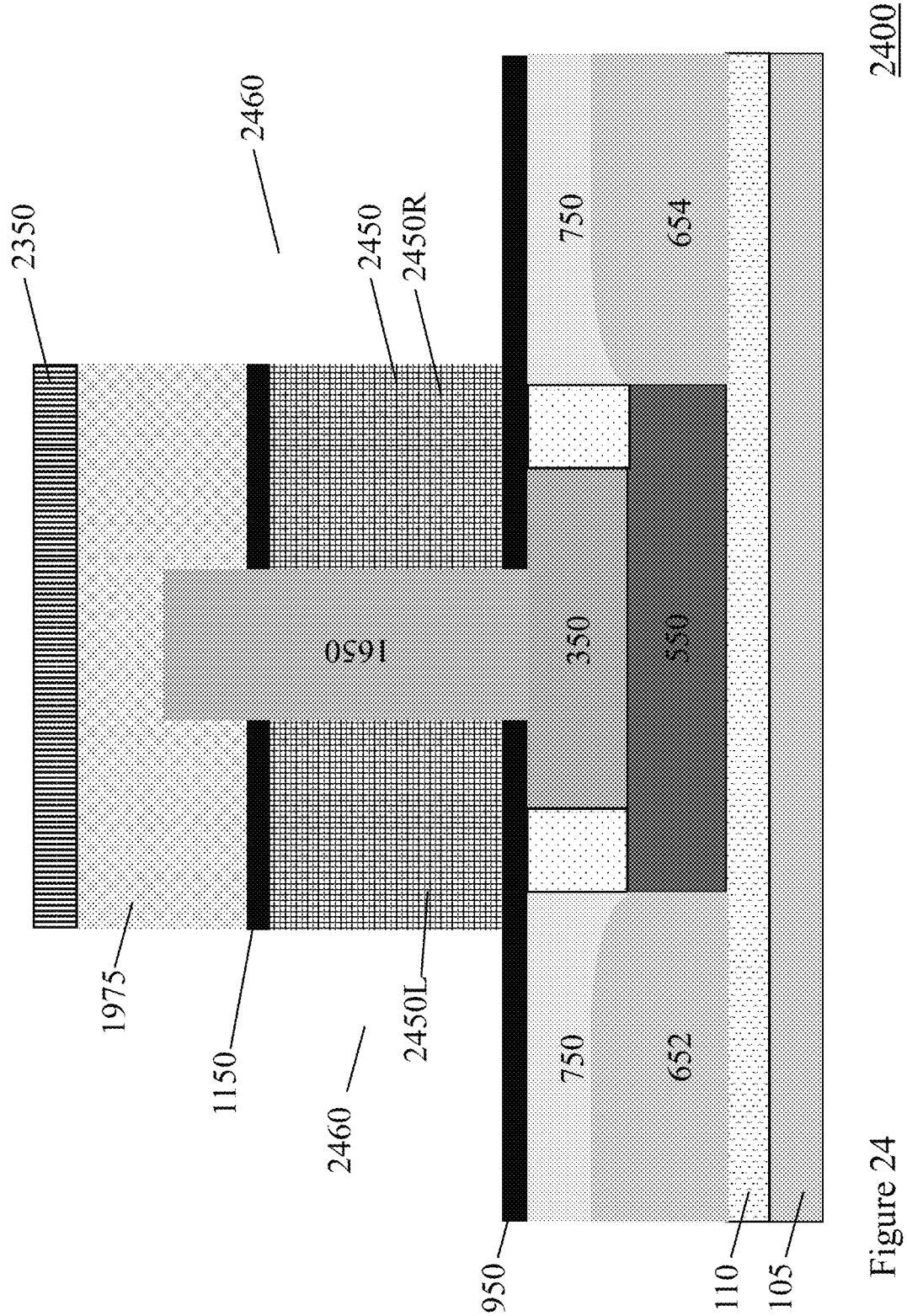
FIG. 24 is a cross section view showing interim structures after the doped extrinsic vertical base material is etched away where not protected by the base separation hard mask, as further described in the separation Figure series.

FIG. 24 is a cross section view showing interim structures 2400 after extrinsic vertical base material 2250 is etched away where not protected (under) by the base separation hard mask 2350, e.g., during a vertical RIE. The extrinsic vertical base material 2250 remaining forms an extrinsic vertical base 2450 that has a left 2450L and right 2450R side that are electrically and physically separated from one another. The process of physically separating the extrinsic vertical base 2450 into the left 2450L and right 2450R sides is further described in the separation Figure series, below.

For instance, as described below, some extrinsic vertical base material 2250 is etched away to expose the ends of the vertical base 1650 in directions in and out of FIG. 24 so that the left 2450L and right 2450R side of the vertical base 2450 remaining after the vertical etch are physically separated.

In some embodiments, the left 2450L and right 2450R side of the vertical base 2450 are physically separated by the vertical base 1650. The left extrinsic vertical base 2450L is in contact with a left side of the vertical base 1650 and the right extrinsic vertical base 2450R is in contact with a right side of the vertical base 1650.

The vertical etch/RIE leaves spatial voids 2460 above the bottom spacer 950 and surrounding the remaining etched oxide layer 1975, top spacer 1150, and extrinsic vertical base 2450.

Figure 25:
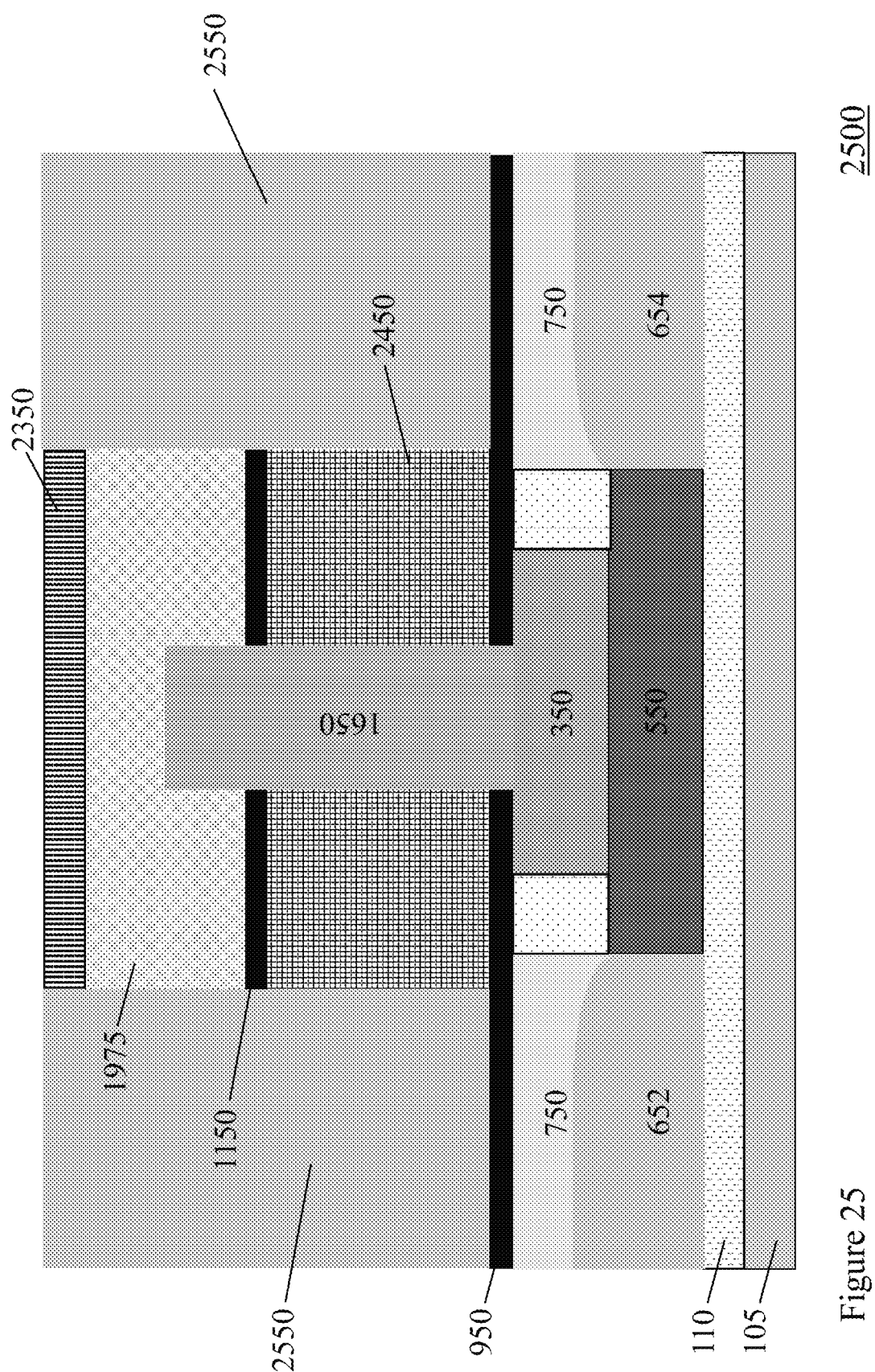
FIG. 25 is a cross section view showing interim structures after filling the structure spaces/voids with interlayer dielectric (ILD).

FIG. 25 is a cross section view showing interim structures 2500 after filling the spatial voids 2460 with interlayer dielectric (ILD) 2550 using materials and deposition methods described above.

Figure 26:
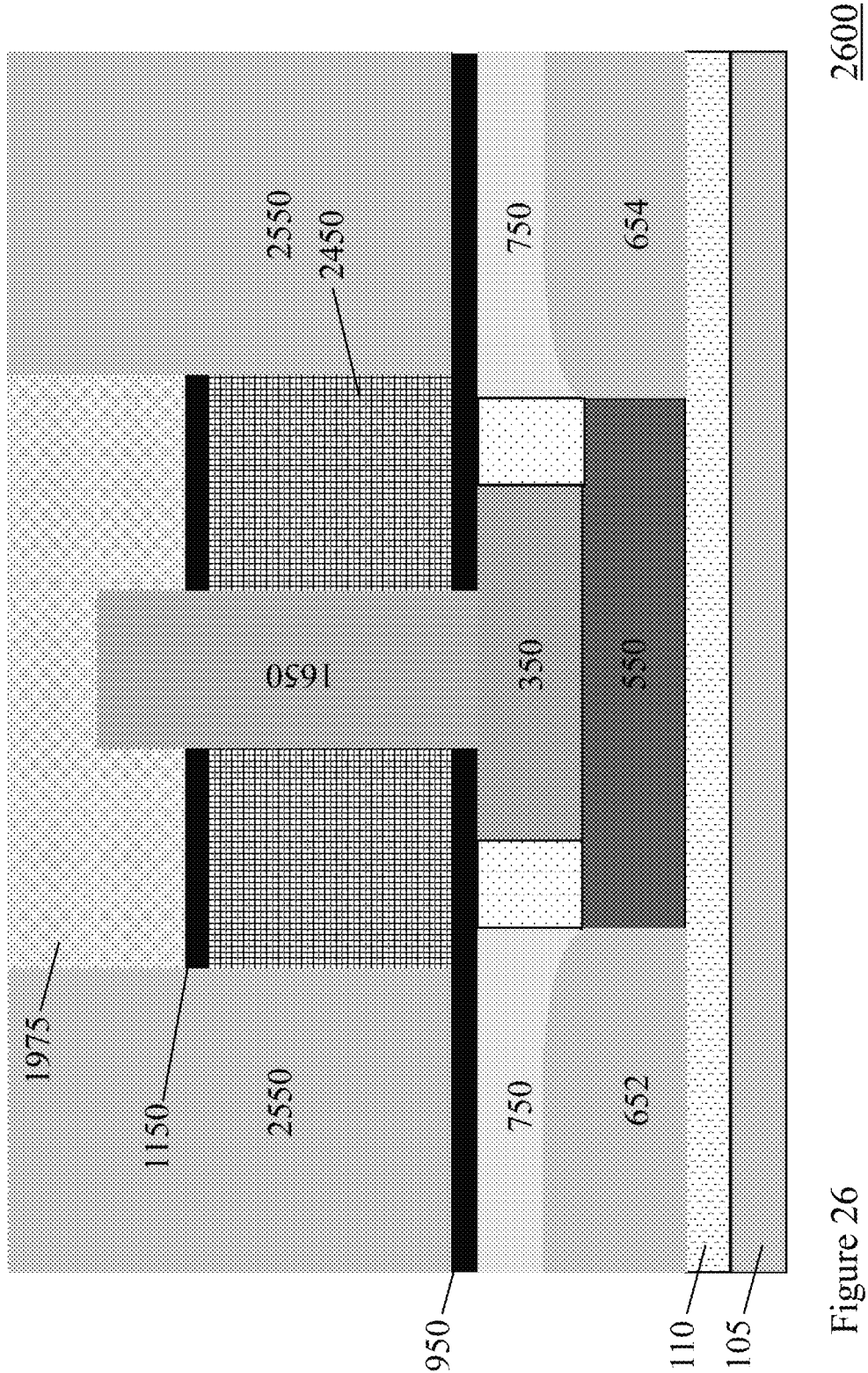
FIG. 26 is a cross section view showing interim structures after removal of the base separation hard mask and a planarization/CMP.

FIG. 26 is a cross section view showing interim structures 2600 after removal of the base separation hard mask 2350 and a planarization/CMP that makes the tops of the etched oxide layer 1975 and the ILD 2550 level.

Figure 27:
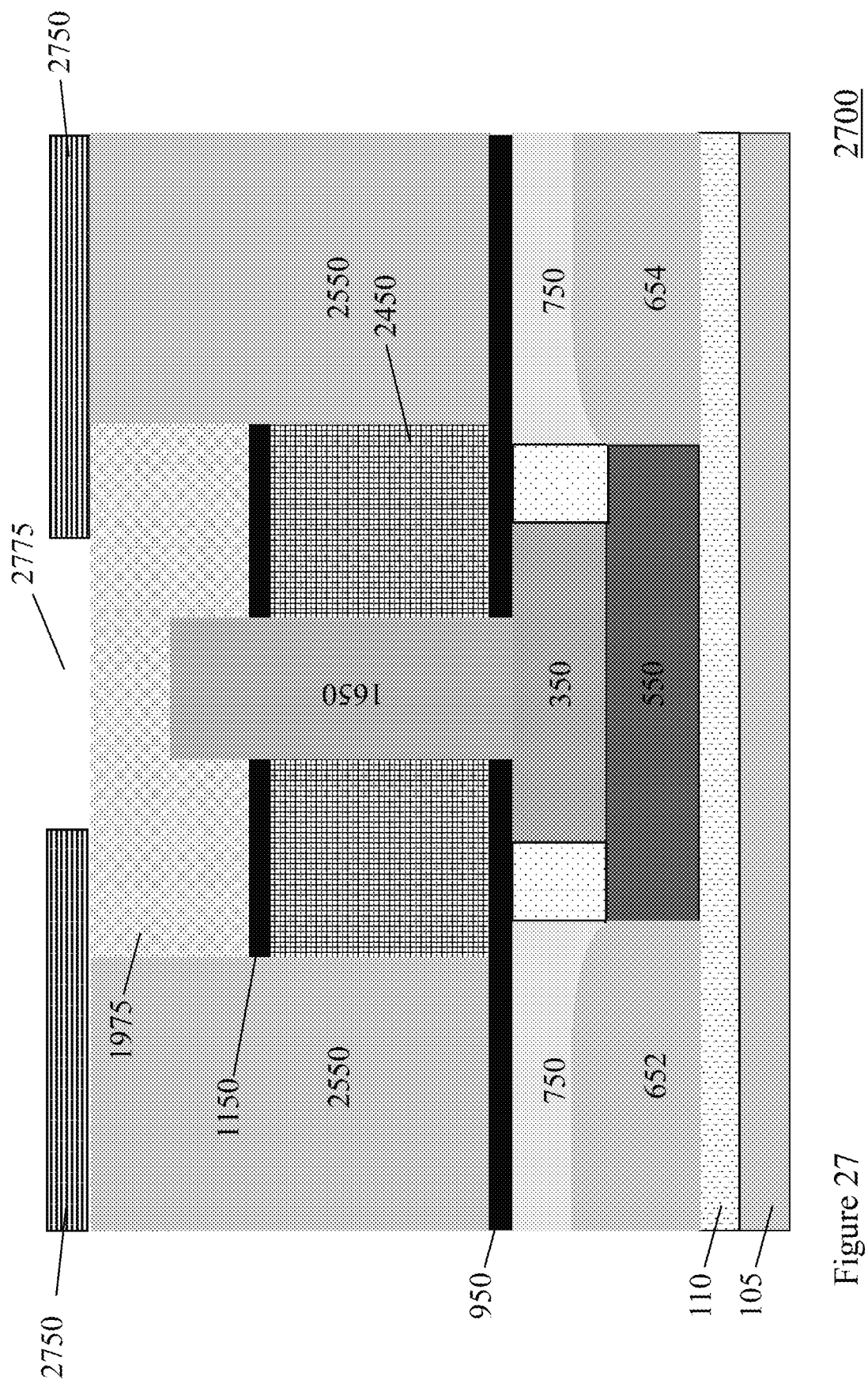
FIG. 27 is a cross section view showing interim structures after deposition of an emitter mask.

FIG. 27 is a cross section view showing interim structures 2700 after deposition of an emitter mask 2750 with a pattern deposition or deposition followed by patterning that positions a mask opening 2775 over the vertical base 1650. The emitter mask 2750 uses mask materials and is deposited by deposition methods that are described above and are well known.

Figure 28:
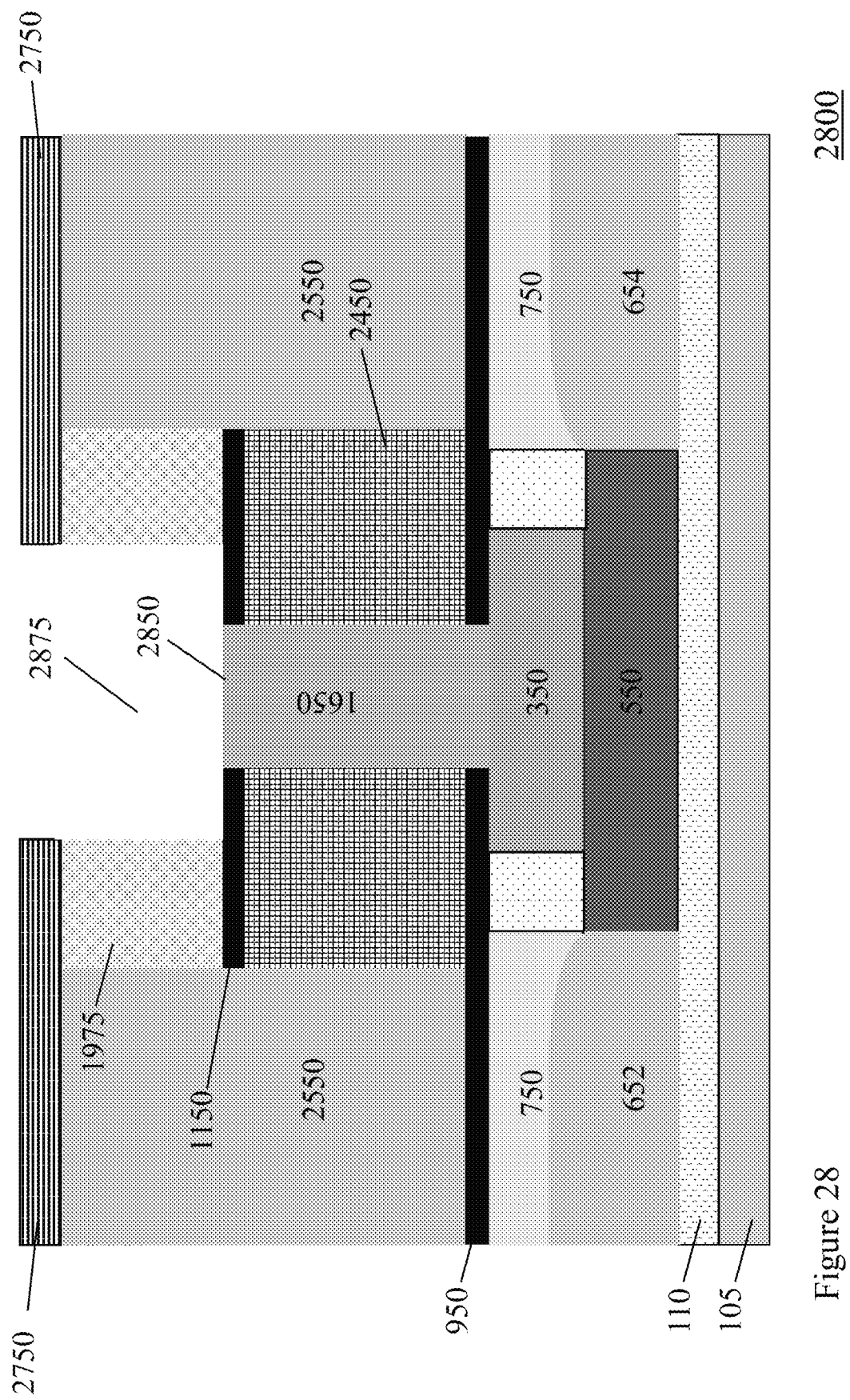
FIG. 28 is a cross section view showing interim structures after recessing the unprotected oxide and the top of the vertical base and exposing an exposed top surface of the vertical base.

FIG. 28 is a cross section view showing interim structures 2800 after recessing the unprotected part of the etched oxide layer 1975 and exposing the top surface 2850 of the vertical base 1650. The etched oxide layer 1975 recess can be performed by a direction RIE, e.g., that is selective to the material in the top spacer 1150. The recess leaves a spatial void 2875 above the top surface 2850 of the vertical base 1650.

Figure 29:
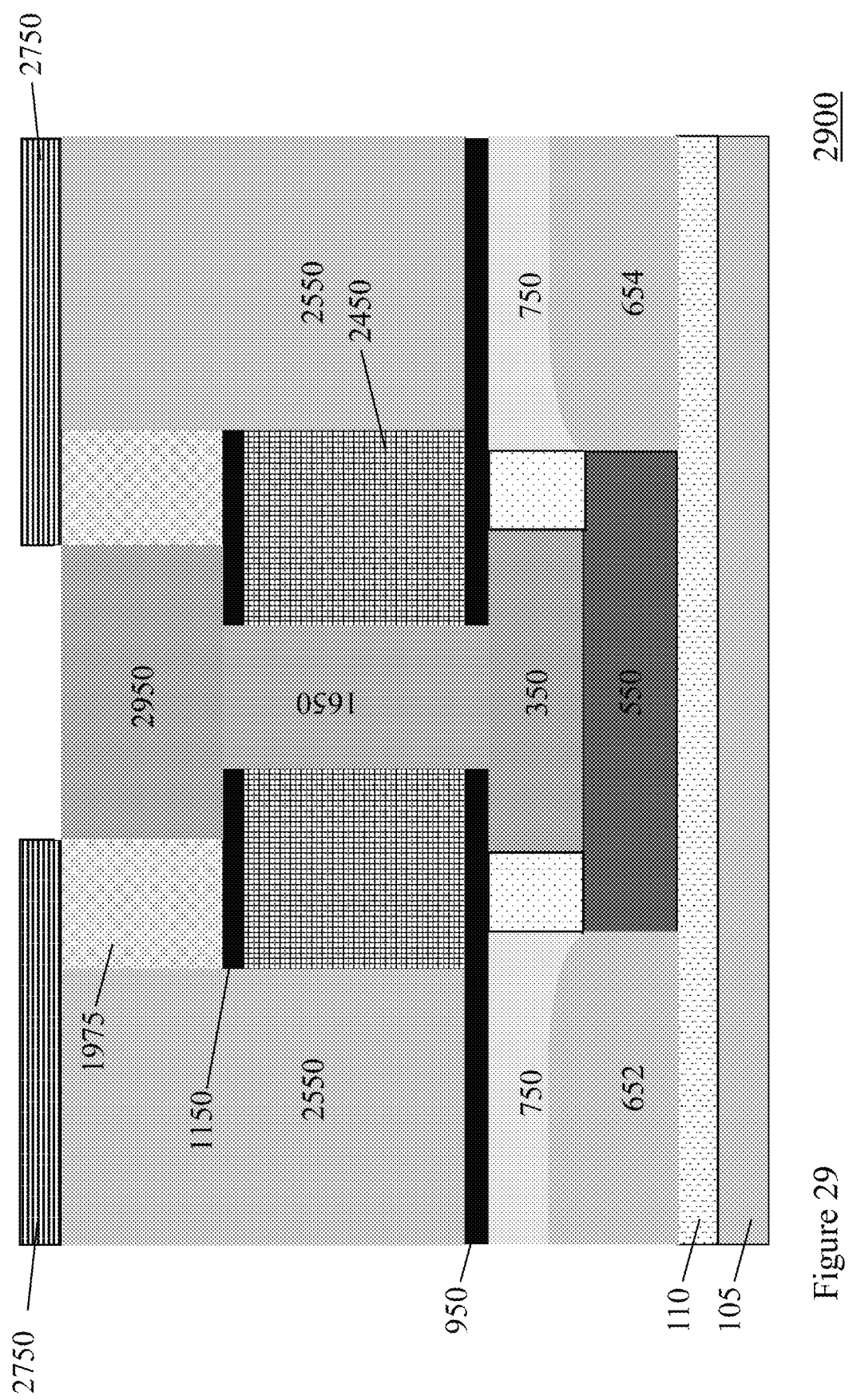
FIG. 29 is a cross section view showing interim structures after growth of the vertical emitter on the exposed top surface of the vertical base, resulting in the formation of the vertical BJT part of the Darlington pair BJT sensor.

FIG. 29 is a cross section view showing interim structures 2900 filing the spatial void 2875 by epitaxially growing of the vertical emitter 2950 on the exposed top surface 2850 of the vertical base 1650, resulting in formation of the vertical/sensing/dual-base BJT 350/1650/2950/2450 of the Darlington pair BJT sensor.

The vertical emitter material 2950 (or a top portion of the vertical emitter material 2950) may be made of a defective epitaxy. It is noted that any of these defects do not propagate into the vertical base 1650 because the vertical base 1650 is used only as a seed layer for epitaxial growth of the vertical emitter material 2950.

Note these defects in the extrinsic vertical emitter material 2950 are not found to adversely affect the operation or performance of the completed Darlington pair sensor.

Where the vertical/sensing BJT 350/1650/2950/2450 is a PNP type, the vertical emitter material 2950 is P-doped. Where the vertical/sensing BJT 350/1650/2950/2450 is a NPN type, the vertical emitter material 2950 is N-doped. The doping is done by techniques described above that are known.

In alternative embodiments, the vertical emitter material 2950 is a large grain polycrystalline silicon (polysilicon). Rather than growing the vertical emitter material 2950 epitaxially, the polysilicon may be deposited in the spatial void 2875 by a deposition process including, but not limited to, PVD, CVD, plasma enhanced chemical vapor deposition (PECVD), inductively coupled plasma chemical vapor deposition (ICP CVD), or any combination thereof.

The vertical emitter material 2950 may have a doping concentration, for example, in the range of $10^{20}$–$3\times10^{21}$ cm$^{-3}$. In some embodiments, a bottom portion of the vertical emitter material 2950 may have a relatively lower doping concentration, for example, in the range of $10^{19}$–$10^{20}$ cm$^{-3}$. As known, the lower doping of the bottom portion may be advantageous in reducing bandgap narrowing, as well as Auger recombination. In some embodiments, the vertical emitter material 2950 has a wider bandgap than the vertical base 1650. As known, this may be advantageous in increasing the emitter transfer ratio and therefore the BJT gain. For example, if the vertical base 1650 is comprised of Ge or SiGe, the vertical emitter 2950 may be comprised of SiGe with higher concentration than that of the vertical base 1650.

Figure 30:
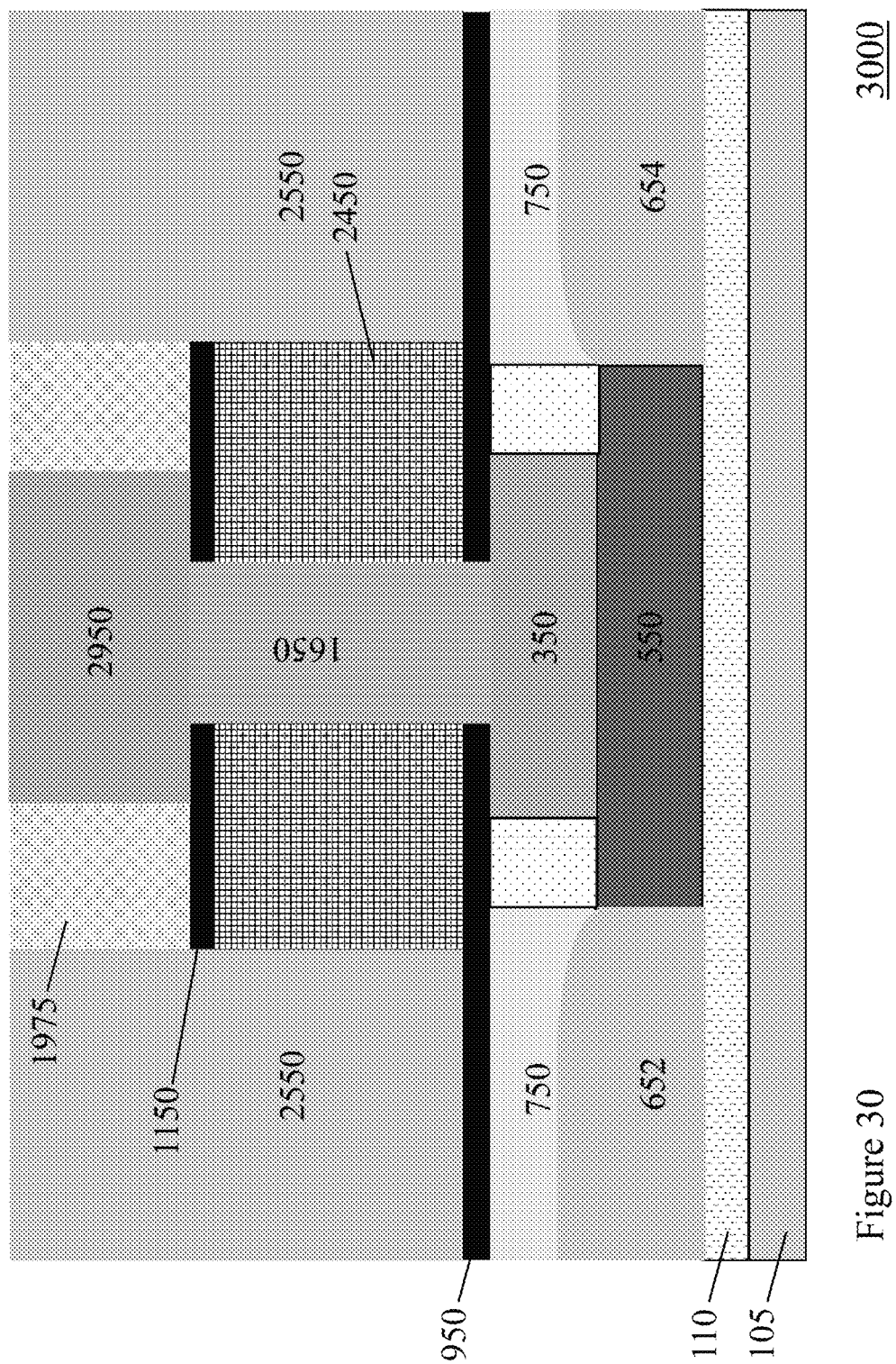
FIG. 30 is a cross section view showing interim structures after removing the emitter mask and performing an optional CMP.

FIG. 30 is a cross section view showing interim structures 3000 after removing the emitter mask 2750 by a CMP. Alternatively, the emitter mask 2750 can selectively be removed by a known selective etch followed with an optional CMP.

Figure 31:
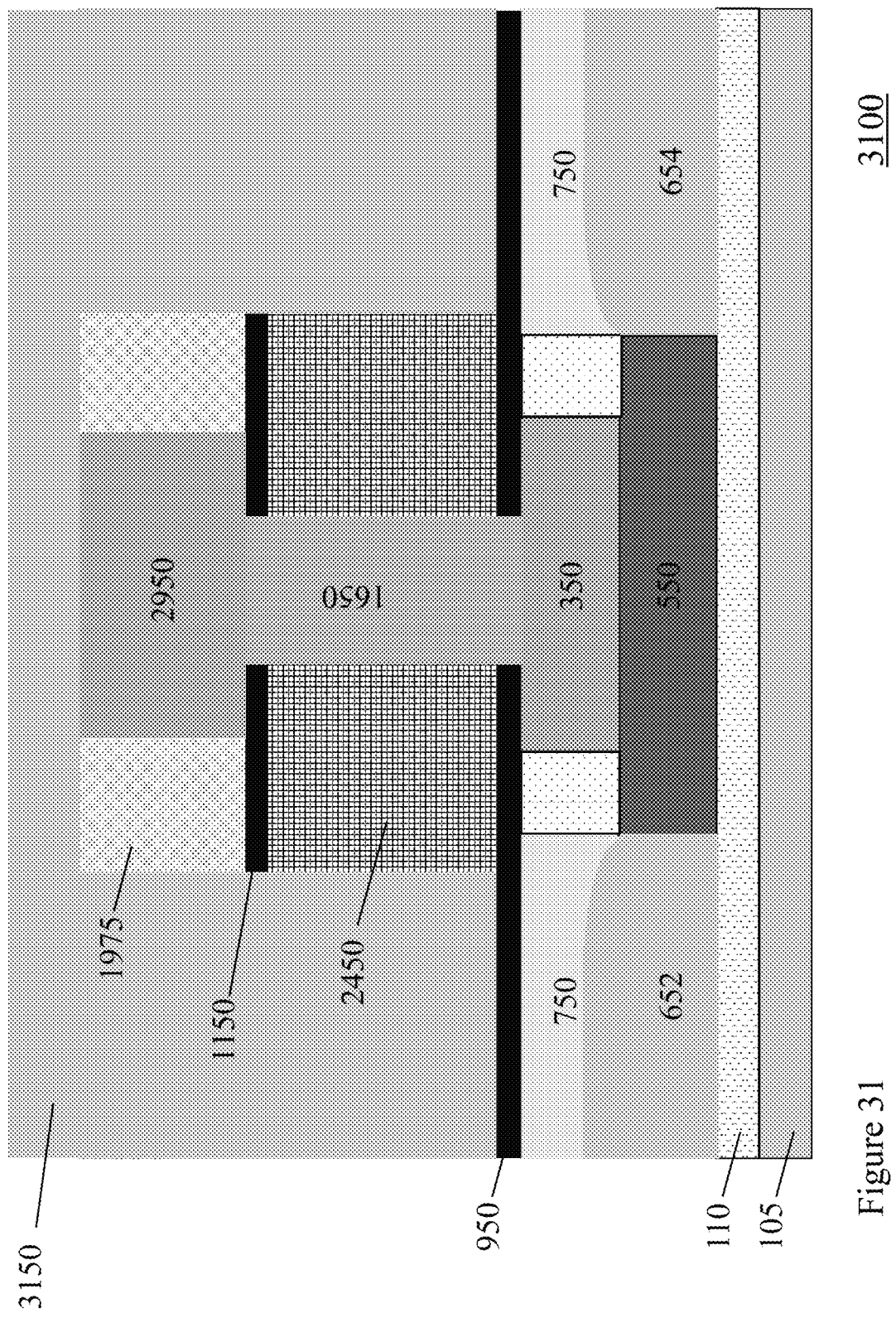
FIG. 31 is a cross section view showing interim structures after an ILD covers the vertical/sensor BJT part of the Darlington pair BJT sensor as well as filling structure spaces, followed by a CMP.

FIG. 31 is a cross section view showing interim structures 3100 after an ILD deposition 3150 covers the vertical/sensing BJT of the Darlington pair BJT sensor (including the vertical emitter 2950) above the lower spacer 950. An optional CMP may follow the ILD deposition. The ILD 3150 materials and deposition methods are as described above.

Figure 32:
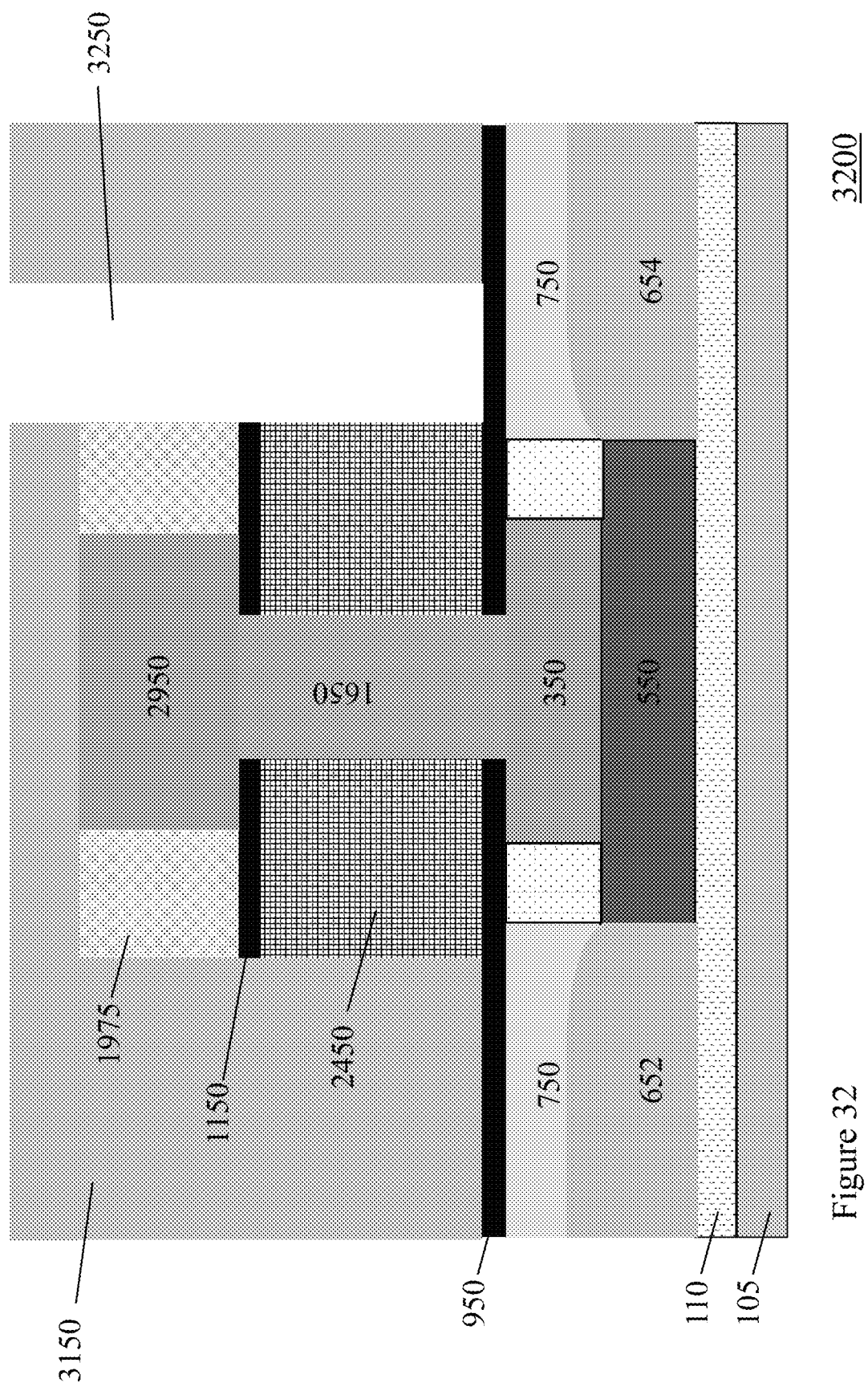
FIG. 32 is a cross section view showing interim structures after a masked etching forms a sensing trench.

FIG. 32 is a cross section view showing interim structures 3200 after a masked etching forms a sensing trench 3250. For example, the masked etching chemistries removes exposed ILD 3250 material and is selective to the bottom spacer 950 material. The width of the sensing trench 3250 may be in the range of 10 nm-1 μm, but narrower and wider sensing trenches may be used as well.

Figure 33:
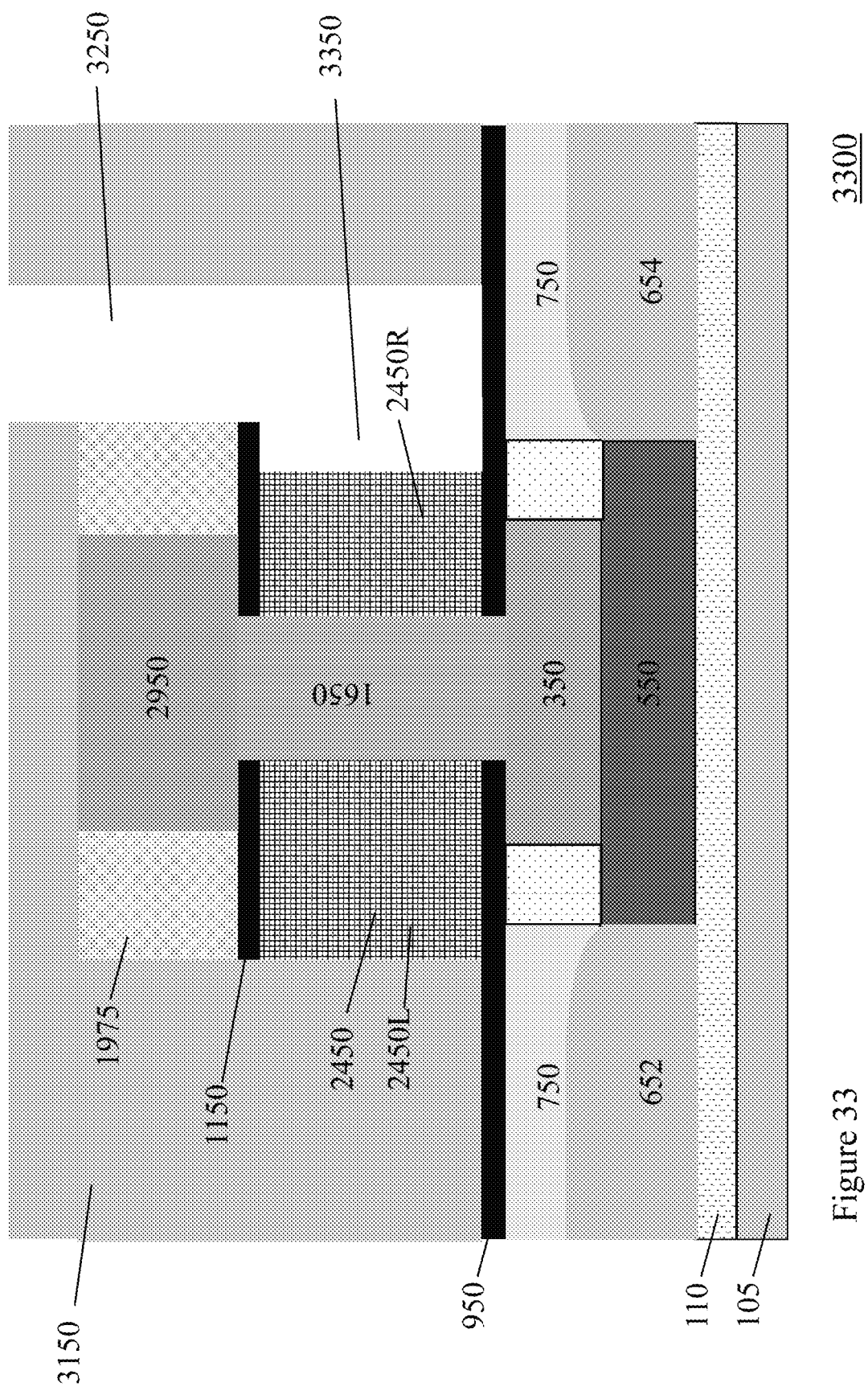
FIG. 33 is a cross section view showing interim structures after a lateral etch of a separated sensing side of the doped extrinsic vertical base material, creating a sense contact void.

FIG. 33 is a cross section view showing interim structures 3300 after a lateral etch of one of the separated sensing sides (here the right side 2450R) of the doped extrinsic vertical base material 2450 creating a sense contact void 3350 in contact with the sensing trench 3250.

The lateral etch is performed to remove material from the extrinsic vertical base 2450 on the extrinsic vertical base 2450 side (left 2450L or right 2450R) that are in contact with the sensing trench 3250. The lateral etch creates the sense contact void 3350 in the side 2450L/2450R of the extrinsic vertical base 2450 in contact with the sensing trench 3250 so that fluid (e.g., liquid and/or gas) entering the sensing trench 3250 will contact the side 2450L/2450R of the extrinsic vertical base 2450 in contact with the sensing trench 3250.

In some embodiments, the sense contact void 3350 is etched away to a depth into the extrinsic vertical base 2450 material from 10 to 50 nm. Other depths are envisioned.

Therefore, the sensing trench 3250 is in fluid communication with the sense contact void 3350 in that any fluid within the sensing trench 3250 will be in contact with the respective separated side 2450L/2450R (the side is 2450R shown in FIG. 33) of the extrinsic vertical base 2450.

The lateral etch that removes material from the exposed side of the extrinsic base 2450 can be a wet etch or a gaseous etch. However, a wet etch is more preferred.

Figure 34:
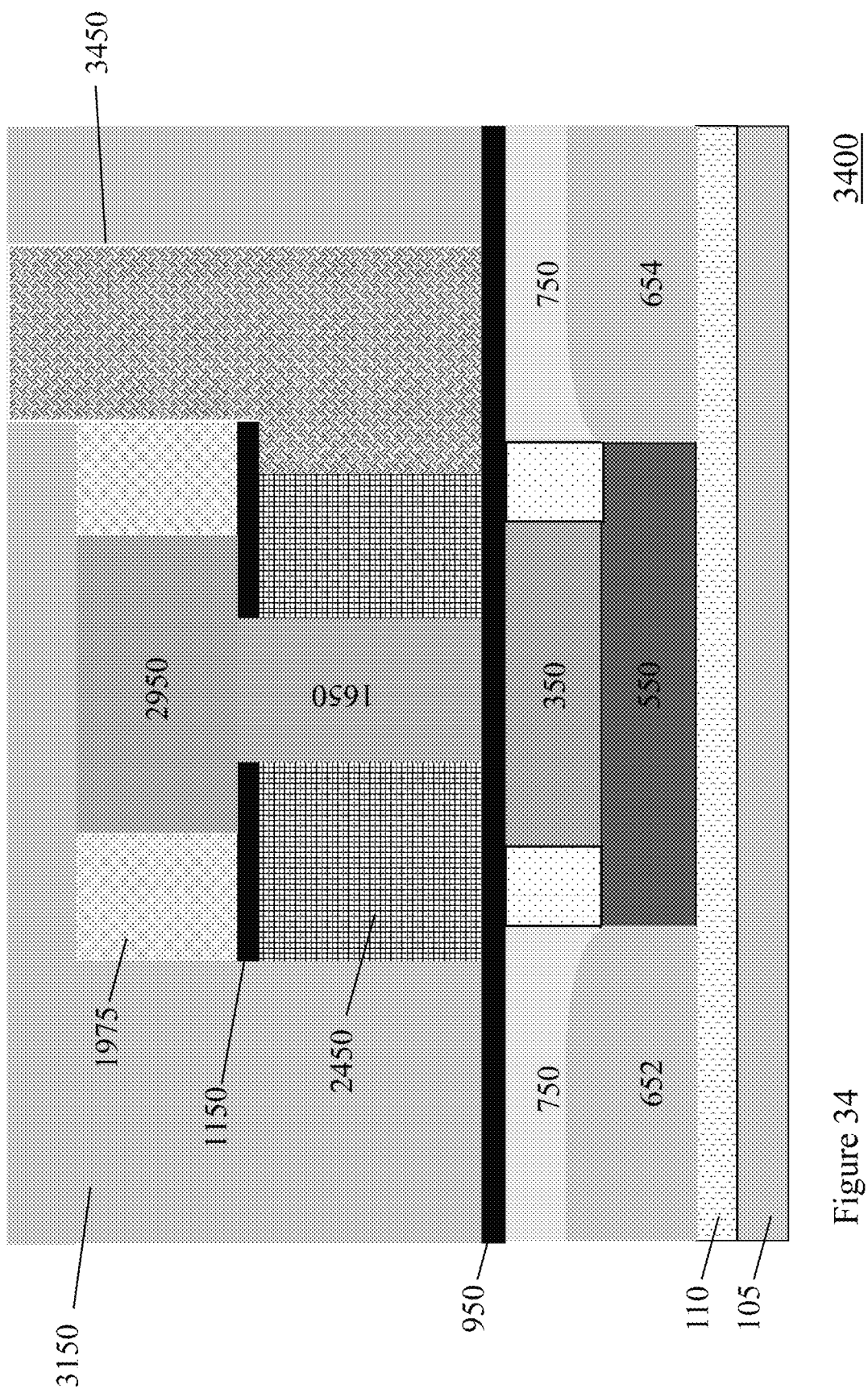
FIG. 34 is a cross section view showing interim structures after the sensing trench and sense contact void are filled with metal, i.e., sensing trench metal fill.

FIG. 34 is a cross section view showing interim structures 3400 after the sensing trench 3250 and sense contact void 3350 are filled with a trench fill material 3450, like metal.

The sensing trench 3250 and sense contact void 3350 can be filled with a ALD deposition of metal or other trench fill material 3450. Alternatively, the sensing trench 3250 and sense contact void 3350 are lined with a layer of metal or other conductive material, e.g., with an ALD deposition. Then the remainder of the sensing trench 3250 and sense contact void 3350 are filled with deposition of metal or other conductive material by as process such as CVD or PVD or plating. In some embodiments, the sensing trench 3250 and sense contact void 3350 are filled or lined with a semiconducting or an insulating material such as a high-k dielectric, instead of a metal or a conductive material.

In some embodiments, the trench fill 3450 is Titanium nitride (TiN). However, other fill materials are envisioned. For example, the trench fill material 3450 can be chosen because of a chemical and/or electrical reaction to a specific fluid or sensed substance that is to be sensed in the sensing trench 3250, as described in more detail below.

Figure 35:
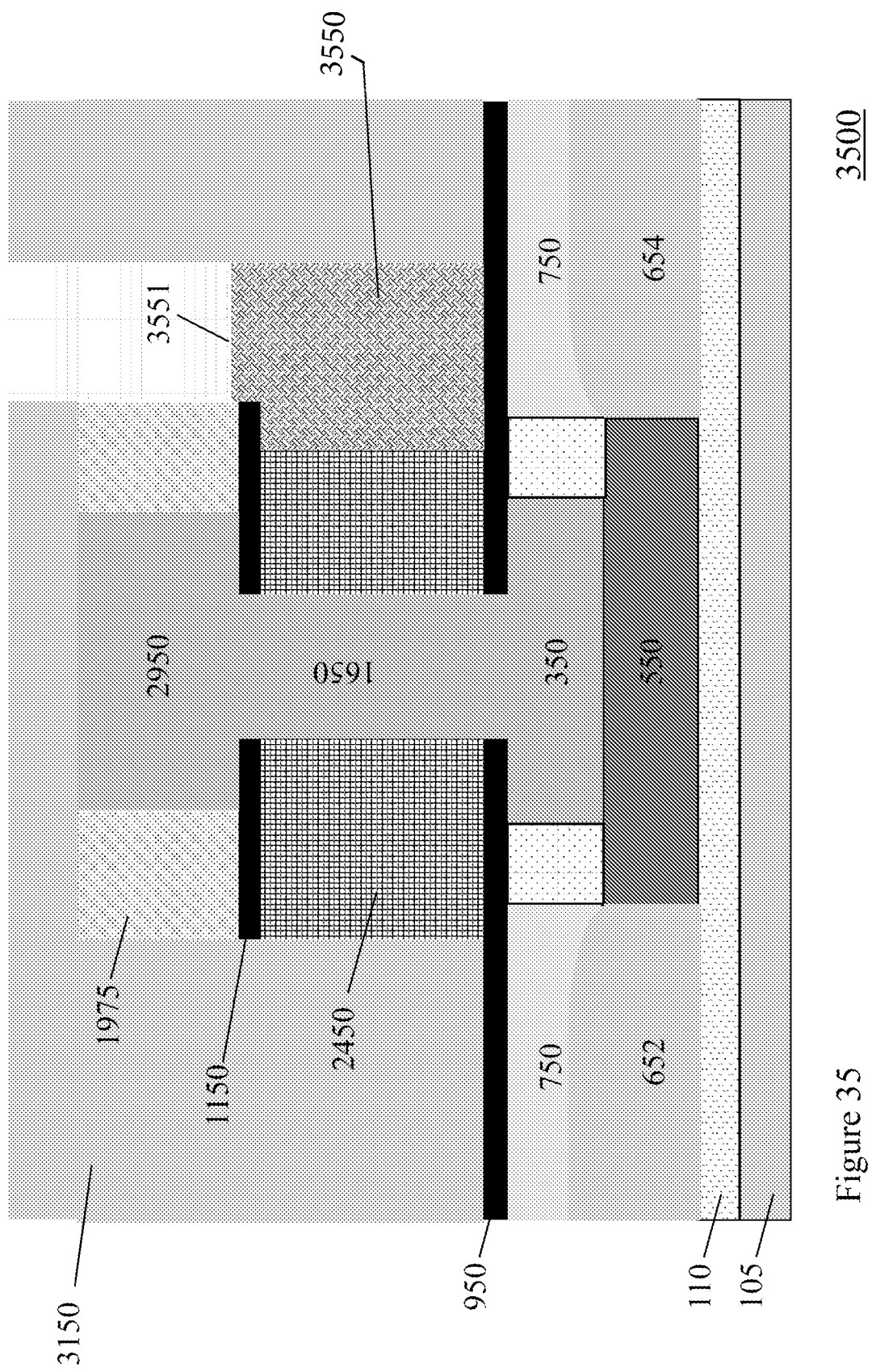
FIG. 35 is a cross section view showing interim structures after the sensing trench metal fill is partially etched.

FIG. 35 is a cross section view showing interim structures 3500 after some of the trench fill material 3450 in the trench is partially etched to form an etched back trench fill 3550.

In some embodiments, the trench metal etch back is performed by a timed wet etch with a chemistry that removes some of the trench fill material 3450. The timing of the wet etch may be experimentally determined. In alternative embodiments, a vertical RIE is used to remove all the metal in the sensing trench in one operation. The etched back trench fill 3550 may be chosen to be metal/substance specific to the sensed material.

Figure 36:
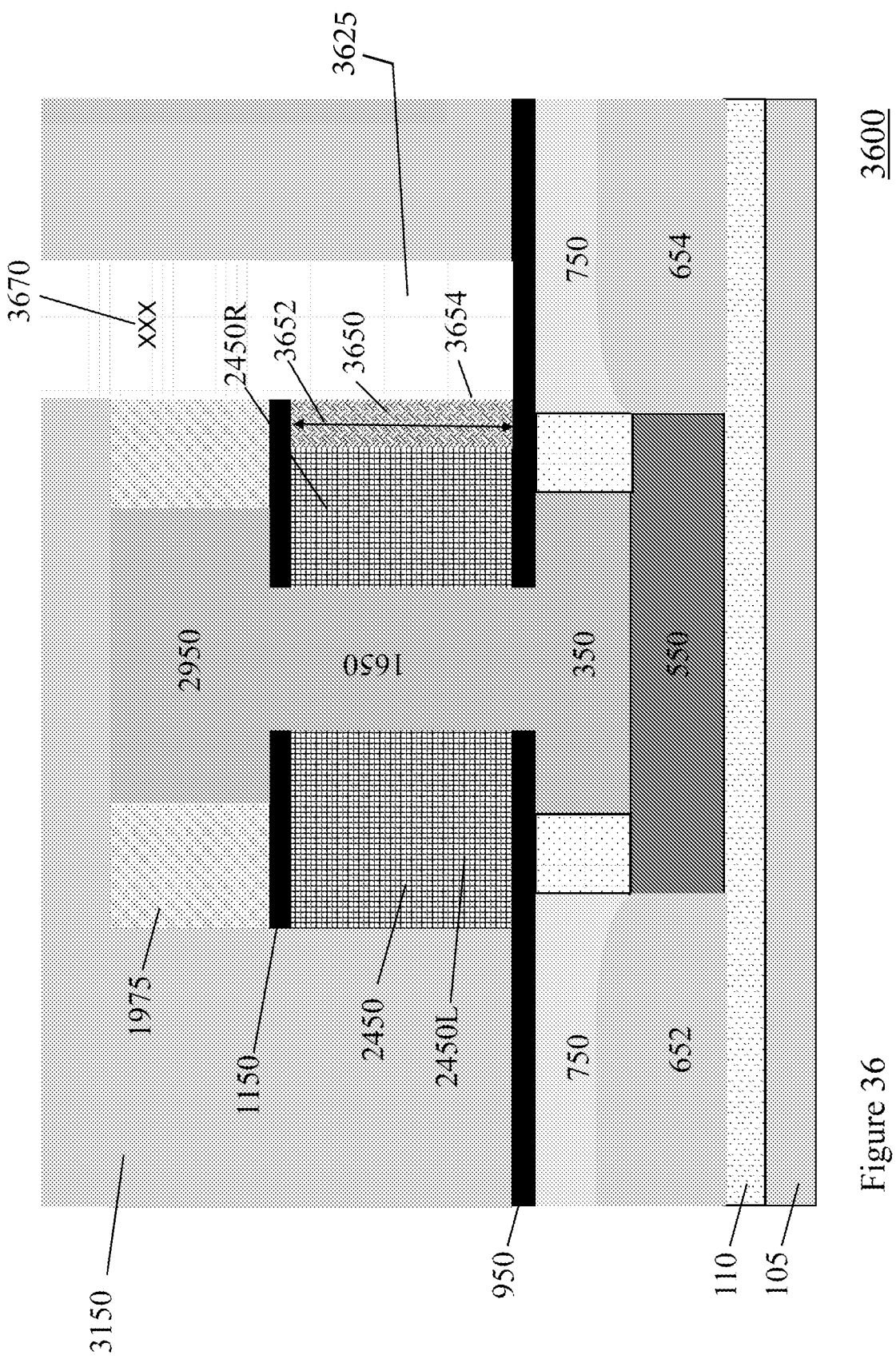
FIG. 36 is a cross section view showing interim structures after removing the remaining metal fill while leaving a metal sliver sensing surface.

FIG. 36 is a cross section view showing interim structures 3600 after removing the remaining etched back trench fill 3550 while leaving a sliver sensing surface 3650. In some embodiments, the sliver sensing surface 3650 remains in the sense contact void 3350 and in electrical and physical contact with the side of the 2450L/2450R (2450R is shown in FIG. 36 as a non-limiting example) of the vertical extrinsic base 2450 adjacent to the sensing trench 3625/3250.

The remaining etched back trench fill 3550 is removed with a directional RIE. Therefore, the sensing trench 3625/3250 is re-opened to create an open space to receive fluids (liquid or gas), e.g., containing sensed substances 3670.

The sliver sensing surface 3650 can have a sensing surface height 3652 between, for example 50 nm and 1 μm, and a sensing surface area 3654. In some embodiments, the sensing surface area 3654 is approximately equal to the sensing surface height 3652 times the depth (in the direction in or out of FIG. 36) of the sensing trench 3250/3625. A larger sensing surface area 3654 will increase the sensitive of the Darlington pair sensor to sensed substances 3670 located in the sensing trench 3250/3625. In some embodiments, note that the sensing surface area 3654 may not be a flat surface but might be convex due to the directional RIE.

Sensed substances 3670 (shown as "xxx") can include molecules and/or ions of material that are located within the sensing trench 3250/3625, e.g., in suspension and/or in solution in a fluid (liquid and/or gas) in the sensing trench 3250/3625.

Accordingly, in some embodiments, the trench metal fill material 3450 determines the type of metal/conductive material making up the sliver sensing surface 3650. In some embodiments, the trench fill material 3450 is comprised of a non-metal/non-conductive material such as a high-k dielectric, thus making up a high-k dielectric sliver sensing surface 3650. In some embodiments, the sliver sensing surface 3650 may be functionalized with a material suitable for the species being sensed. For example, if the sliver sensing surface 3650 is comprised of a high-k dielectric, self-assembled organic monolayers may be used for functionalization using known approaches.

As non-limiting examples, due to the sliver sensing surface 3650, sensing surface area 3654 reaction to a given sensed substance 3670, in some embodiments, a TiN trench fill material 3450 is chosen to sense the sense substance hydrogen ion (e.g., pH) 3670, AgCl 3450 is chosen to sense chloride 3670, Au 3450 is chosen to sense DNA 3670, and thio material chemistries are chosen 3450 to sense proteins 3670.

Therefore, the sensing trench 3250/3625 is a spatial void capable of receiving fluids containing or being one or more sensed substances 3670 which are directed to be in contact and interact with the sliver sensing surface 3650 within the sensing trench 3250/3625.

It is noted that due to symmetries of the structure 3600, the sensing trench 3625 and the sliver sensing surface 3650 together can be formed so the sliver sensing surface 3650 is in contact with either the left 2450L side or right 2450R side of the extrinsic vertical base 2450. The side of the extrinsic vertical base 2450 (either 2450L or 2450R, respectively) that is in contact with the sliver sensing surface 3650 becomes the sensing base of the sensing/vertical BJT. Accordingly, the extrinsic vertical base (either 2450R or 2450L, respectively) that is not in contact with the sliver sensing surface 3650 becomes the non-sensing base of the sensing/vertical BJT, control extrinsic vertical base, or the control base. The sensing base and control base are the two bases of the sensing/vertical BJT.

The metal silver sensing surface lies between the sensing trench 3625 and the respective sensing base and is electrically connected to the respective sensing base. As shown in FIG. 36 as a non-limiting example, the sensing base is the right side extrinsic vertical base 2450R and the control (non-sensing) extrinsic vertical base (control base) is the left side extrinsic vertical base 2450L.

It is noted that in the described embodiments, the physical separation of the sides 2450L/2450R of the extrinsic vertical base 2450 creates two separate (dual) base terminals, where the sensing base 2450R (as a non-limiting example) is subject to the electrical/chemical reactions of the sensing surface area 3654 of the sliver sensing surface 3650 via the sensed substances 3670, while the control base 2450L/2450R can be connected to an input (external) signal or bias. The control and senor base terminals are electrically (e.g., electrostatically) coupled to each other, as is the case in any dual-base BJT, and collectively determine the output characteristics (e.g., current-voltage characteristics) of the BJT.

The vertical/sensor BJT 350/1650/2950/2450/2450L/2450R is a dual base 2450L/2450R/1650 vertical/sensor BJT of the Darlington pair BJT sensor, including, as a non-limiting example, the sensing base 2450R and the control base 2450L.

Figure 37:
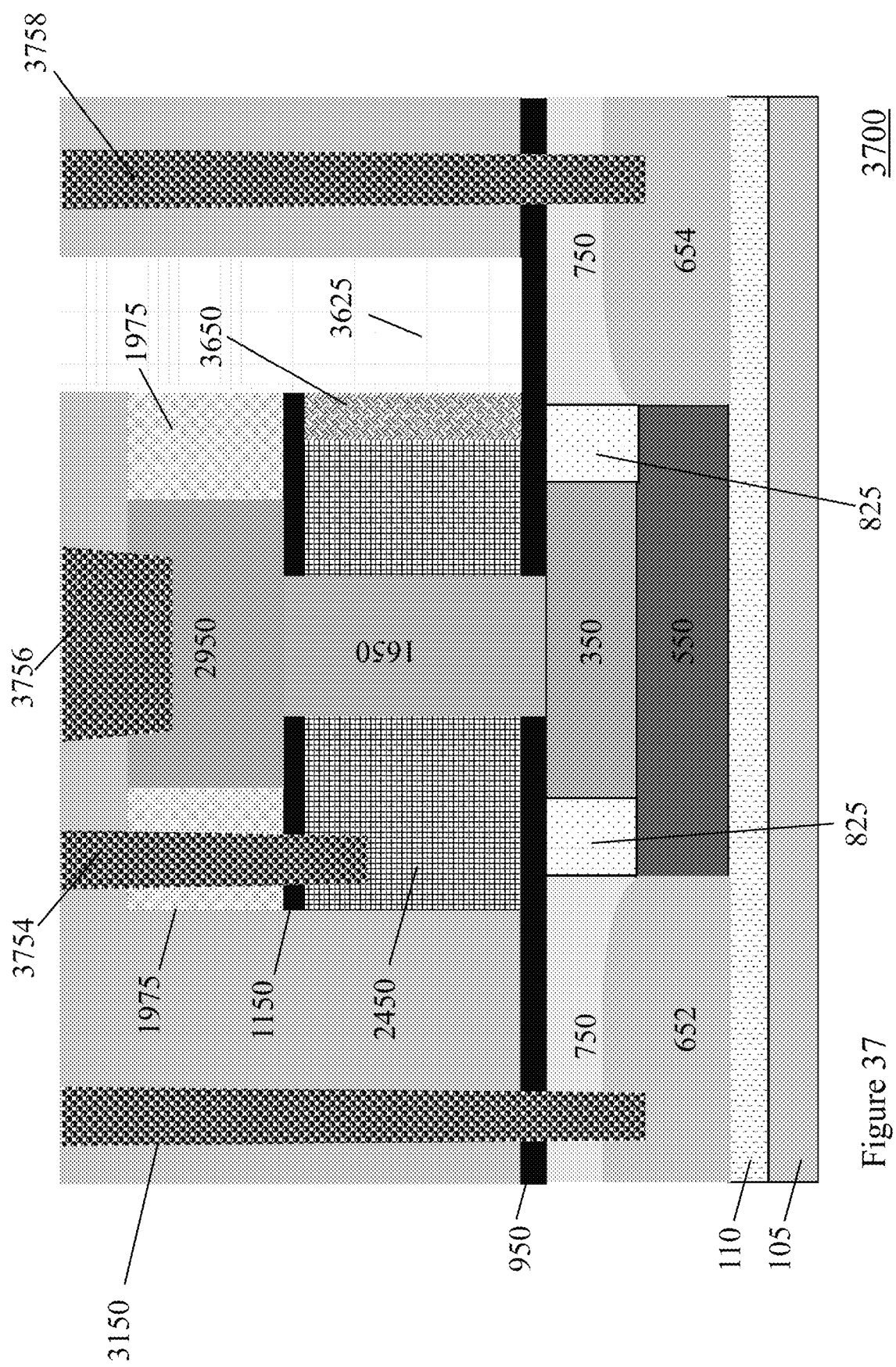
FIG. 37 is a cross section view showing a completed embodiment of the Darlington pair BJT sensor after formation of external contacts.

FIG. 37 is a cross section view showing a completed embodiment of the Darlington Pair BJT sensor 3700 after formation of external contacts 3150/3754/3756/3758. Functionalization of the sliver sensing surface 3650, if desired, is typically performed at this stage.

An external contact 3150 connects to the horizontal emitter 652 of the horizontal/lateral BJT 652/550/654/350. External contact 3754 connects to the extrinsic base extrinsic vertical/control base 2450 (as a non-limiting example, the left side 2450L). External contact 3756 connects to the vertical emitter 2950 of the vertical/sensing BJT 2950/1650/350/2450/2450L/2450R/350. External contact 3758 connects to the horizontal collector 654 of the horizontal/lateral BJT 652/550/654/350.

In some embodiments, there are multiple external contacts 3150 and 3756 some of which are electrically connected in or out of the drawing plane and not shown in FIG. 37.

External contacts 3150/3754/3756/3758 are formed by known metallization techniques. For example, external contact trenches are formed, e.g., by laser ablation or a patterned etch. An external contact conductor material is then deposited into contact trenches. Example contact conductor material include an elemental metal such tungsten, cobalt, ruthenium, rhodium, zirconium, copper, aluminum, and platinum. In some embodiments, the contact conductor material is cobalt or tungsten. Any overfill of the external contact trenches can be removed by a CMP.

Additional contacts can be made externally to the Darlington Pair BJT sensor(s) 3700 structure to make alternative configurations of the vertical/sensing BJT and horizontal/lateral BJT depending on the polarities of the respective BJTs in the BJT pair and circuit design criteria. As a non-limiting example, the external emitter contact 3754 for the vertical/sensing BJT is configured to be externally connected to the external collector contact 3758 of the horizontal/lateral BJT.

As described above, the lateral/amplifying BJT and the vertical/sensing BJT can be different polarities. For example, the BJT's can be configured in one of the following configurations, the amplifying BJT is PNP and the sensing BJT is NPN, and the amplifying BJT is NPN and the sensing BJT is PNP.

Figure 45:
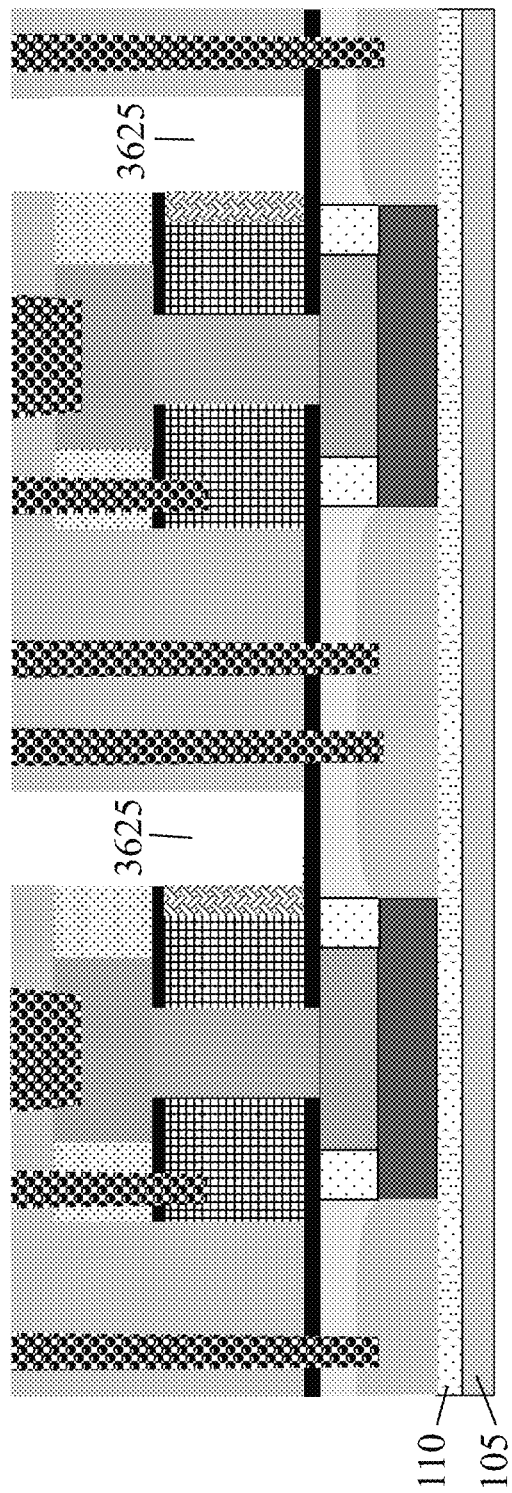
FIG. 45 is a block diagram of a single integrate sensor with multiple Darlington pair sensors.

In alternative configurations (FIG. 45), two or more of the Darlington pair BJT sensors 3700 can be configured so the sensing trenches 3625 of a first Darlington pair BJT sensor 3700 and one or more second Darlington Pair BJT sensors 3700 are connected in fluid communication. By fluid communication is meant that a common fluid stream will flow through each of all of the connected sensing trenches 3625 with no or little resistance to the fluid flow. This enables each of the connected the Darlington pair BJT sensors 3700 to convey the common fluid through each of the connected sensing trenches 3625 so each of the Darlington pair BJT sensors 3700 can sense one or more sensed substances 3670 in the common fluid flowing through the sensing trenches 3625. In this configuration, multiple types of sensed substances 3670 can be sensed in a single integrate sensor with multiple Darlington pair BJT sensors 3700.

Figures 38A, 38B:
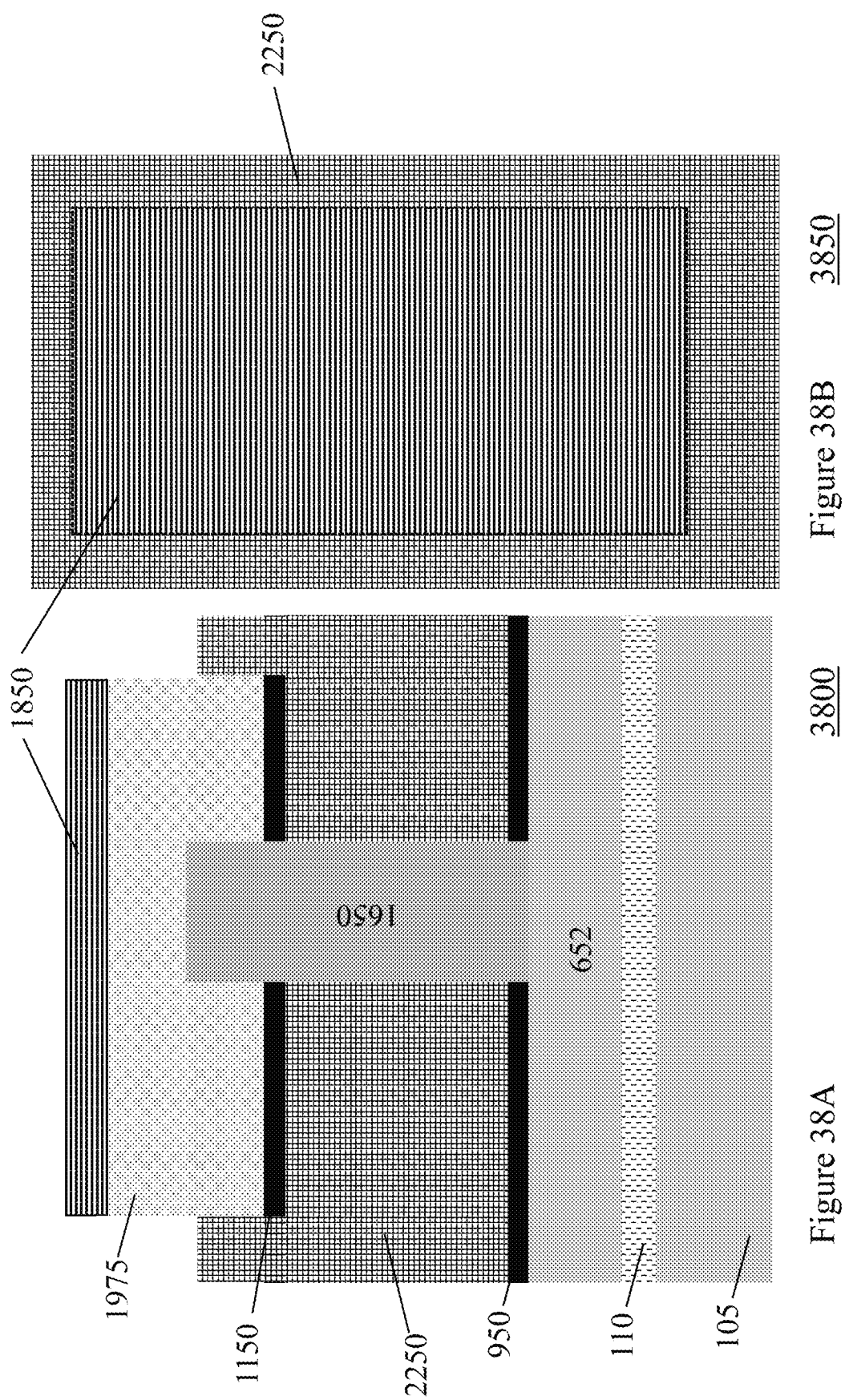
FIG. 38A, in the separation Figure series, is a cross section view showing interim structures after growth of the doped extrinsic vertical base material surrounding the vertical base.
FIG. 38B is a top view of the interim structure shown in FIG. 38A.

FIG. 38A, in the separation Figure series, is a cross section view showing interim structures 3800 after growth of the doped extrinsic vertical base material 2250 surrounding the vertical base 1650. See also the description of FIG. 22 above. The base region mask 1850 is on the etched oxide layer 1975 and a vertical projection (not shown) of the base region mask 1850 overlaps both sides and both ends (front and back, not shown) of the horizontal common extrinsic base/collector 350.

FIG. 38B is a top view of the interim structure 3850 shown in FIG. 38A showing the top surface of the base region mask 1850 and the part of the surface of the extrinsic vertical base material 2250 that is unprotected (not under the base region mask 1850).

Note again that the shape of the extrinsic vertical base material 2250 shown in FIGS. 38A and 38B is shown for purposes of explanation and that the actual shape of the extrinsic vertical base material 2250 may differ. Also note that the horizontal emitter 652, common extrinsic base/collector 350, lateral intrinsic base 550, spacers 825, and lateral collector 654 are omitted for simplicity.

Figure 39B:
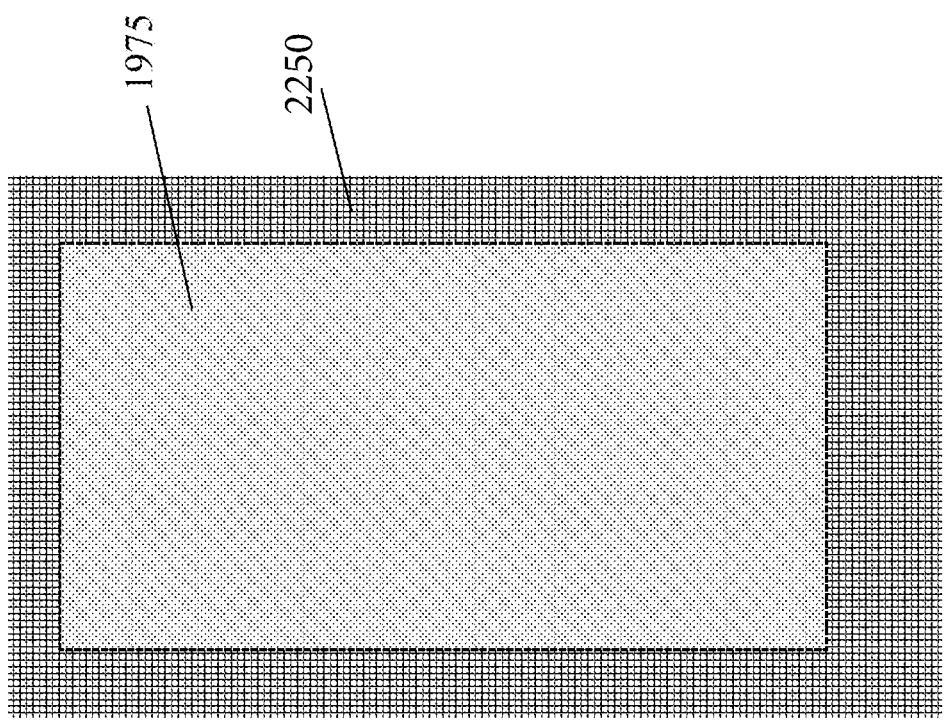
FIG. 39B is a top view of the interim structure shown in FIG. 39A.
Figure 39A:
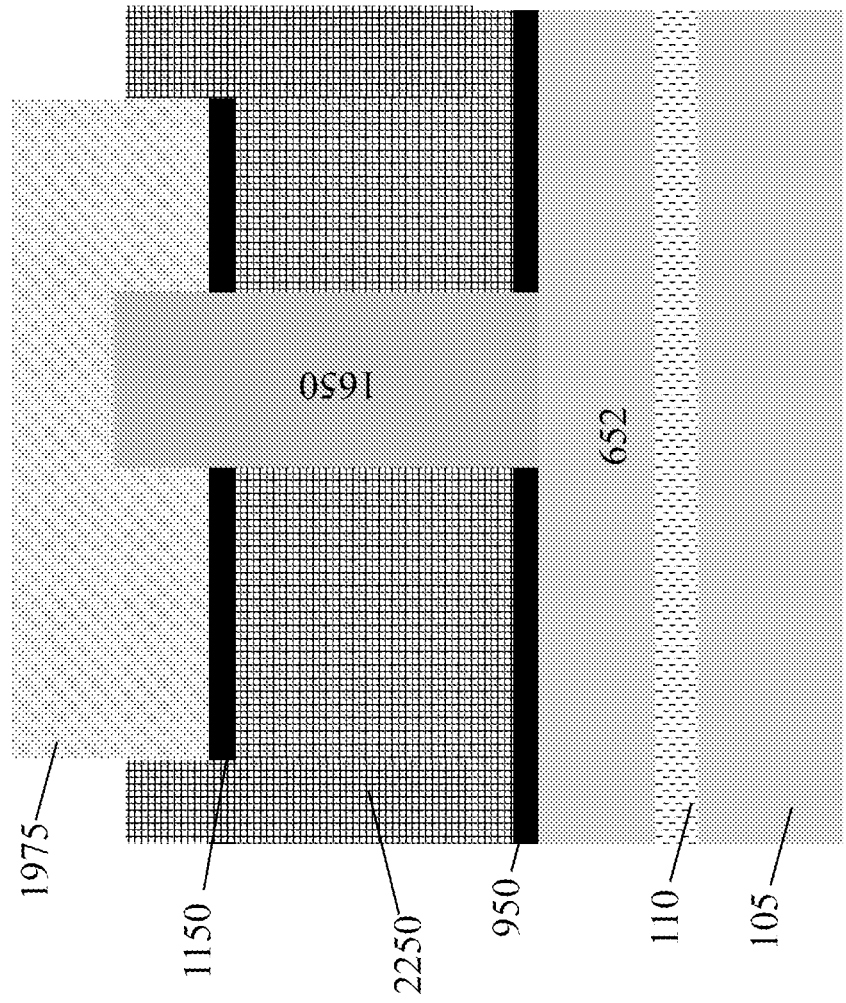
FIG. 39A, in the separation Figure series, is a cross section view showing interim structures after removing the base region mask.

FIG. 39A, in the separation Figure series, is a cross section view showing interim structures 3900 after removing the base region mask 1850, as described above, see the description of FIG. 23.

FIG. 39B is a top view 3950 of the interim structure 3900 of FIG. 39A showing the etched oxide layer 1975 and the non-protected surface of the extrinsic vertical base material 2250.

FIG. 40A, in the separation Figure series, is a cross section view showing interim structures 4000 after deposition of the base separation hard mask 2350

FIG. 40B is a top view 4050 of the interim structure shown in FIG. 40A. The top surface of the deposited base separation hard mask 2350 is shown. The top non-protected (not under the base separation hard mask 2350) surface of the extrinsic vertical base material 2250 also is shown. The front edge 4222 and the back edge 4224 of the base separation hard mask 2350 are shown so that their vertical projection down through the structure 4050 will reveal the front 1650F and back ends 1650B, respectively, of the vertical base 1650, as described below in FIG. 41B. Accordingly, the base separation hard mask 2350 is "shorter" than the removed base region mask 1850.

Figure 41A:
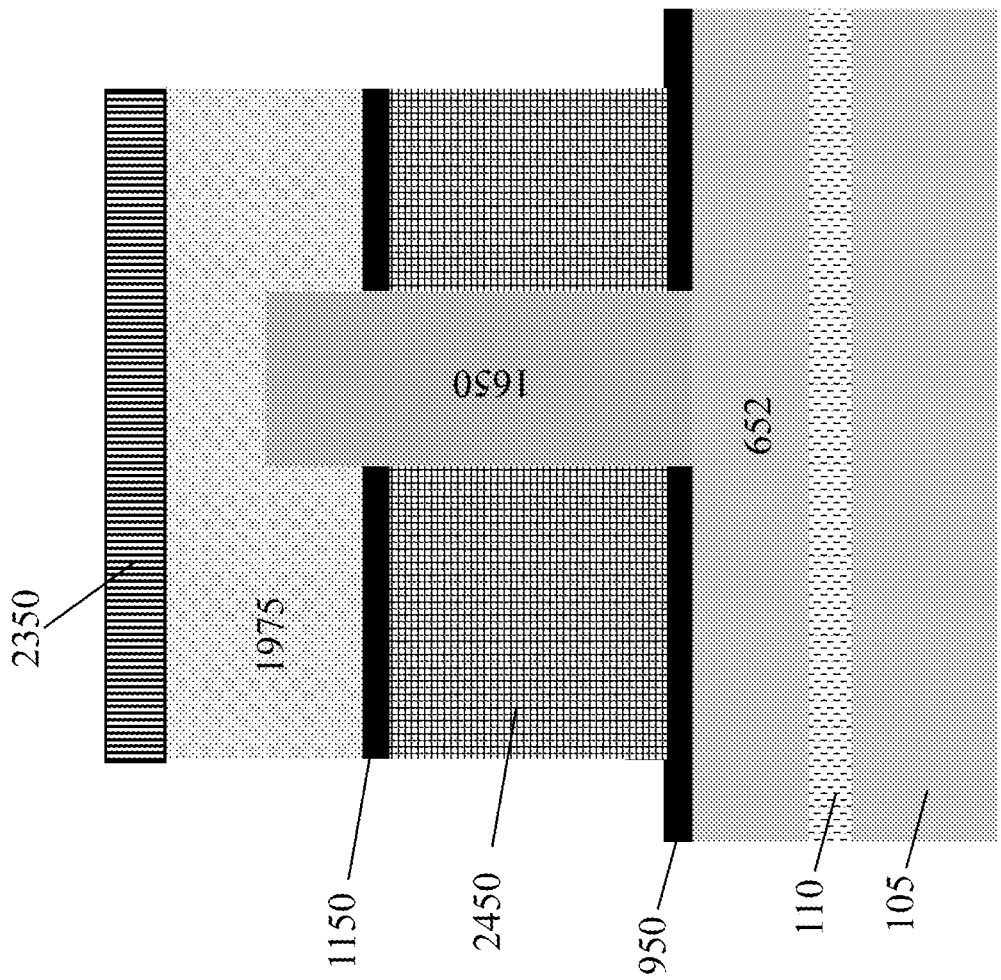
FIG. 41A is a cross section view showing interim structures after removing the unprotected doped extrinsic vertical base material around the vertical base and separating the extrinsic vertical base material into a right extrinsic vertical base and left extrinsic vertical base.

FIG. 41A is a cross section view showing interim structures 4100 after removing the unprotected doped extrinsic vertical base material surrounding the ends 1650F/1650B of and other volumes surrounding the vertical base 1650 down to the bottom spacer 950. This etch/removal separates the extrinsic vertical base 2450 material into a right extrinsic vertical base 2450R and left extrinsic vertical base 2450L. See also the description of FIG. 24 above.

Figure 41B:
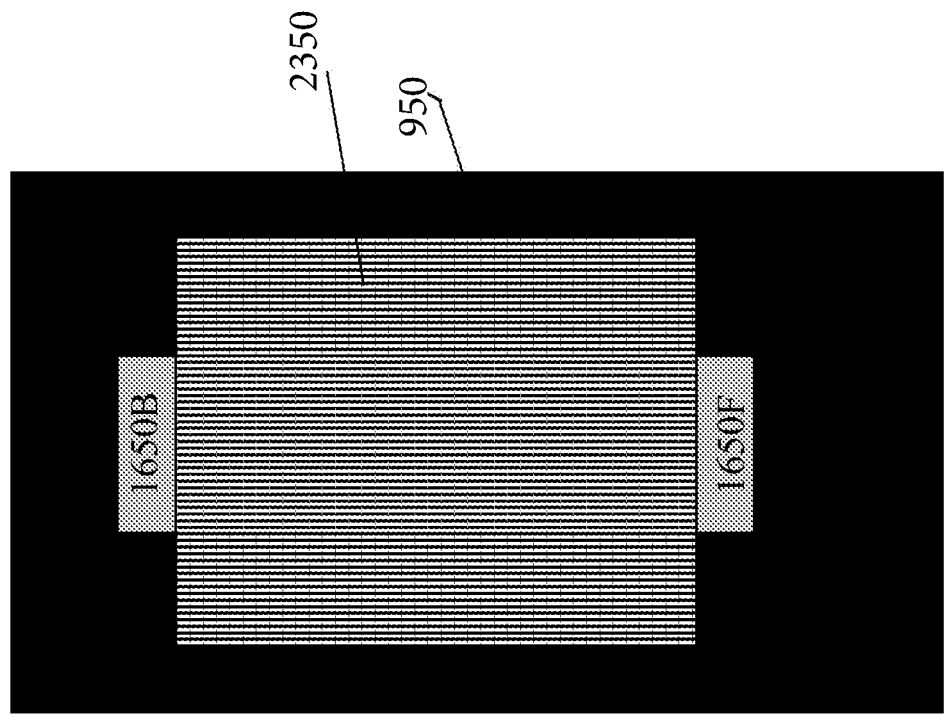
FIG. 41B is a top view of the interim structure shown in FIG. 41A.

FIG. 41B is a top view 4150 of the interim structure 4100 shown in FIG. 41A. The "shortened" base separation hard mask 2350 allows removal of the extrinsic vertical base 2450 material to expose a front end 1650F and a back end 1650B of the vertical base 1650. By allowing the front end 1650F and a back end 1650B of the vertical base 1650 to protrude beyond the 2450 extrinsic vertical base 2450, the extrinsic vertical base 2450 is physically separated into a left 2450L and right 2450R side by the vertical base 2450. This enables embodiments of the Darlington pair BJT sensor (the vertical/sensing BJT) to have a dual base. In some embodiments, one of the bases is used as a sensing base, e.g., the base that is connected to the sliver sensing surface 3650, for instance 2450R. The other, or non-sensing base or control base, e.g., the base not connected to the sliver sensing surface 3650 (for instance 2450L), can be used as a separate control base.

FIG. 42A is a cross section view showing interim structures 4200 after an interlayer dielectric (ILD) 2550 fill.

FIG. 42B is a top view 4250 of the interim structure 4200 shown in FIG. 42A.

Also refer to the description of the ILD fill in FIG. 25.

Figure 43:
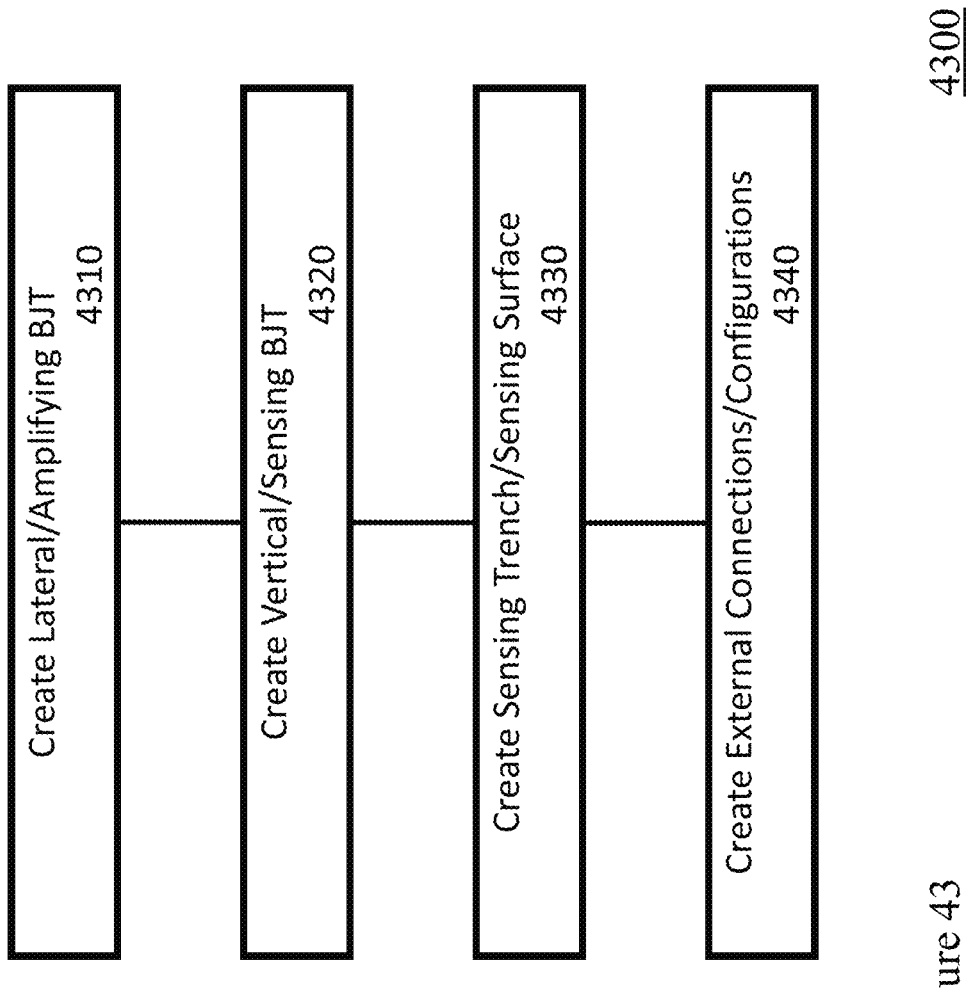
FIG. 43 is a flow chart of a method of making a Darlington pair BJT sensor.

FIG. 43 is a flow chart of a process 4300 of making a Darlington pair BJT sensor 3700.

Step 4310 begins the process 4300 with creating the horizontal/lateral/amplifying BJT 652/550/654 with the common extrinsic base/collector 350 as described in the description of FIGS. 1-9.

Step 4320 creates the vertical/sensing BJT 2950/1650/350/2450 with a dual extrinsic base 2450/2450L/2450R and the common extrinsic base/collector 350 being the extrinsic base 350 to the lateral BJT and the vertical collector 350 of the vertical/sensing BJT as described in the description of FIGS. 10-31 and FIGS. 38A, 38B, 39A, 39B, 40A, 40B, 41A, 41B, 42A, and 42B.

Step 4330 creates the sensing trench 3625/3250 and the sliver sensing surface 3650 as described in the description of FIGS. 32-36.

Step 4340 creates the external connections 3150/3754/3756/3758 and external configuration connections as described in the description of FIG. 37.

Figure 44:
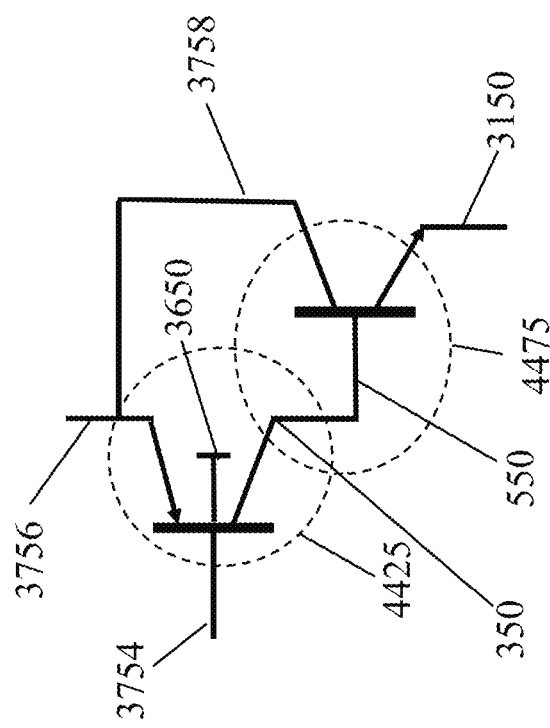
FIG. 44 is a circuit diagram of an embodiment of a Darlington pair sensor.

FIG. 44 is a circuit diagram of a non-limiting example of a dual-base, complementary (Sziklai) Darlington pair BJT sensor 4400 where the vertical/sensing BJT 4425 is an PNP BJT with two bases (as a non-limiting example, a control base, external connection 3754, and a sensing base; connection to the sliver sensing surface 3650) and the horizontal/lateral/amplifying BJT 4475 is an NPN BJT.

As noted above, different BJT polarities and configurations are envisioned.

The vertical/sensing BJT 4425 has a vertical emitter 2950 external connection 3756. The vertical collector 350 is one and the same element with the extrinsic base 350 in contact with the horizontal base 550 of the horizontal/amplifying BJT 4475/652/550/654/350 shown as a common internal connection in FIG. 44. The vertical/sensing BJT 4425 has a separated intrinsic base 2450/2450L/2450R where the control base, as an example 2450L, is connected to the external connection 3754. The sliver sensing surface 3650 is connected to the right side 2450R (as an example) of the extrinsic vertical base 2450 which is the sensing base 2450R (as an example). In some embodiments, the emitter of the vertical/sensing BJT 4425 is external connected/configured to the collector of the horizontal/amplifying BJT 4475 to complete the configuration of the Darlington pair sensor 3700/4400. Other external connections/configurations are envisioned that would enable different configurations of Darlington pair sensors.

Other polarities of the vertical sensing BJT 4425 and horizontal/amplifying BJT 4475 are envisioned. For example, a complementary (Sziklai) Darlington pair can be configured where the vertical sensing BJT 4425 is an NPN BJT and the horizontal/amplifying BJT 4475 is a PNP BJT.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. For example, the semiconductor devices, structures, and methods disclosed in accordance with embodiments of the present invention can be employed in applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, expert and artificial intelligence systems, functional circuitry, etc. Systems and hardware incorporating the semiconductor devices are contemplated embodiments of the invention.

The terminology used herein was chosen to explain the principles of the embodiments and the practical application or technical improvement over technologies found in the marketplace or to otherwise enable others of ordinary skill in the art to understand the embodiments disclosed herein. Devices, components, elements, features, apparatus, systems, structures, techniques, and methods described with different terminology that perform substantially the same function, work in the substantial the same way, have substantially the same use, and/or perform the similar steps are contemplated as embodiments of this invention.

What is claimed is:

1. A Darlington pair sensor, comprising:
   an amplifying bipolar junction transistor (BJT) horizontally disposed on a substrate, the amplifying BJT having a horizontal emitter, a horizontal base, a horizontal collector, and a common extrinsic base/collector, the common extrinsic base/collector being an amplifying BJT extrinsic base for the amplifying BJT and the common extrinsic base/collector being in contact with and disposed upon the horizontal base;
   a sensing BJT in a vertical orientation with respect to the amplifying BJT, the sensing BJT having a vertical emitter, a vertical base, an extrinsic vertical base separated into a left extrinsic vertical base and a right extrinsic vertical base, and the common extrinsic base/collector, the common extrinsic base/collector also being a sensing BJT collector for the sensing BJT,
   wherein the left extrinsic vertical base is in contact with a left side of the vertical base, and the right extrinsic vertical base in in contact with a right side of the vertical base, and the left extrinsic vertical base and the right extrinsic vertical base are separated from one another.

2. The Darlington pair sensor, as in claim 1, wherein the left extrinsic vertical base and the right extrinsic vertical base are separated from one another by the vertical base.

3. The Darlington pair sensor, as in claim 1, wherein an amplifying BJT polarity of the amplifying BJT with respect a sensing BJT polarity of the sensing BJT is configured in one of the following configurations: a) the amplifying BJT is PNP and the sensing BJT is NPN, and b) the amplifying BJT is NPN and the sensing BJT is PNP.

4. The Darlington pair sensor, as in claim 1, further comprising:
   a sensing trench being a spatial void capable of receiving fluids containing one or more sensed substances, the sensing trench being adjacent to one of the left extrinsic vertical base and the right extrinsic vertical base, the one of the left extrinsic vertical base and the right extrinsic vertical base is a sensing extrinsic vertical base, the other one of the left extrinsic vertical base and the right extrinsic vertical base being a control extrinsic vertical base; and
   a sliver sensing surface, the sliver sensing surface being a conductive material between the sensing trench and the sensing extrinsic vertical base, and the sliver sensing surface being in electrical contact with the sensing extrinsic vertical base.

5. The Darlington pair sensor, as in claim 4, wherein the one or more sensed substances are biological substances and the Darlington pair sensor is used as a biological sensor.

6. The Darlington pair sensor, as in claim 4, wherein one of the fluids received within the sensing trench is one of a liquid and a gas.

7. The Darlington pair sensor, as in claim 4, wherein the sliver sensing surface is a sensing base of the sensing BJT, the sliver sensing surface providing a signal to the sensing extrinsic vertical base, the signal induced by an interaction between a sliver sensing surface material and one of the one or more sensed substances.

8. The Darlington pair sensor, as in claim 7, wherein the interaction is one or more of an electrical reaction and a chemical reaction.

9. The Darlington pair sensor, as in claim 4, wherein the control extrinsic vertical base is a control base.

10. The Darlington pair sensor, as in claim 4, wherein the sliver sensing surface material is titanium nitride (TiN), one of the one or more sensed substances is hydrogen ions, and the Darlington pair sensor is a pH sensor.

11. The Darlington pair sensor, as in claim 4, wherein the sliver sensing surface material is silver chloride (AgCl) and one of the one or more sensed substances is one or more DNA molecules.

12. The Darlington pair sensor, as in claim 4, wherein the sliver sensing surface material is functionalized with a thiol and one of the one or more sensed substances is one or more proteins.

13. A Darlington pair sensor, comprising:
   an amplifying bipolar junction transistor (BJT) horizontally disposed on a substrate, the amplifying BJT having a horizontal emitter, a horizontal base, a horizontal collector, and a common extrinsic base/collector, the common extrinsic base/collector being an amplifying BJT extrinsic base for the amplifying BJT and the common extrinsic base/collector being in contact with and disposed upon the horizontal base;
   a sensing BJT in a vertical orientation with respect to the amplifying BJT, the sensing BJT having a vertical emitter, a vertical base, an extrinsic vertical base separated into a left extrinsic vertical base and a right extrinsic vertical base, and the common extrinsic base/collector, the common extrinsic base/collector also being a sensing BJT collector for the sensing BJT, wherein the left extrinsic vertical base is in contact with a left side of the vertical base and the right extrinsic vertical base is in contact with a right side of the vertical base, and the left extrinsic vertical base and the right extrinsic vertical base are separated from one another by the vertical base;
   a sensing trench being a spatial void capable of receiving fluids containing one or more sensed substances, the sensing trench being adjacent to one of the left extrinsic vertical base and the right extrinsic vertical base, the one of the left extrinsic vertical base and the right extrinsic vertical base is a sensing extrinsic vertical base, the other one of the left extrinsic vertical base and the right extrinsic vertical base being a control extrinsic vertical base; and
   a sliver sensing surface, the sliver sensing surface being a conductive material between the sensing trench and the sensing extrinsic vertical base, and the sliver sensing surface being in electrical contact with the sensing extrinsic vertical base.

14. The Darlington pair sensor, as in claim 13, wherein the vertical base is a strained base.

15. The Darlington pair sensor, as in claim 13, wherein one or more of the extrinsic vertical base and the vertical emitter are comprised of large-grain polycrystalline material.

16. The Darlington pair sensor, as in claim 13, wherein the sensing trench is connected to one or more second sensing trenches of one or more second Darlington pair sensors, the sensing trench and the one or more second sensing trenches being in fluid communication so that the sensing trench and the one or more second sensing trenches are able to convey a common fluid flow and sense one or more second sensed substances in the common fluid flowing through the sensing trench and the one or more second sensing trenches.

17. A sensor, comprising:
   a first Darlington pair sensor comprising:

a first amplifying bipolar junction transistor (BJT) horizontally disposed on a substrate, the first amplifying BJT having a first horizontal emitter, a first horizontal base, a first horizontal collector, and a first common extrinsic base/collector, the first common extrinsic base/collector being a first amplifying BJT extrinsic base for the first amplifying BJT and the first common extrinsic base/collector being in contact with and disposed upon the first horizontal base;

a first sensing BJT in a vertical orientation with respect to the first amplifying BJT, the first sensing BJT having a first vertical emitter, a first vertical base, a first extrinsic vertical base separated into a first left extrinsic vertical base and a first right extrinsic vertical base, and the first common extrinsic base/collector, the first common extrinsic base/collector also being a first sensing BJT collector for the first sensing BJT, wherein the first left extrinsic vertical base is in contact with a first left side of the first vertical base, and the first right extrinsic vertical base is in contact with a first right side of the first vertical base, and the first left extrinsic vertical base and the first right extrinsic vertical base are separated from one another by the first vertical base;

a first sensing trench being a first spatial void capable of receiving a fluids containing one or more first sensed substances, the first sensing trench being adjacent to one of the first left extrinsic vertical base and the first right extrinsic vertical base, the one of the first left extrinsic vertical base and the first right extrinsic vertical base is a first sensing extrinsic vertical base, the other one of the first left extrinsic vertical base and the first right extrinsic vertical base being a first control extrinsic vertical base; and a first sliver sensing surface, the first sliver sensing surface being a first conductive material between the first sensing trench and the first sensing extrinsic vertical base, and the first sliver sensing surface being in electrical contact with the first sensing extrinsic vertical base;

one or more second Darlington pair sensors, each of the one or more second Darlington pair sensors comprising:

a second amplifying bipolar junction transistor (BJT) horizontally disposed on the substrate, the second amplifying BJT having a second horizontal emitter, a second horizontal base, a second horizontal collector, and a second common extrinsic base/collector, the second common extrinsic base/collector being a second amplifying BJT extrinsic base for the second amplifying BJT and the second common extrinsic base/collector being in contact with and disposed upon the second horizontal base;

a second sensing BJT in a vertical orientation with respect to the second amplifying BJT, the second sensing BJT having a second vertical emitter, a second vertical base, a second extrinsic vertical base separated into a second left extrinsic vertical base and a second right extrinsic vertical base, and the second common extrinsic base/collector, the second common extrinsic base/collector also being a second sensing BJT collector for the second sensing BJT, wherein the second left extrinsic vertical base is in contact with a second left side of the second vertical base, and the second right extrinsic vertical base is in contact with a second right side of the second vertical base, and the second left extrinsic vertical base and the second right extrinsic vertical base are separated from one another by the second vertical base;

a second sensing trench being a second spatial void capable of receiving the fluid, the fluid further containing one or more second sensed substances, the second sensing trench being adjacent to one of the second left extrinsic vertical base and the second right extrinsic vertical base, the one of the second left extrinsic vertical base and the second right extrinsic vertical base is a second sensing extrinsic vertical base, the other one of the second left extrinsic vertical base and the second right extrinsic vertical base being a second control extrinsic vertical base; and a second sliver sensing surface, the second sliver sensing surface being a second conductive material between the second sensing trench and the second sensing extrinsic vertical base, and the second sliver sensing surface being in electrical contact with the second sensing extrinsic vertical base, wherein the first sensing trench and the second sensing trench of each of the one or more second Darlington pair sensors are in fluid communication so that a common fluid stream of the fluid will flow through the first sensing trench and the second sensing trench of each of the one or more second Darlington pair sensors, respectively, with no or little resistance to fluid flow.

* * * * *